(12) United States Patent
Hatakeyama et al.

(10) Patent No.: US 8,822,136 B2
(45) Date of Patent: *Sep. 2, 2014

(54) PATTERNING PROCESS AND RESIST COMPOSITION

(71) Applicant: Shin-Etsu Chemical Co., Ltd., Tokyo (JP)

(72) Inventors: Jun Hatakeyama, Joetsu (JP); Kazuhiro Katayama, Joetsu (JP); Youichi Ohsawa, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/661,267

(22) Filed: Oct. 26, 2012

(65) Prior Publication Data

US 2013/0108960 A1 May 2, 2013

(30) Foreign Application Priority Data

Oct. 27, 2011 (JP) ................................ 2011-235987

(51) Int. Cl.
| | | |
|---|---|---|
| *G03F 7/004* | (2006.01) | |
| *G03F 7/039* | (2006.01) | |
| *G03F 7/20* | (2006.01) | |
| *G03F 7/30* | (2006.01) | |
| *G03F 7/38* | (2006.01) | |

(52) U.S. Cl.
USPC ........ 430/311; 430/270.1; 430/325; 430/330; 430/331; 430/905; 430/910; 430/921; 430/925; 430/942

(58) Field of Classification Search
None
See application file for complete search history.

(56) References Cited

U.S. PATENT DOCUMENTS

| | | |
|---|---|---|
| 5,541,037 A | 7/1996 | Hatakeyama et al. |
| 6,136,500 A | 10/2000 | Kobayashi et al. |
| 7,537,880 B2 | 5/2009 | Harada et al. |
| 7,759,047 B2 | 7/2010 | Hatakeyama et al. |
| 7,771,913 B2 | 8/2010 | Kaneko et al. |
| 7,998,655 B2 | 8/2011 | Tsubaki |
| 8,017,298 B2 | 9/2011 | Tsubaki |
| 8,034,547 B2 | 10/2011 | Tsubaki et al. |
| 2007/0003867 A1 | 1/2007 | Hatakeyama et al. |

(Continued)

FOREIGN PATENT DOCUMENTS

| | | |
|---|---|---|
| JP | 07-181685 A | 7/1995 |
| JP | 10-500950 A | 1/1998 |

(Continued)

OTHER PUBLICATIONS

JPO English abstract for JP2009-244805 (2009) provided by JPO.*

(Continued)

*Primary Examiner* — Sin J. Lee
(74) *Attorney, Agent, or Firm* — Westerman, Hattori, Daniels & Adrian, LLP

(57) ABSTRACT

A negative pattern is formed by coating a resist composition onto a substrate, the resist composition comprising a polymer comprising recurring units having an acid labile group-substituted hydroxyl group, an acid generator, an onium salt of perfluoroalkyl ether carboxylic acid, and an organic solvent, prebaking, exposing, baking, and developing in an organic solvent such that the unexposed region of film is dissolved away and the exposed region of film is not dissolved. In image formation via positive/negative reversal by organic solvent development, the resist film is characterized by a high dissolution contrast between the unexposed and exposed regions.

9 Claims, 11 Drawing Sheets

(56) References Cited

U.S. PATENT DOCUMENTS

| | | |
|---|---|---|
| 2008/0090172 A1 | 4/2008 | Hatakeyama et al. |
| 2008/0153030 A1 | 6/2008 | Kobayashi et al. |
| 2011/0236831 A1* | 9/2011 | Hasegawa et al. ......... 430/285.1 |
| 2012/0058436 A1 | 3/2012 | Tsubaki et al. |
| 2012/0288796 A1* | 11/2012 | Katayama et al. ......... 430/285.1 |

FOREIGN PATENT DOCUMENTS

| | | |
|---|---|---|
| JP | 3790649 B2 | 6/2006 |
| JP | 2007-025634 A | 2/2007 |
| JP | 3991462 B2 | 8/2007 |
| JP | 2007-297590 A | 11/2007 |
| JP | 2007-316448 A | 12/2007 |
| JP | 2008-003569 A | 1/2008 |
| JP | 2008-111103 A | 5/2008 |
| JP | 2008-122932 A | 5/2008 |
| JP | 2008-158339 A | 7/2008 |
| JP | 2008-281974 A | 11/2008 |
| JP | 2008-281975 A | 11/2008 |
| JP | 2008-281980 A | 11/2008 |
| JP | 2008-309879 A | 12/2008 |
| JP | 2009-244805 * | 10/2009 |
| JP | 4554665 B2 | 9/2010 |
| JP | 4590431 B2 | 12/2010 |
| WO | 95/032174 A1 | 11/1995 |

OTHER PUBLICATIONS

Hiroko Nakamura et al., "Contact Hole Formation by Multiple Exposure Technique in Ultra-low k1 Lithography", Proc. SPIE, 2004, vol. 5377, p. 255-263.

Shuji Nakao et al., "0.12mm Hole Pattern Formation by KrF Lithography for Giga Bit DRAM", IEEE IEDM Tech Digest, 1996, p. 61-64.

V. Truffert et al., "Ultimate contact hole resolution using immersion lithography with line/space imaging", Proc. SPIE, 2009, vol. 7274, p. 72740N-1-72740N-12.

D.C. Owe-Yang et al., "Double exposure for the contact layer of the 65-nm node", Proc. SPIE, 2005, vol. 5753, p. 171-180.

\* cited by examiner

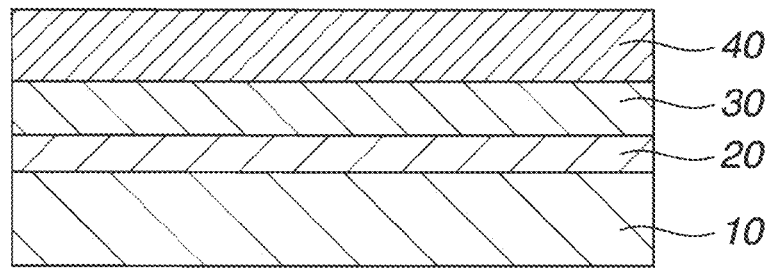
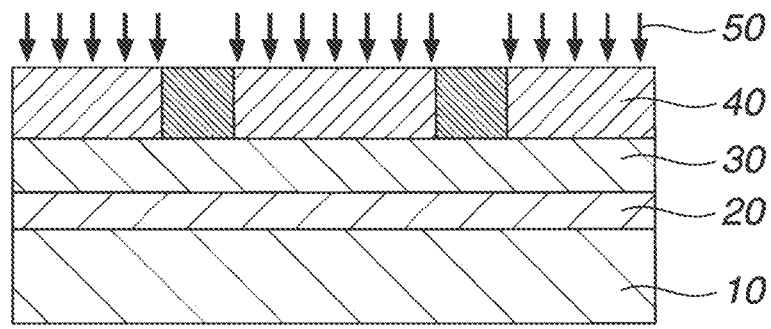
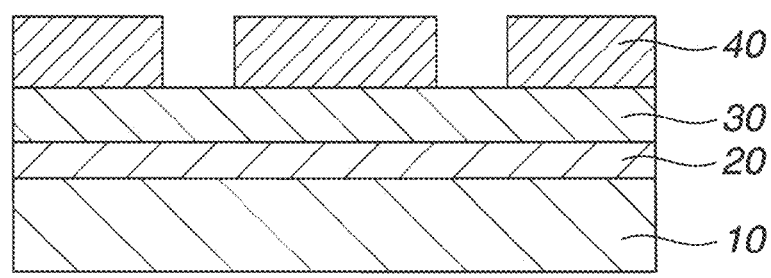

PATTERNING PROCESS AND RESIST COMPOSITION

CROSS-REFERENCE TO RELATED APPLICATION

This non-provisional application claims priority under 35U.S.C. §119(a) on Patent Application No. 2011-235987 filed in Japan on Oct. 27, 2011, the entire contents of which are hereby incorporated by reference.

TECHNICAL FIELD

This invention relates to a pattern forming process involving exposure of resist film, deprotection reaction with the aid of acid and heat, and development with an organic solvent to form a negative tone pattern in which the unexposed region is dissolved and the exposed region is not dissolved. It also relates to a resist composition used therein.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was stopped and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized edge roughness of resist film, defect-free MoSi laminate mask, reduced aberration of reflection mirror, and the like.

Another candidate for the 32-nm node lithography is high refractive index liquid immersion lithography. The development of this technology was stopped because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

As compared with the line pattern, the hole pattern is difficult to reduce the feature size. In order for the prior art method to form fine holes, an attempt is made to form fine holes by under-exposure of a positive resist film combined with a hole pattern mask. This, however, results in the exposure margin being extremely narrowed. It is then proposed to form holes of greater size, followed by thermal flow or RELACS® method to shrink the holes as developed. However, there is a problem that control accuracy becomes lower as the pattern size after development and the size after shrinkage differ greater and the quantity of shrinkage is greater. With the hole shrinking method, the hole size can be shrunk, but the pitch cannot be narrowed.

It is then proposed in Non-Patent Document 1 that a pattern of X-direction lines is formed in a positive resist film using dipole illumination, the resist pattern is cured, another resist material is coated thereon, and a pattern of Y-direction lines is formed in the other resist film using dipole illumination, leaving a grid line pattern, spaces of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in Non-Patent Document 2 to form a hole pattern by exposure of a negative resist film through a Levenson phase shift mask of X-direction lines combined with a Levenson phase shift mask of Y-direction lines. However, the crosslinking negative resist film has the drawback that the resolving power is low as compared with the positive resist film, because the maximum resolution of ultrafine holes is determined by the bridge margin.

A hole pattern resulting from a combination of two exposures of X- and Y-direction lines and subsequent image reversal into a negative pattern can be formed using a high-contrast line pattern of light. Thus holes having a narrow pitch and fine size can be opened as compared with the prior art.

Non-Patent Document 3 reports three methods for forming hole patterns via image reversal. The three methods are: method (1) involving subjecting a positive resist composition to two double-dipole exposures of X and Y lines to form a dot pattern, depositing a $SiO_2$ film thereon by LPCVD, and effecting $O_2$—RIE for reversal of dots into holes; method (2) involving forming a dot pattern by the same steps as in (1), but using a resist composition designed to turn alkali-soluble and solvent-insoluble upon heating, coating a phenol-base overcoat film thereon, effecting alkaline development for image reversal to form a hole pattern; and method (3) involving double dipole exposure of a positive resist composition and organic solvent development for image reversal to form holes.

The organic solvent development to form a negative pattern is a traditional technique. A resist composition comprising cyclized rubber is developed using an alkene such as xylene as the developer. An early chemically amplified resist composition comprising poly(tert-butoxycarbonyloxy-styrene) is developed with anisole as the developer to form a negative pattern.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the ArF resist composition for negative tone development with organic solvent, positive ArF resist compositions of the prior art design may be used. Such pattern forming processes are described in Patent Documents 1 to 3. These patent documents disclose resist compositions for organic solvent development comprising a copolymer of hydroxyadamantane methacrylate, a copolymer of norbornane lactone methacrylate, and a copolymer of methacrylate having acidic groups including carboxyl, sulfo, phenol and thiol groups substituted with two or more acid labile groups, and pattern forming processes using the same.

Further, Patent Document 4 discloses a process for forming a pattern through organic solvent development in which a protective film is applied onto a resist film. Patent Document 5 discloses a topcoatless process for forming a pattern through organic solvent development in which an additive is added to a resist composition so that the additive may segregate at the resist film surface after spin coating to provide the surface with improved water repellency.

Patent Documents 6 and 7 disclose positive resist compositions comprising both a sulfonium or iodonium salt of fluorinated alkane sulfonic acid or fluorinated aryl sulfonic acid and a sulfonium or iodonium salt of carboxylic acid or fluorocarboxylic acid. A blend of two acid generators having different acid strength generates two acids having different strength upon light exposure. The sulfonic acid which is a strong acid undergoes salt exchange with an onium salt of carboxylic acid or fluorocarboxylic acid which is a weak acid prior to decomposition, whereupon the sulfonic acid turns to an onium salt. Since the sulfonic acid which otherwise functions to deprotect the protective group becomes a neutral onium salt, the onium salt of carboxylic acid or fluorocarboxylic acid which is a weak acid functions as a quencher. However, the carboxylic acid or fluorocarboxylic acid suffers from a slow rate of salt exchange reaction with the sulfonic acid and hence, a poor quencher function. It would be desirable to develop an onium salt of weak acid having a high rate of salt exchange reaction and a good quencher function.

CITATION LIST

Patent Document 1: JP-A 2008-281974
Patent Document 2: JP-A 2008-281975
Patent Document 3: JP 4554665
Patent Document 4: JP 4590431
Patent Document 5: JP-A 2008-309879
Patent Document 6: JP-A 2008-158339 (US 20080153030)
Patent Document 7: JP 3991462 (U.S. Pat. No. 6,136,500)
Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)

DISCLOSURE OF INVENTION

The organic solvent development is low in dissolution contrast, as compared with the positive resist system adapted to be dissolved in alkaline developer when deprotection reaction takes place to produce acidic carboxyl groups. Specifically, in the case of alkaline developer, the alkali dissolution rate differs more than 1,000 times between unexposed and exposed regions, whereas the difference is only about 10 times in the case of organic solvent development. In the case of alkaline water development, the dissolution rate is improved by neutralization reaction with carboxyl groups. In the case of organic solvent development with no accompanying reaction, the dissolution rate is low because dissolution is solely due to solvation. It is necessary not only to improve the dissolution rate of the unexposed region, but also to reduce the dissolution rate of the exposed region that is a remaining portion of resist film. If the dissolution rate of the exposed region is high, the thickness of the remaining film is so reduced that the underlying substrate may not be processed by etching through the pattern as developed. Further it is important to enhance the gradient or gamma ($\gamma$) at the dose corresponding to dissolution/non-dissolution conversion. A low $\gamma$ value is prone to form an inversely tapered profile and allows for pattern collapse in the case of a line pattern. To obtain a perpendicular pattern, the resist must have a dissolution contrast having a $\gamma$ value as high as possible.

While prior art photoresist compositions of the alkaline aqueous solution development type are described in Patent Documents 1 to 3, they have a low dissolution contrast upon organic solvent development. It would be desirable to have a novel material having a significant difference in dissolution rate between the exposed and unexposed regions and capable of achieving a high dissolution contrast ($\gamma$) upon organic solvent development.

When an attempt is made to form a hole pattern through negative development, regions surrounding the holes receive light so that excess acid is generated therein. Since the holes are not opened if the acid diffuses inside the holes, control of acid diffusion is also important.

An object of the invention is to provide a negative pattern-forming resist composition which has a significant dissolution contrast and a high sensitivity upon organic solvent development. Another object is to provide a pattern forming process capable of forming a hole pattern via positive/negative reversal by organic solvent development.

The inventors have found that using a resist composition comprising a polymer comprising recurring units having a hydroxyl group whose hydrogen is substituted by an acid labile group, an acid generator, and an onium salt of perfluoroalkyl ether carboxylic acid, a negative pattern can be formed to CD uniformity via exposure, PEB and organic solvent development.

Accordingly, in one aspect, the invention provides a pattern forming process comprising the steps of applying a resist composition onto a substrate, the resist composition comprising a polymer comprising recurring units having a hydroxyl group substituted with an acid labile group and an acid generator, or a polymer comprising recurring units having a hydroxyl group substituted with an acid labile group and recurring units capable of generating an acid upon exposure, a sulfonium or iodonium salt of perfluoroalkyl ether carboxylic acid, and an organic solvent; prebaking the composition to form a resist film; exposing the resist film to high-energy radiation; baking; and developing the exposed film in an organic solvent-based developer to form a negative pattern wherein the unexposed region of film is dissolved away and the exposed region of film is not dissolved.

In a preferred embodiment, the polymer comprising recurring units having a hydroxyl group substituted with an acid labile group comprises recurring units of at least one type selected from recurring units (a1) to (a4) represented by the general formula (1).

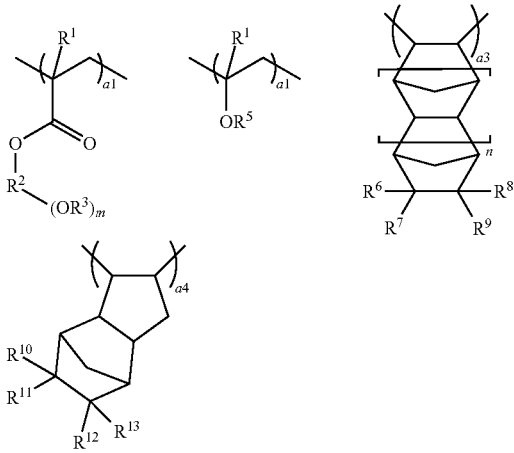

(1)

Herein $R^1$ and $R^4$ are each independently hydrogen or methyl; $R^2$ is a di- to pentavalent, straight, branched or cyclic $C_1$-$C_{16}$ aliphatic hydrocarbon group which may contain an ether or ester radical; $R^3$ and $R^5$ each are an acid labile group; $R^6$ to $R^9$ and $R^{10}$ to $R^{13}$ are each independently hydrogen, cyano, a straight, branched or cyclic $C_1$-$C_6$ alkyl group, organoxycarbonyl, or a group having an ether group or lactone ring, at least one of $R^6$ to $R^9$ and $R^{10}$ to $R^{13}$ has a hydroxyl group substituted with an acid labile group; m is an integer of 1 to 4, n is 0 or 1, a1, a2, a3 and a4 are numbers in the range: $0 \le a1 < 1.0$, $0 \le a2 < 1.0$, $0 \le a3 < 1.0$, $0 \le a4 < 1.0$, and $0 < a1+a2+a3+a4 < 1.0$.

In a preferred embodiment, the sulfonium or iodonium salt of perfluoroalkyl ether carboxylic acid is a salt (Q1) or (Q2) having the general formula (2).

(2)

$$R^{101a}\!-\!\!\overset{\overset{\displaystyle R^{101b}}{|}}{S^+}\!-\!R^{101c} \quad (Q1)$$
$$R^{14}\!-\!\!COO^-$$

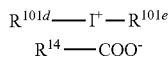
$$R^{14}\!-\!\!COO^-$$

Herein $R^{101a}$, $R^{101b}$ and $R^{101c}$ are each independently a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which some or all hydrogen atoms may be substituted by ether, ester, carbonyl, carbonate, hydroxyl, carboxyl, halogen, cyano, amino, amide, nitro, sultone, sulfonic acid ester, sulfone groups, or substituent groups having sulfonium salt, or $R^{101b}$ and $R^{101c}$ may bond together to form a ring with the sulfur atom to which they are attached, $R^{101b}$ and $R^{101c}$ each are a $C_1$-$C_6$ alkylene group when they form a ring; $R^{101d}$ and $R^{101e}$ each are a $C_6$-$C_{20}$ aryl group which may contain a straight, branched or cyclic $C_1$-$C_6$ alkyl or alkoxy radical, or $R^{101d}$ and $R^{101e}$ may bond together to form a ring with the iodine atom to which they are attached; $R^{14}$ is a straight, branched or cyclic $C_2$-$C_{20}$ alkyl or alkenyl group having at least one ether radical and a plurality of fluorine atoms.

In a preferred embodiment, the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

In a preferred embodiment, the step of exposing the resist film to high-energy radiation includes ArF excimer laser immersion lithography of 193 nm wavelength, EUV lithography of 13.5 nm wavelength or EB lithography.

Preferably, the ArF immersion lithography of 193 nm wavelength uses a halftone phase shift mask bearing a dot shifter pattern, whereby a pattern of holes is formed at the dots after development.

Preferably, the exposure step uses halftone phase shift masks and includes two exposures of two intersecting sets of lines, whereby a pattern of holes is formed at the intersections between lines after development.

Preferably, the exposure step uses a halftone phase shift mask bearing lattice-like shifter gratings, whereby a pattern of holes is formed at the intersections of gratings after development.

In another embodiment, the pattern forming process is defined as comprising the steps of applying a resist composition as defined above onto a substrate; prebaking the composition to form a resist film; forming a protective film on the resist film; exposing the resist film to high-energy radiation; baking; and applying an organic solvent-based developer to dissolve away the protective film and the unexposed region of the resist film for forming a negative pattern wherein the exposed region of film is not dissolved.

In another aspect, the invention provides a negative pattern-forming resist composition comprising a polymer comprising recurring units having an acid labile group substituted thereon of at least one type selected from recurring units (a1) to (a4) represented by the general formula (1), a sulfonium salt (Q1) or iodonium salt (Q2) of perfluoroalkyl ether carboxylic acid having the general formula (2), and an organic solvent. The polymer is dissolvable in a developer selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

ADVANTAGEOUS EFFECTS OF INVENTION

An image is formed via positive/negative reversal on organic solvent development using a photoresist film formed of a resist composition comprising a polymer comprising recurring units having a hydroxyl group substituted with an acid labile group, an acid generator, and an onium salt of perfluoroalkyl ether carboxylic acid. The resist film is characterized by a high dissolution contrast between the unexposed region of promoted dissolution and the exposed region of inhibited dissolution. When the resist film is exposed to radiation and developed in an organic solvent, a fine hole pattern with a controlled size and high sensitivity can be formed.

BRIEF DESCRIPTION OF DRAWINGS

FIG. 1 is a cross-sectional view of a patterning process according to one embodiment of the invention. FIG. 1A shows a photoresist film disposed on a substrate, FIG. 1B shows the resist film being exposed, and FIG. 1C shows the resist film being developed in an organic solvent.

DESCRIPTION OF EMBODIMENTS

Figure 2:
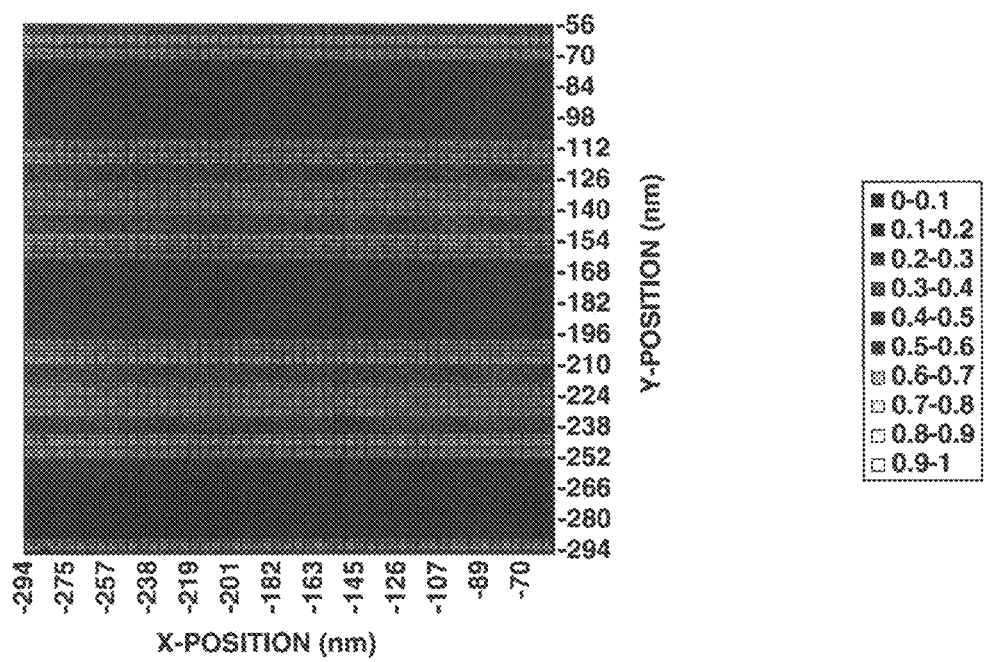
FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.

The terms "a" and an herein do not denote a limitation of quantity, but rather denote the presence of at least one of the referenced item. "Optional" or "optionally" means that the subsequently described event or circumstances may or may not occur, and that description includes instances where the event or circumstance occurs and instances where it does not. As used herein, the notation ($C_n$-$C_m$) means a group containing from n to m carbon atoms per group. As used herein, the term "film" is used interchangeably with "coating" or "layer." The term "processable layer" is interchangeable with patternable layer and refers to a layer that can be processed such as by etching to form a pattern therein.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator Briefly stated, the invention pertains to a pattern forming process utilizing positive/negative reversal and comprising the steps of applying a resist composition comprising a polymer comprising recurring units having a hydroxyl group substituted with an acid labile group and an onium salt of perfluoroalkyl ether carboxylic acid, onto a substrate, prebaking to remove the unnecessary solvent and form a resist film, exposing to high-energy radiation, PEB, and developing in an organic solvent developer to form a negative pattern.

JP-A H10-500950 (WO 95/32174) refers to many perfluoroalkyl ether carboxylic acids. JP-A H07-181685 (U.S. Pat. No. 5,541,037) discloses an antireflective coating which is formed on a resist film from a solution of an amine salt of perfluoroalkyl ether carboxylic acid in water. Since the perfluoroalkyl ether group is an alkyl group having an ether moiety therein, it is more flexible than the perfluoroalkyl group. Probably due to this flexibility effect, an onium salt of perfluoroalkyl ether carboxylic acid is characterized by a rapider salt exchange reaction with α-position fluorinated sulfonic acid, imide acid and methide acid than a perfluoroalkyl carboxylic acid. The rapid salt exchange reaction indicates a higher quencher function. The mechanism by which an onium salt of weak acid functions as quencher and the effects exerted thereby are described below.

In a system where an onium salt of perfluoroalkyl ether carboxylic acid and an onium salt of α-fluorinated sulfonic acid, imide acid or methide acid are co-present, both perfluoroalkyl ether carboxylic acid and α-fluorinated sulfonic acid, imide acid or methide acid are generated upon light exposure. In an area receiving a less dose of exposure, on the other hand, much onium salts remain unchanged. The α-fluorinated sulfonic acid, imide acid or methide acid having high acid strength functions as a catalyst for triggering deprotection reaction, whereas the perfluoroalkyl ether carboxylic acid does not induce deprotection reaction. The α-fluorinated sulfonic acid, imide acid or methide acid having high acid strength undergoes ion exchange with the onium salt of perfluoroalkyl ether carboxylic acid whereby it converts to an onium salt of α-fluorinated sulfonic acid, imide acid or methide acid while releasing the perfluoroalkyl ether carboxylic acid. That is, the onium salt of perfluoroalkyl ether carboxylic acid functions as a quencher by neutralizing the α-fluorinated sulfonic acid, imide acid or methide acid (serving as the deprotection reaction catalyst) via ion exchange.

During exposure, generation of α-fluorinated sulfonic acid, imide acid or methide acid and salt exchange with an onium salt of perfluoroalkyl ether carboxylic acid are infinitely repeated. The site where α-fluorinated sulfonic acid, imide acid or methide acid is generated at the end of exposure shifts from the site where the onium salt of α-fluorinated sulfonic acid, imide acid or methide acid is initially present. Since the cycle of photo-acid generation and salt exchange is repeated many times, the acid generation point is averaged, which leads to reduced edge roughness of resist pattern after development.

Since the onium salt of perfluoroalkyl ether carboxylic acid is photo-decomposable, those portions receiving a high light intensity are reduced in quenching capability and increased in the concentration of α-fluorinated sulfonic acid, imide acid, or methide acid. As a result, the exposed portions are improved in contrast of deprotection reaction. When a negative tone pattern is formed using an organic solvent, the improvement in the contrast of exposed portions leads to an improvement in the rectangularity of negative pattern. Also the onium salt of perfluoroalkyl ether carboxylic acid is highly effective in controlling the diffusion of an α-fluorinated sulfonic acid, imide acid and methide acid. This is because the onium salt resulting from salt exchange is less mobile due to a higher molecular weight. In the event that a hole pattern is formed by negative development, since acid is generated in many regions, it is very important to control the diffusion of acid from the exposed area to the unexposed area. The addition of an onium salt of perfluoroalkyl ether carboxylic acid as well as the carbamate compound capable of generating an amine compound under the action of acid is very important from the aspect of controlling acid diffusion. In case the acid labile group is an acetal group which is very sensitive to acid, the acid for eliminating the protective group need not necessarily be an α-fluorinated sulfonic acid, imide acid or methide acid. Sometimes, deprotection reaction may take place even with α-position non-fluorinated sulfonic acid. In this case, an onium salt of perfluoroalkyl ether carboxylic acid may be used as the quencher.

Now the resist composition is described in detail.

In one embodiment, the resist composition is defined as comprising a polymer comprising recurring units having a hydroxyl group substituted with an acid labile group. Specifically the polymer comprises recurring units of at least one type selected from recurring units (a1) to (a4) represented by the general formula (1).

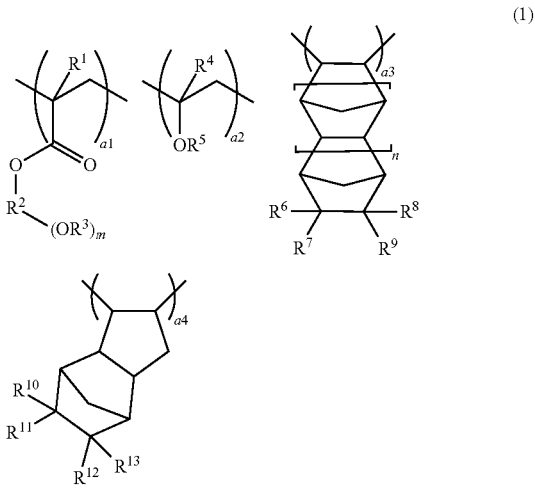

Herein $R^1$ and $R^4$ are each independently hydrogen or methyl. $R^2$ is a di- to pentavalent, straight, branched or cyclic $C_1$-$C_{16}$ aliphatic hydrocarbon group which may contain an ether or ester radical. $R^3$ and $R^5$ each are an acid labile group. $R^6$ to $R^9$ and $R^{10}$ to $R^{13}$ are each independently hydrogen, cyano, a straight, branched or cyclic $C_1$-$C_6$ alkyl group, organoxycarbonyl, or a group having an ether group or lactone ring, at least one of $R^6$ to $R^9$ and $R^{10}$ to $R^{13}$ has a hydroxyl group substituted with an acid labile group. The subscript m is an integer of 1 to 4, n is 0 or 1, a1, a2, a3 and a4 are numbers in the range: $0 \leq a1 < 1.0$, $0 \leq a2 < 1.0$, $0 \leq a3 < 1.0$, $0 \leq a4 < 1.0$, and $0 < a1+a2+a3+a4 < 1.0$.

In the recurring unit (a1), $-R^2-(OR^3)_m$ represents a group obtained by eliminating a number m of hydrogen atoms from a straight or branched alkyl group and introducing $OR^3$ groups instead of the eliminated hydrogen atoms; or a group having any one of the following cyclic structures which is bonded to the —O— moiety of —C(=O)—O— group directly or via a straight, branched or cyclic alkylene group or a —$R^0$—COO— group (wherein $R^0$ is a single bond or a straight, branched or cyclic alkylene group optionally containing an ether bond), in which a number m of $OR^3$ or —$R^{00}$—$OR^3$ (wherein $R^{00}$ is an alkylene group optionally containing an ether bond) are bonded to the cyclic structure (at an arbitrary position).

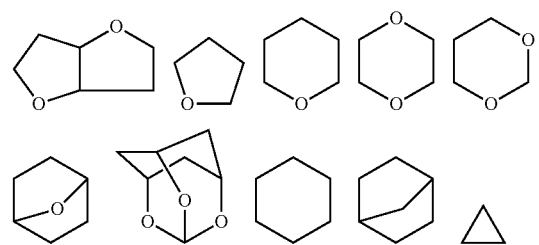

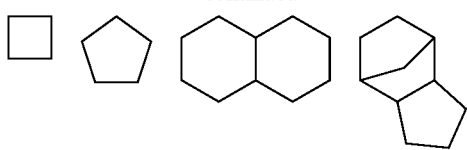
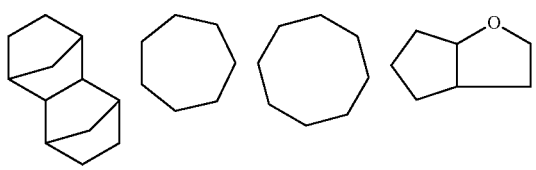
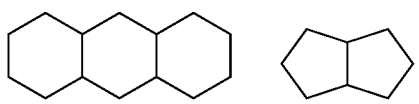
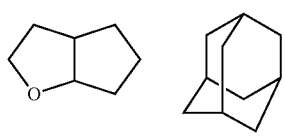
Examples of suitable monomers from which recurring units (a1) and (a2) in formula (1) are derived are shown below.
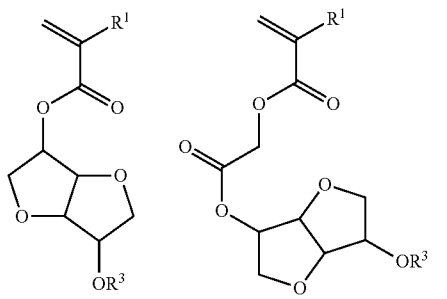
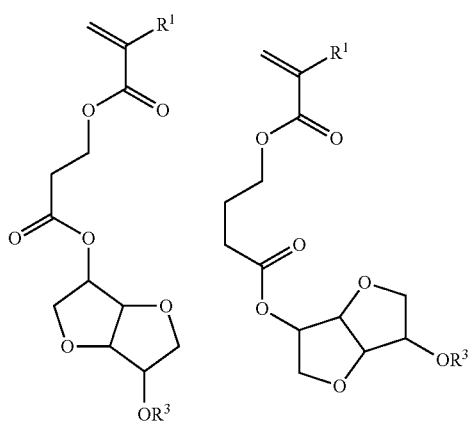
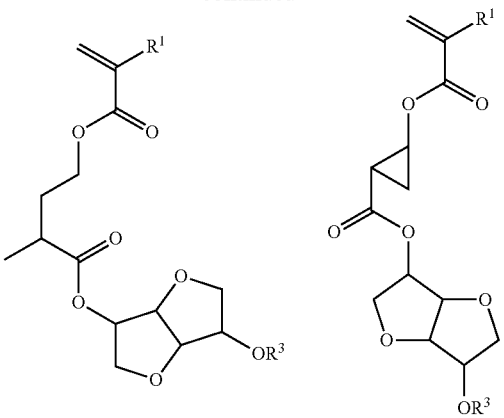
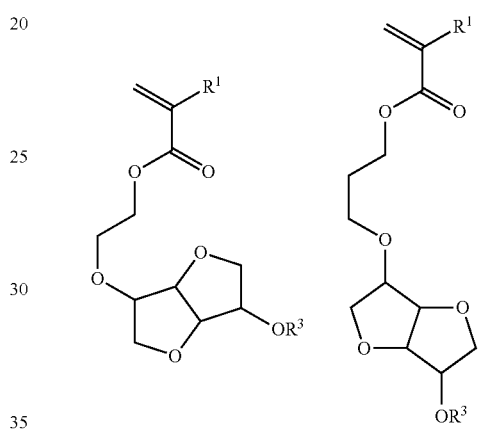
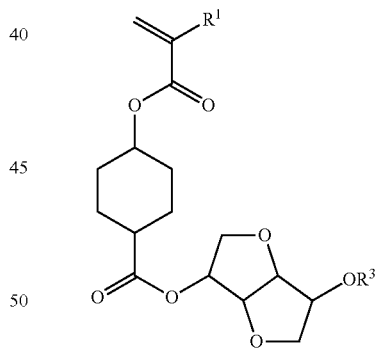
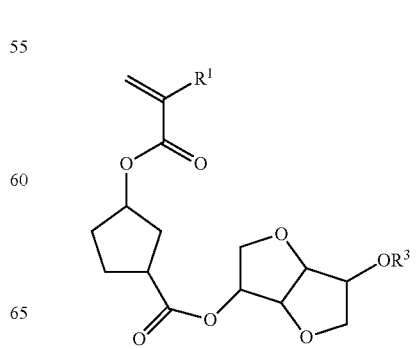

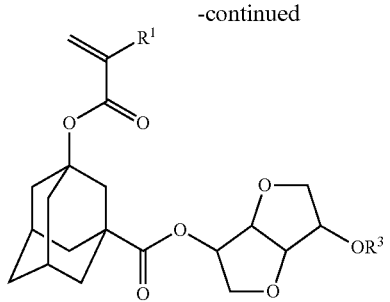
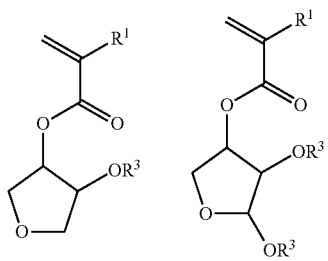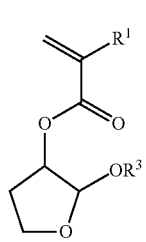
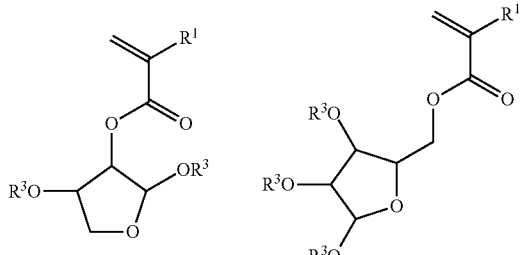
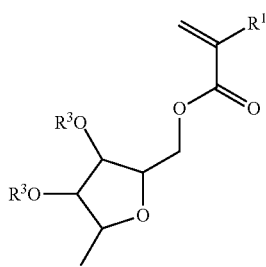
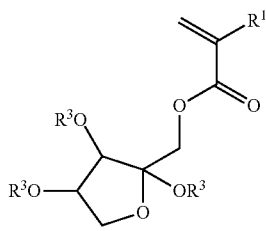
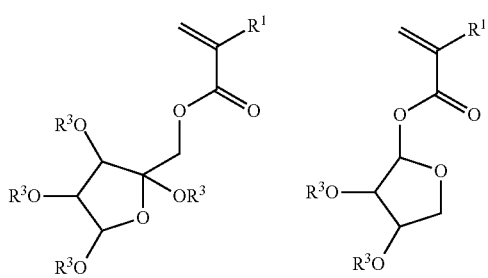
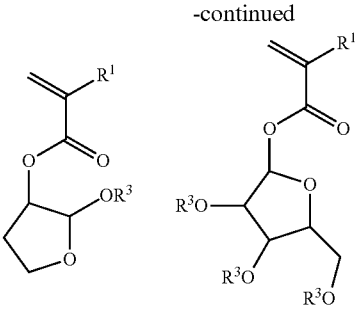
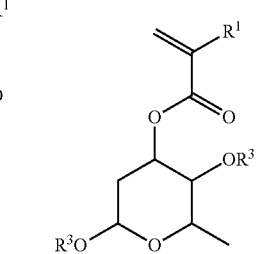
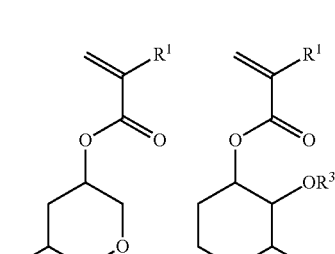
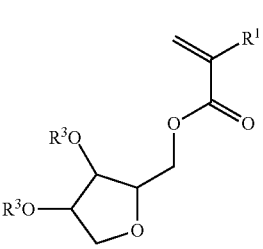
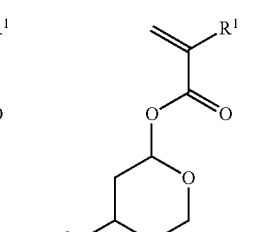
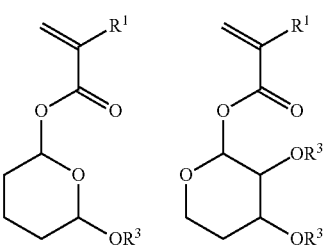

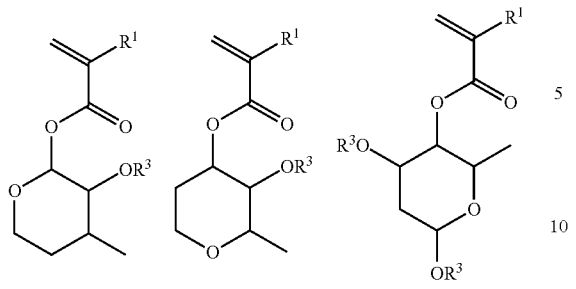
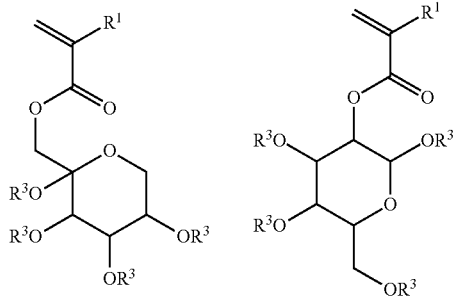
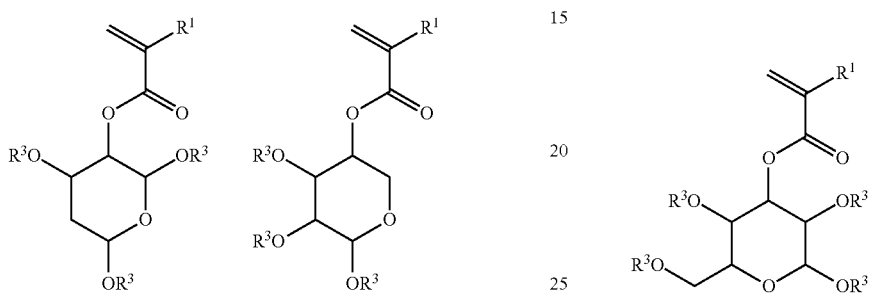
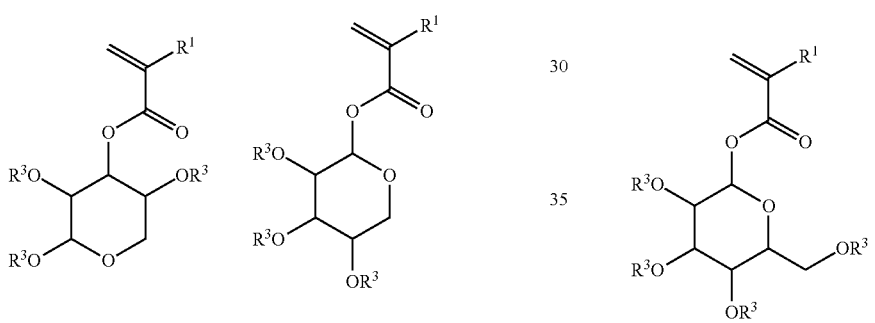
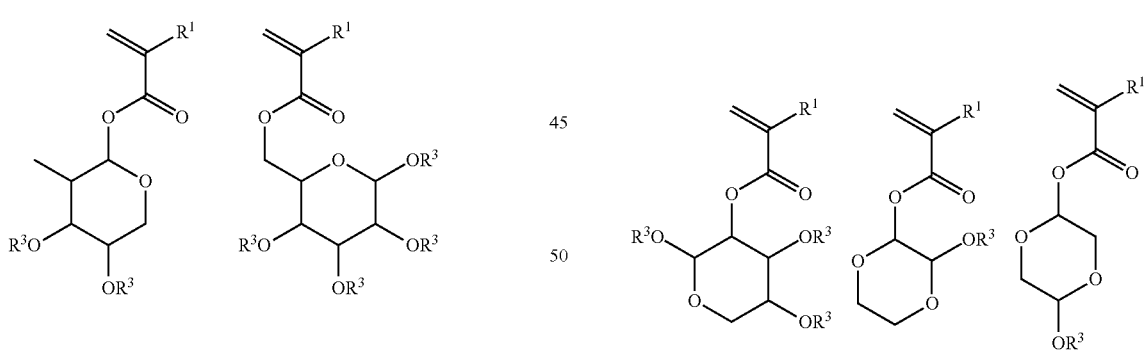
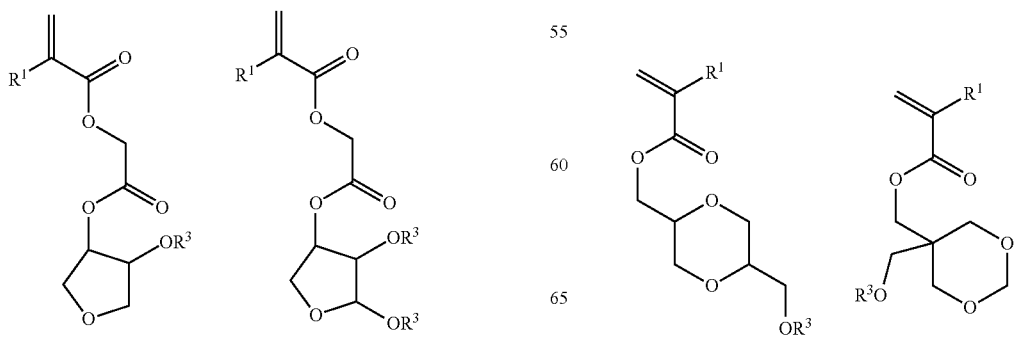

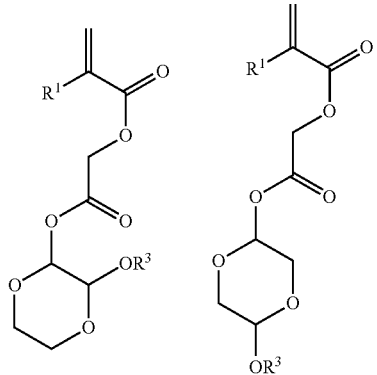
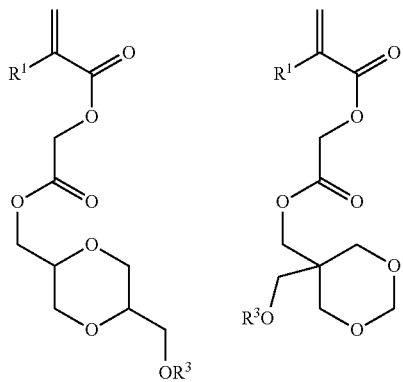
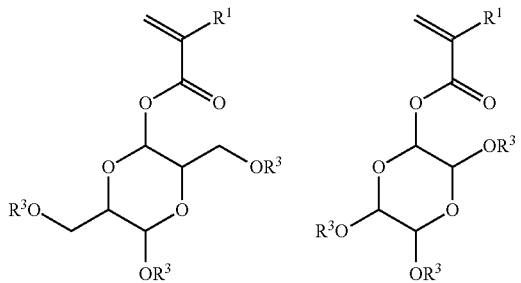
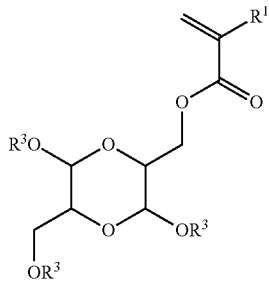
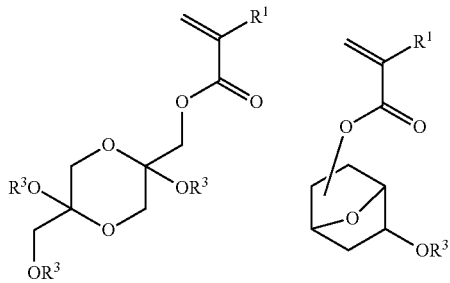
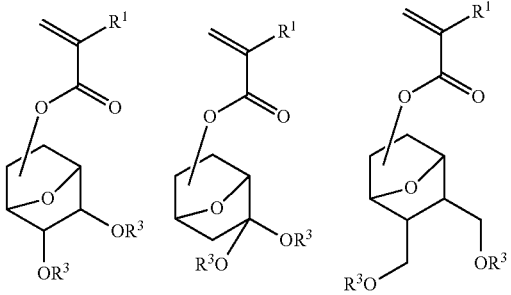
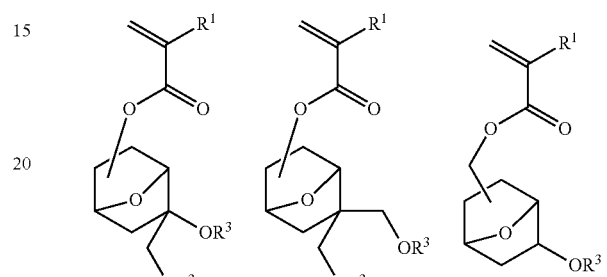
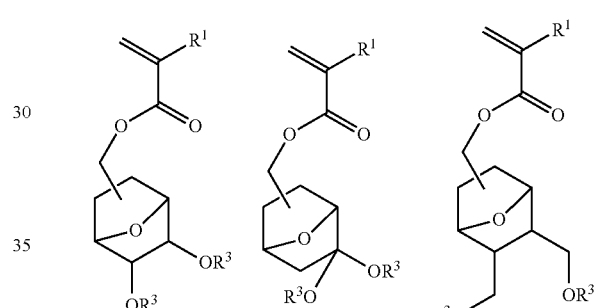
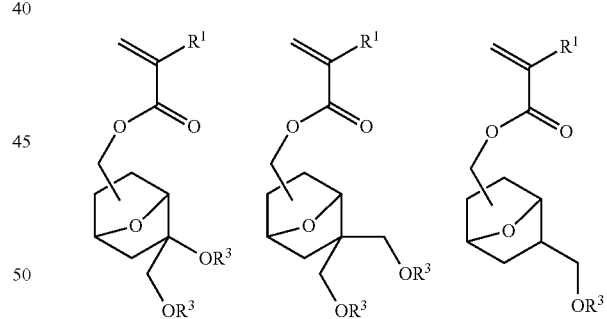
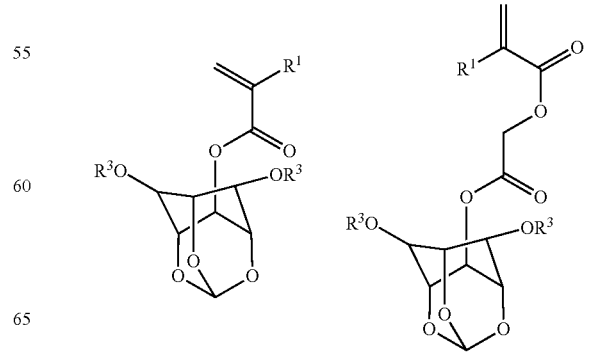

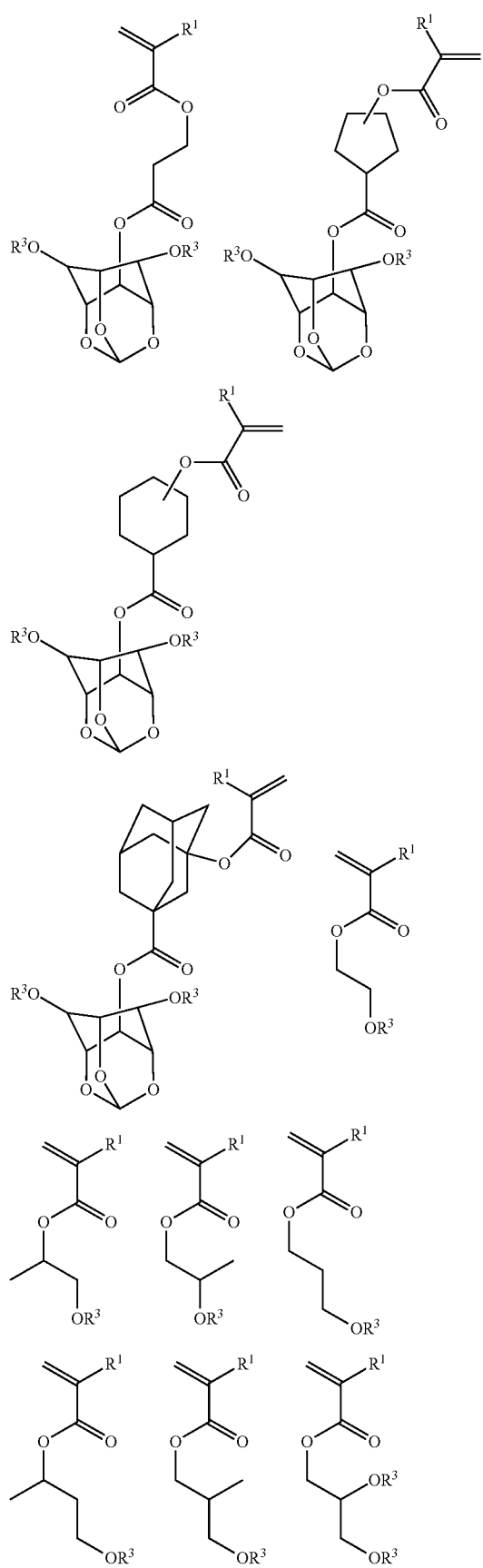
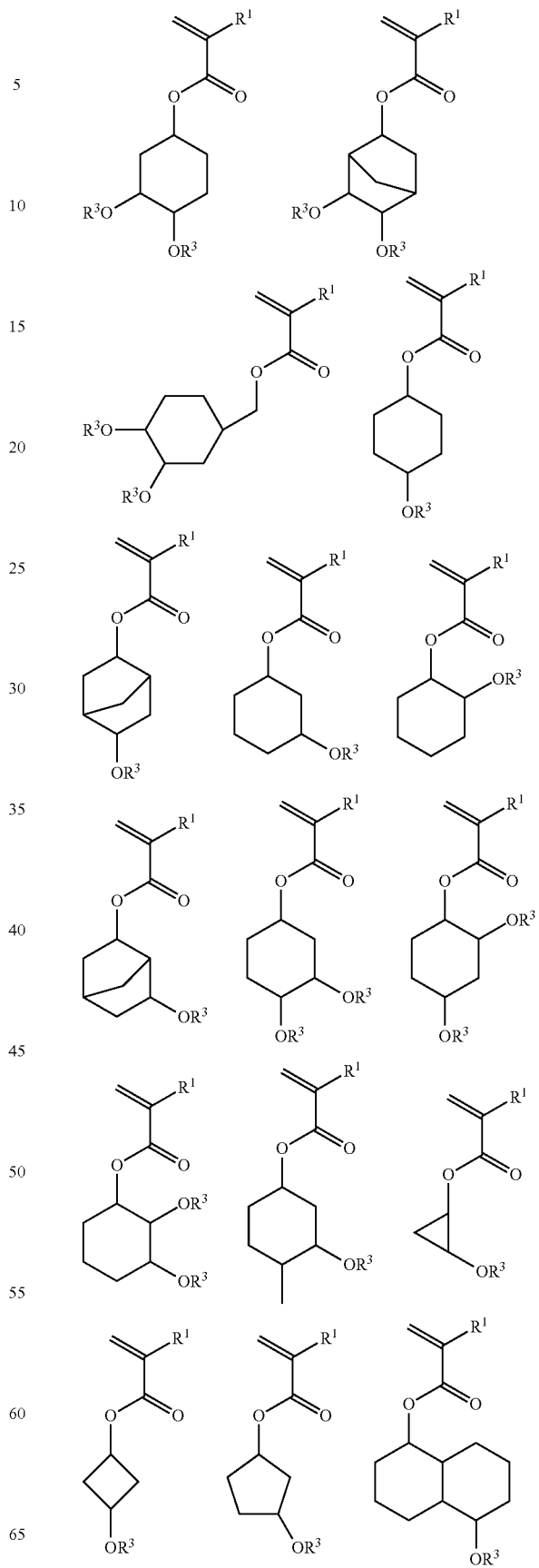

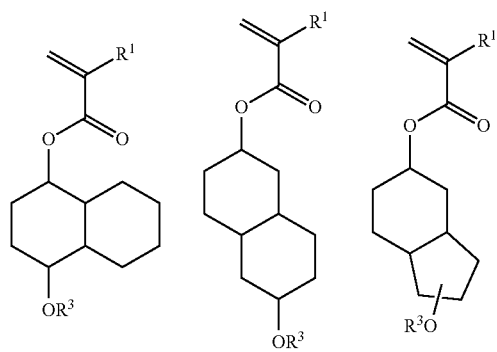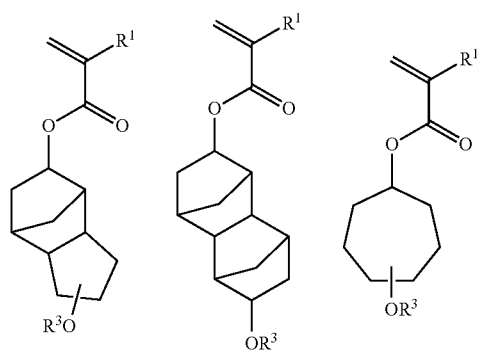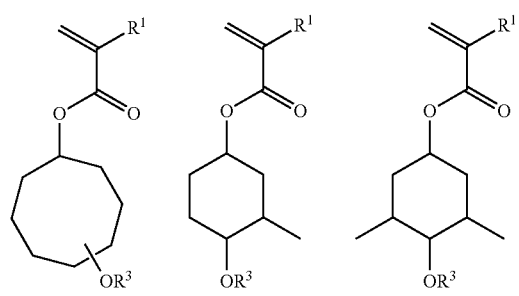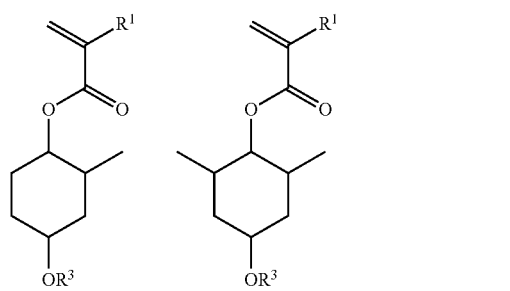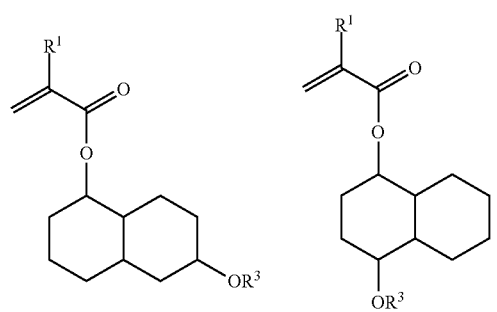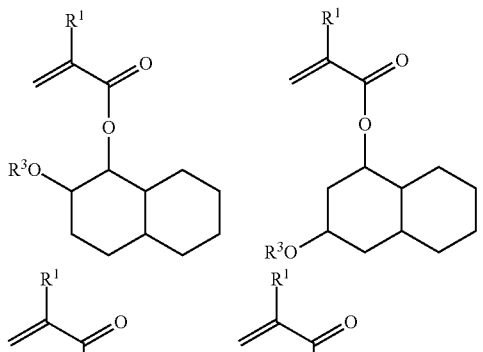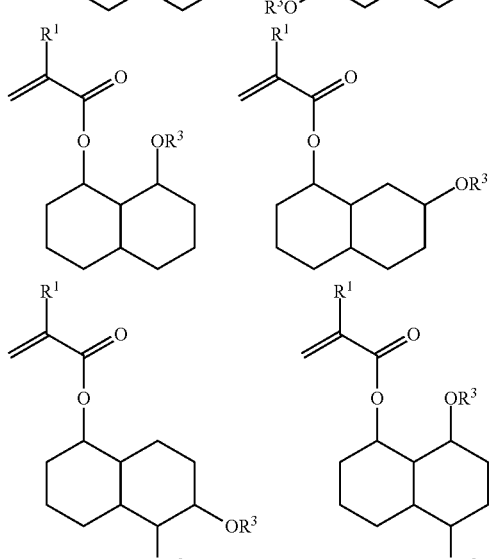

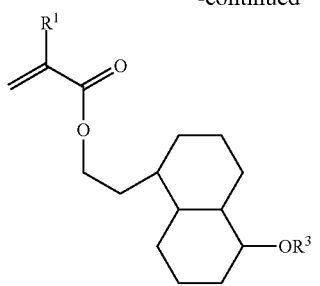
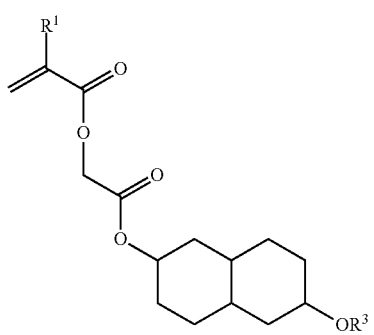
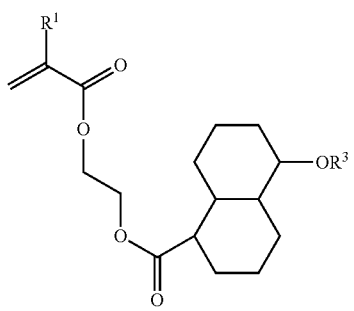
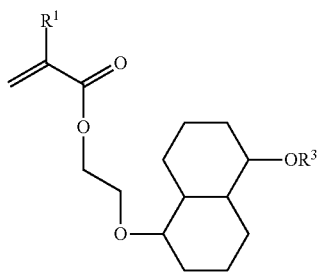
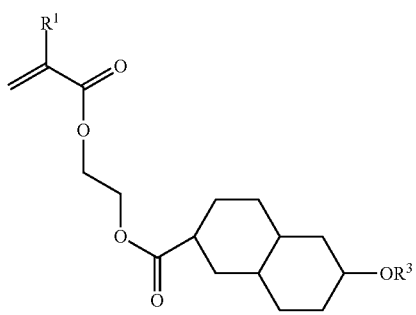
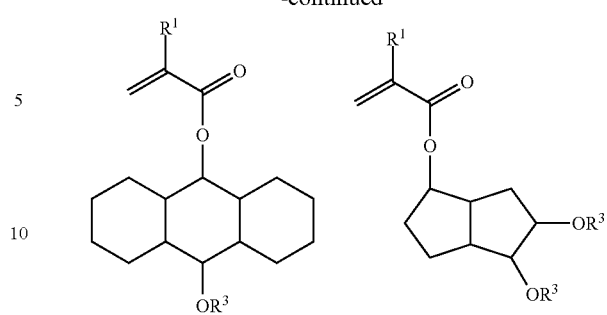
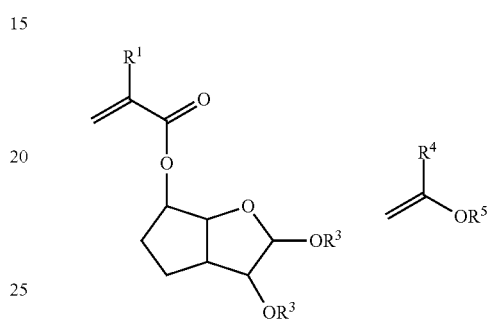
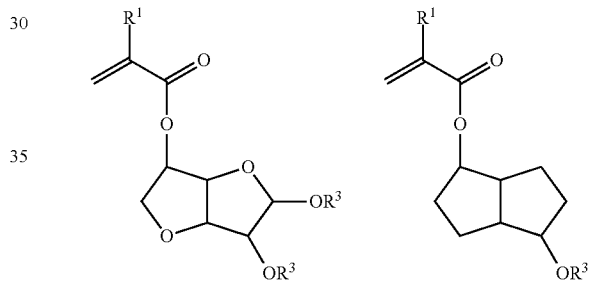
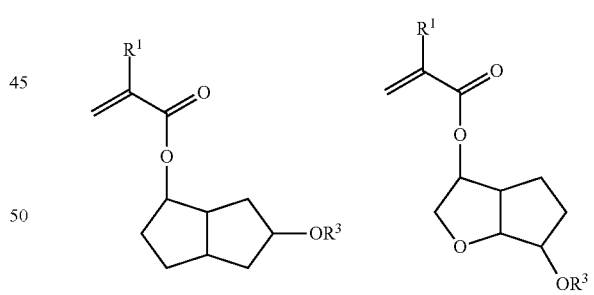
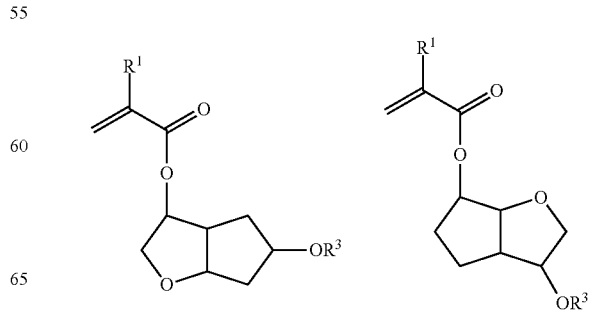

-continued
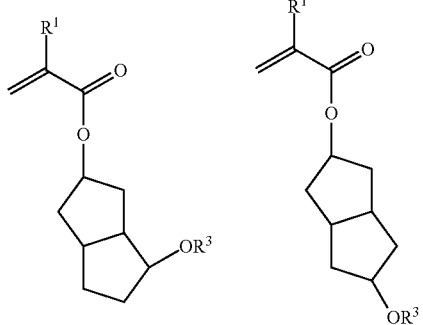
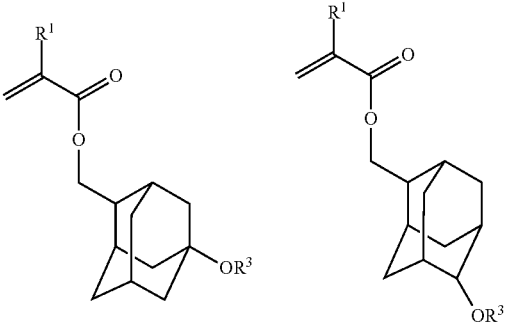
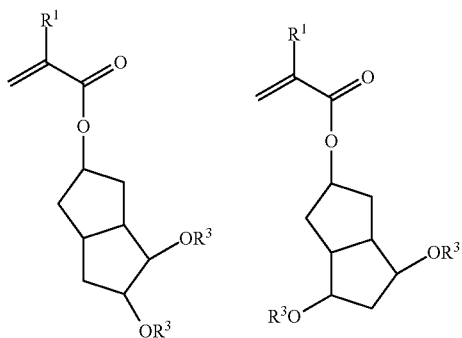
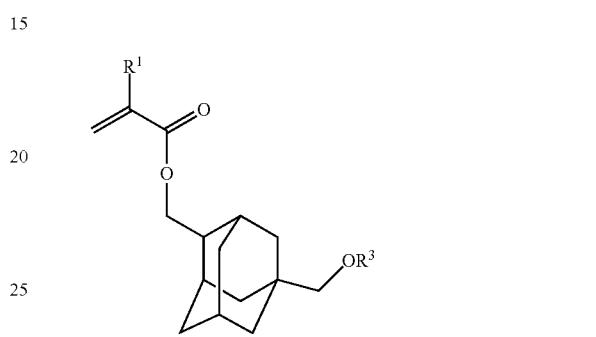
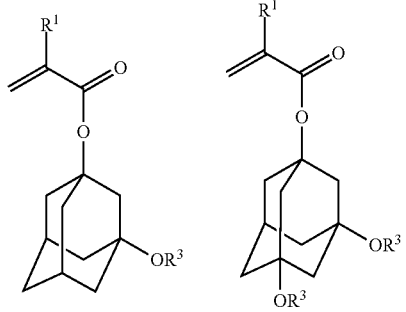
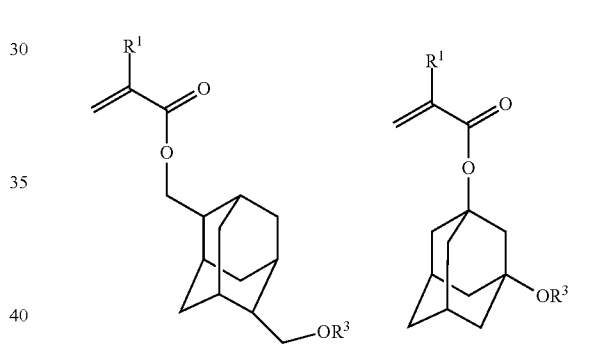
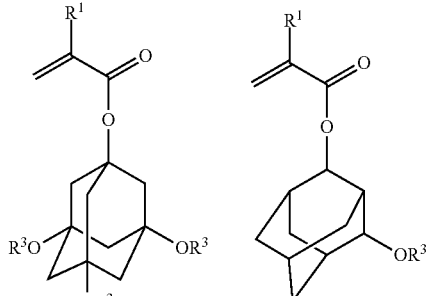
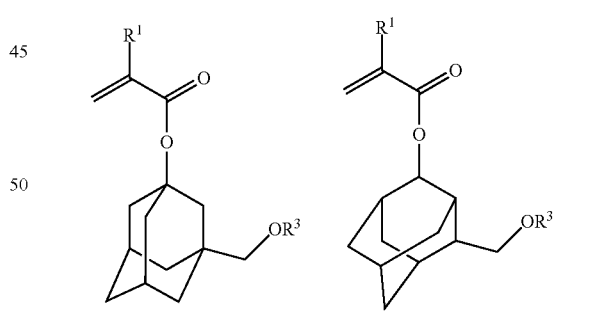
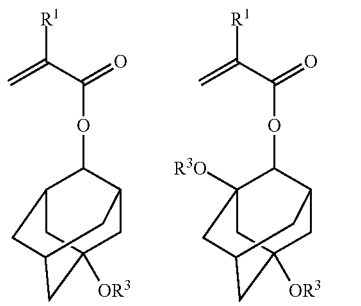
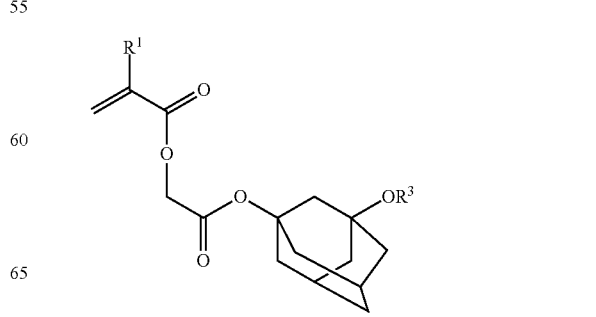

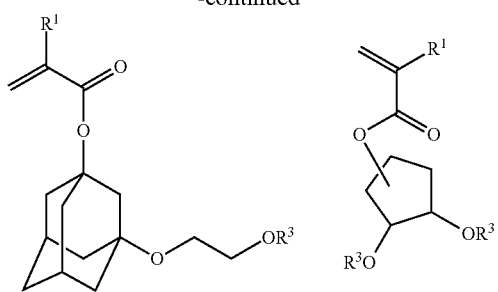
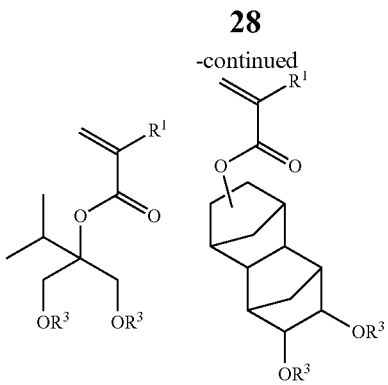

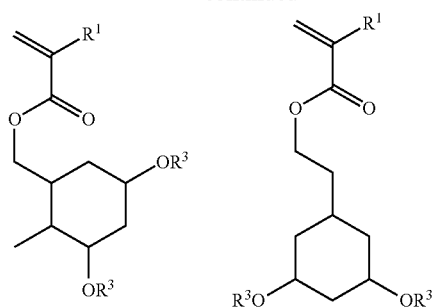
Examples of suitable monomers from which recurring units (a3) and (a4) in formula (1) are derived are shown below. Herein R is an acid labile group.
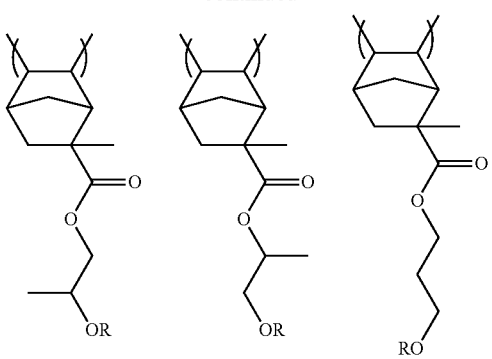
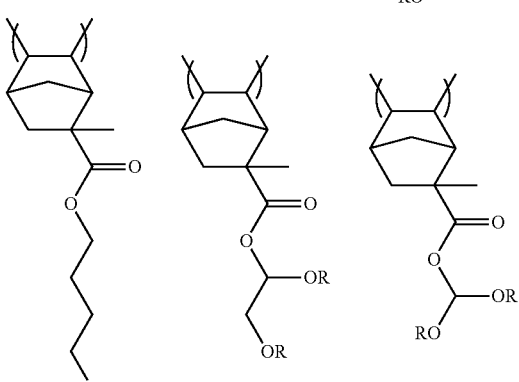
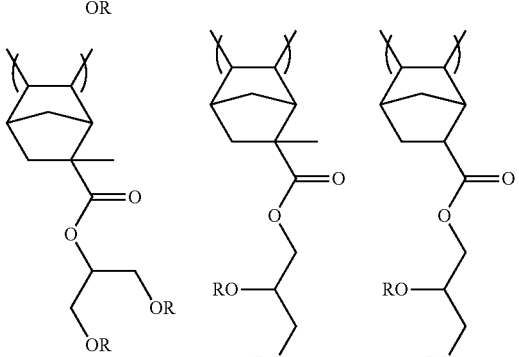
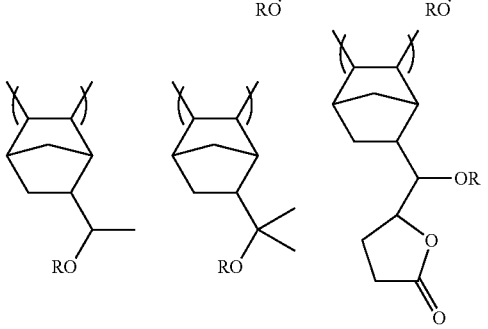
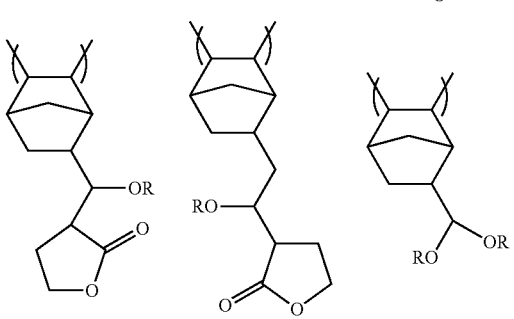

-continued
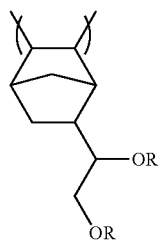 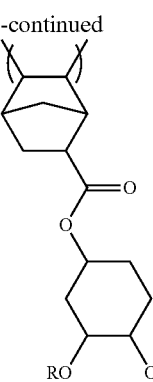
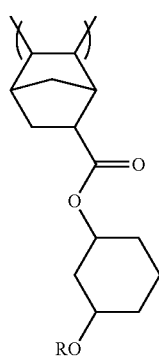 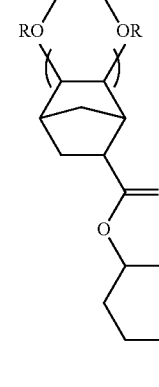
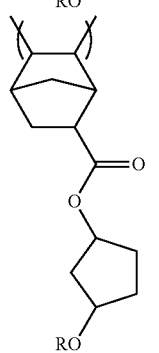 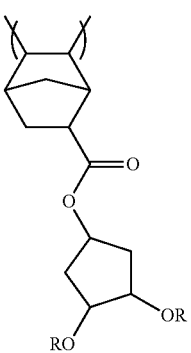
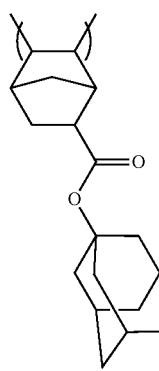
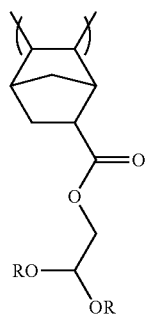 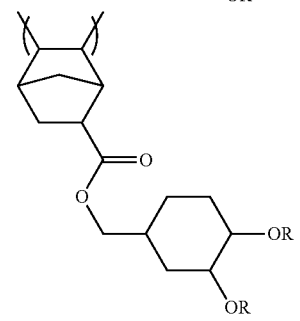
-continued
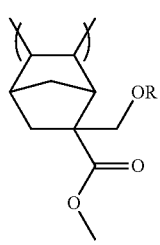 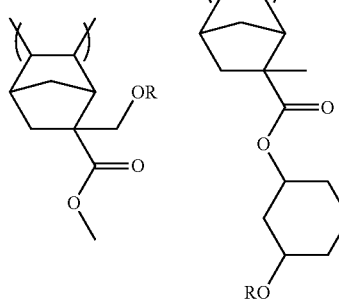
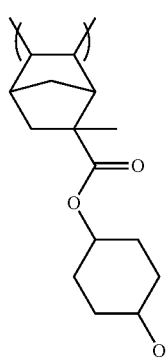 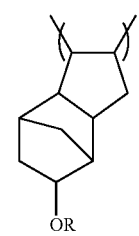 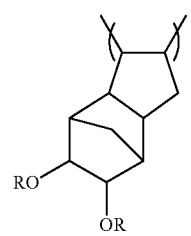
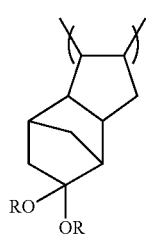 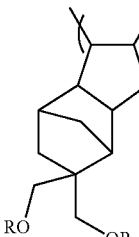 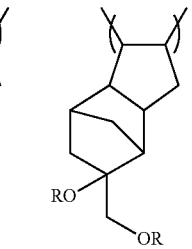
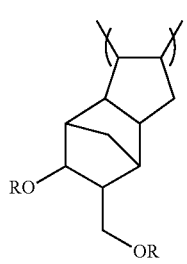 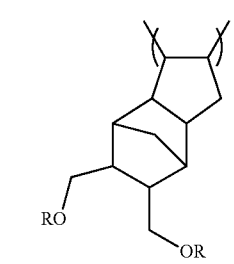
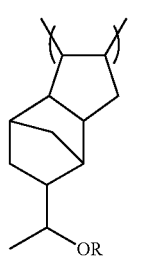 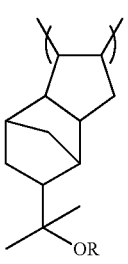

In addition to the recurring units (a1) to (a4), the polymer may have further copolymerized therein recurring units (b) having a carboxyl group substituted with an acid labile group, represented by the following general formula.

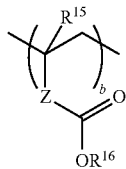

Herein $R^{15}$ is hydrogen or methyl. $R^{15}$ is an acid labile group. Z is a single bond, phenylene, naphthylene or —C(=O)—O—$R^{17}$—, wherein $R^{17}$ is a $C_1$-$C_{10}$ straight, branched or cyclic alkylene group which may have an ether, ester, lactone ring or hydroxyl radical, or a phenylene or naphthylene group.

Suitable monomers Mb from which the recurring units (b) are derived have the following formula wherein $R^{15}$, $R^{16}$ and Z are as defined above.

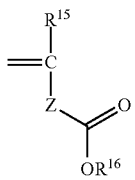

Mb

Examples of the monomer Mb wherein Z is a different group are given below.

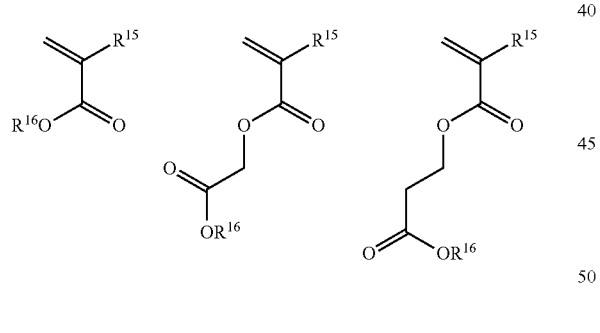

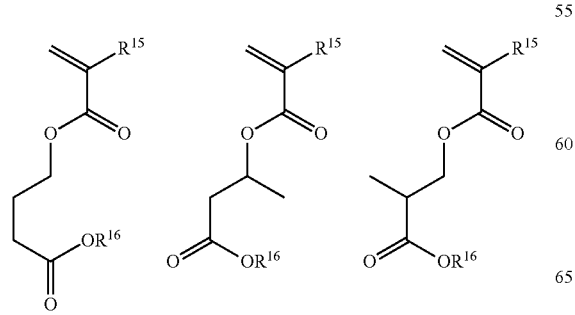

-continued

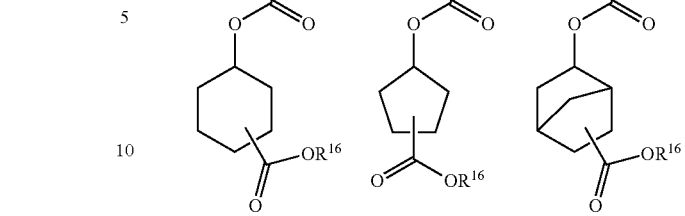

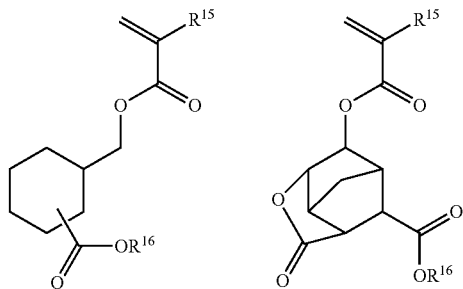

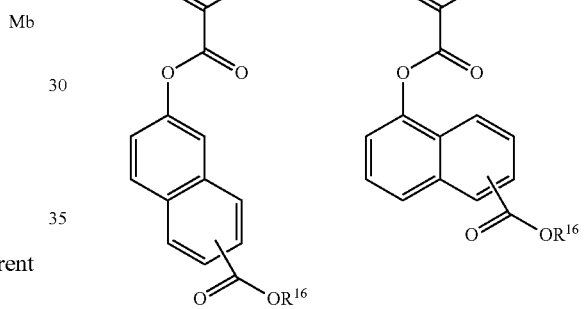

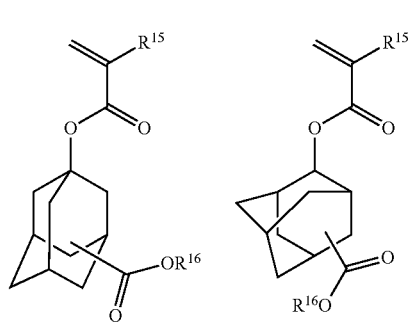

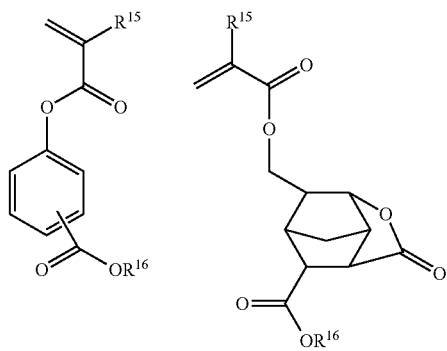

-continued

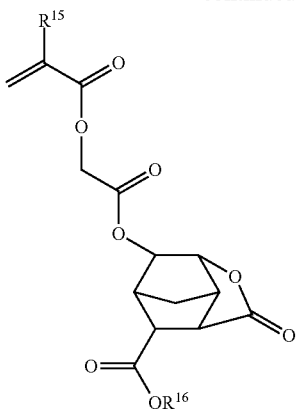

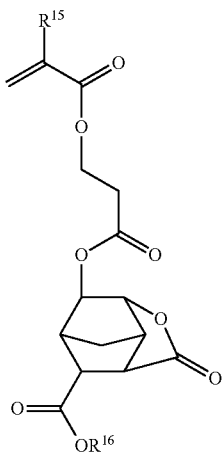

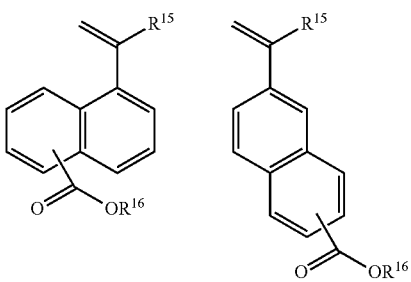

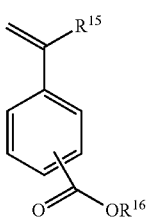

The acid labile groups represented by $R^3$, $R^5$, and $R^{16}$ in units (a1), (a2), and (b) and the acid labile group substituting on the hydroxyl group in $R^6$ to $R^9$ and $R^{10}$ to $R^{13}$ in recurring units (a3) and (a4) may be selected from a variety of such groups while they may be the same or different. Suitable acid labile groups include groups of the formula (AL-10), acetal groups of the formula (AL-11), tertiary alkyl groups of the formula (AL-12), and $C_4$-$C_{20}$ oxoalkyl groups, but are not limited thereto.

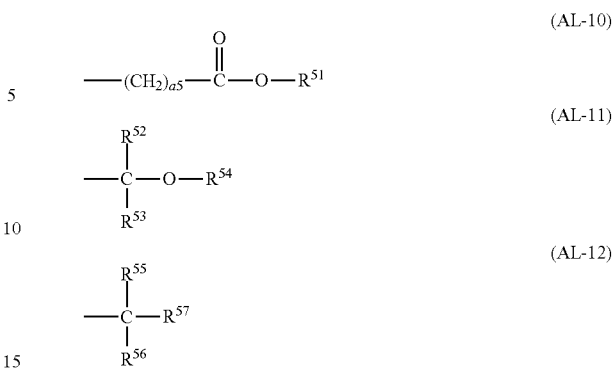

In formulae (AL-10) and (AL-11), $R^{51}$ and $R^{54}$ each are a monovalent hydrocarbon group, typically straight, branched or cyclic alkyl group, of 1 to 40 carbon atoms, more specifically 1 to 20 carbon atoms, which may contain a heteroatom such as oxygen, sulfur, nitrogen or fluorine. $R^{52}$ and $R^{53}$ each are hydrogen or a monovalent hydrocarbon group, typically straight, branched or cyclic alkyl group, of 1 to 20 carbon atoms which may contain a heteroatom such as oxygen, sulfur, nitrogen or fluorine. The subscript "a5" is an integer of 0 to 10, and especially 1 to 5. Alternatively, a pair of $R^{52}$ and $R^{53}$, $R^{52}$ and $R^{54}$, or $R^{53}$ and $R^{54}$ may bond together to form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically straight, branched or cyclic alkyl group, of 1 to 20 carbon atoms which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$ may bond together to form a ring, specifically aliphatic ring, with the carbon atom to which they are attached, the ring having 3 to 20 carbon atoms, especially 4 to 16 carbon atoms.

Illustrative examples of the acid labile group of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

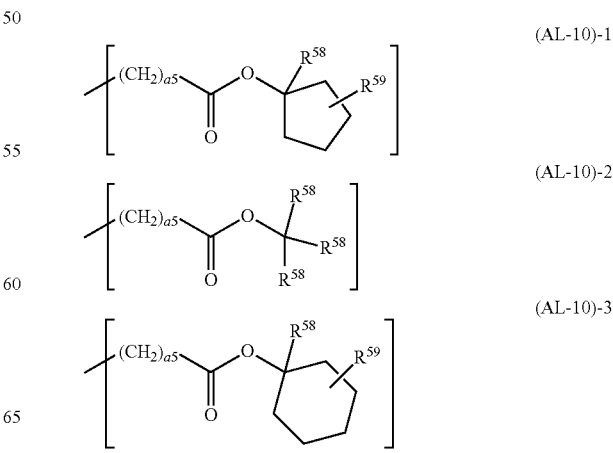

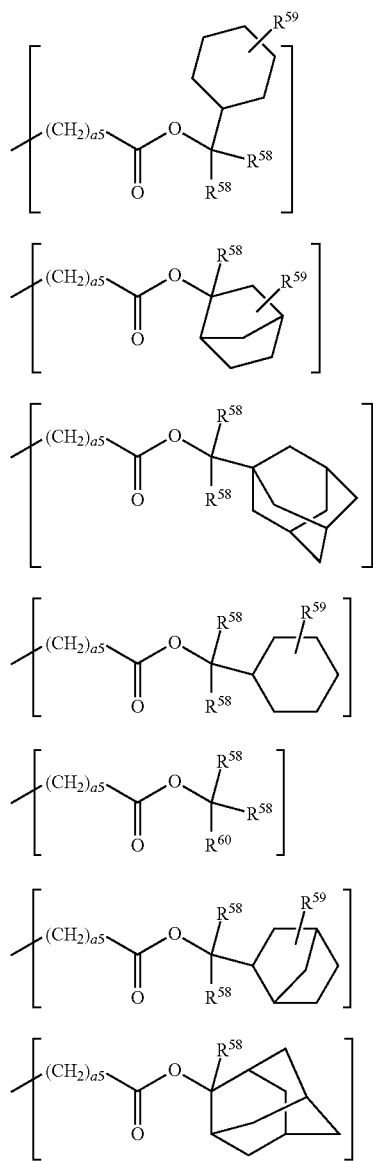
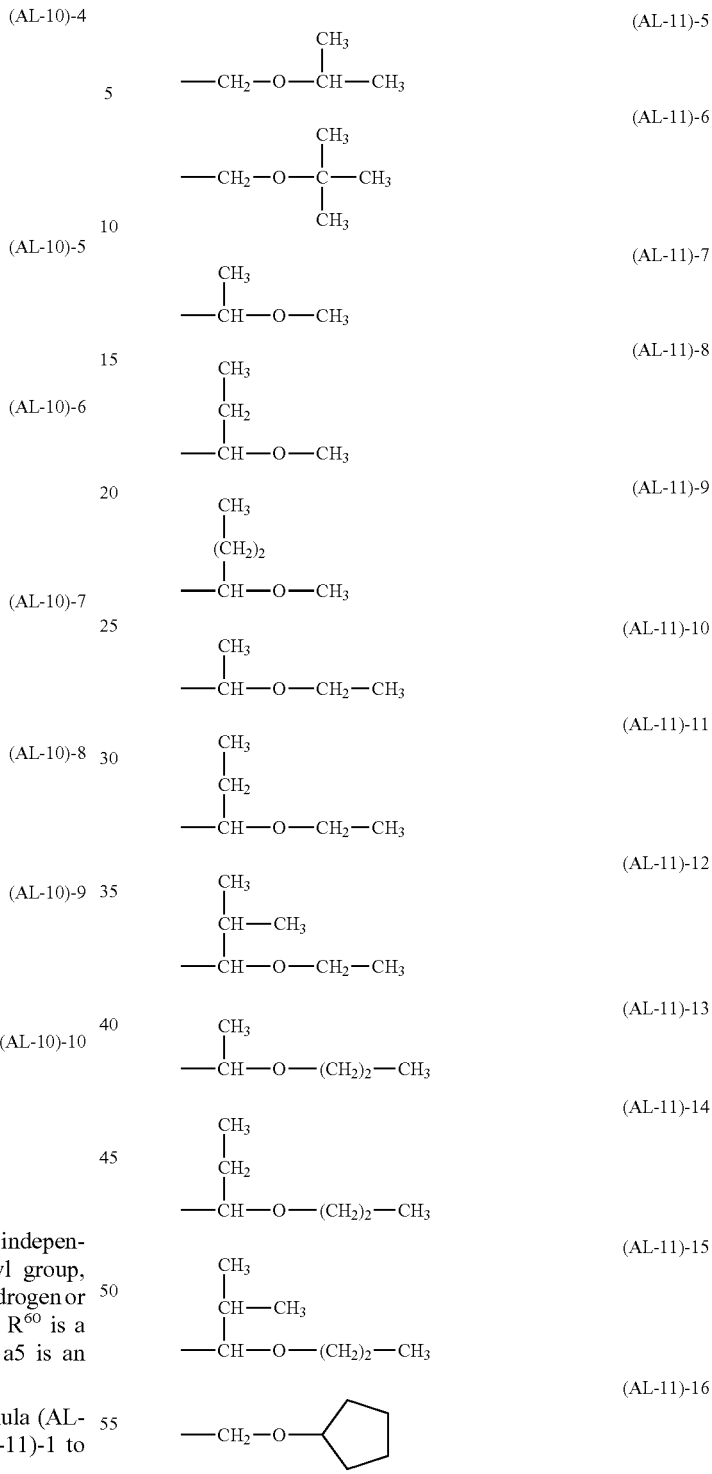

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and a5 is an integer of 0 to 10, especially 1 to 5.

Illustrative examples of the acetal group of formula (AL-11) include those of the following formulae (AL-11)-1 to (AL-11)-112.

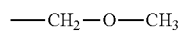 (AL-11)-1

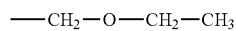 (AL-11)-2

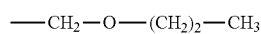 (AL-11)-3

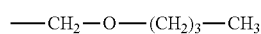 (AL-11)-4

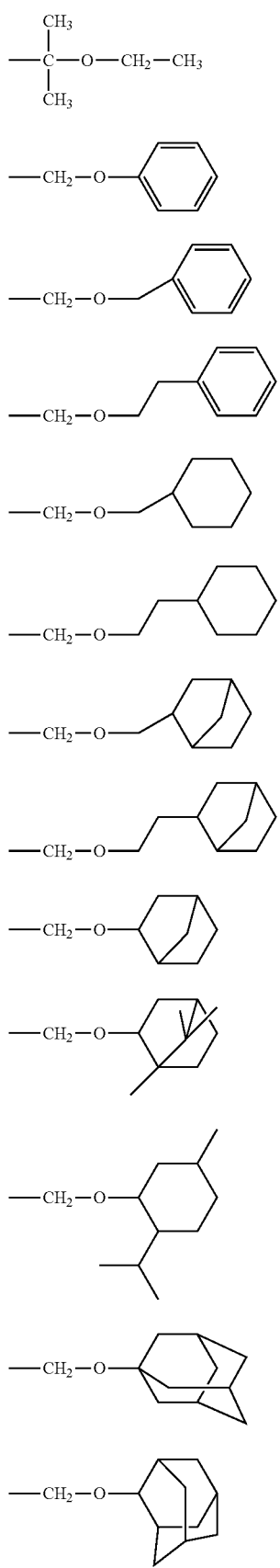
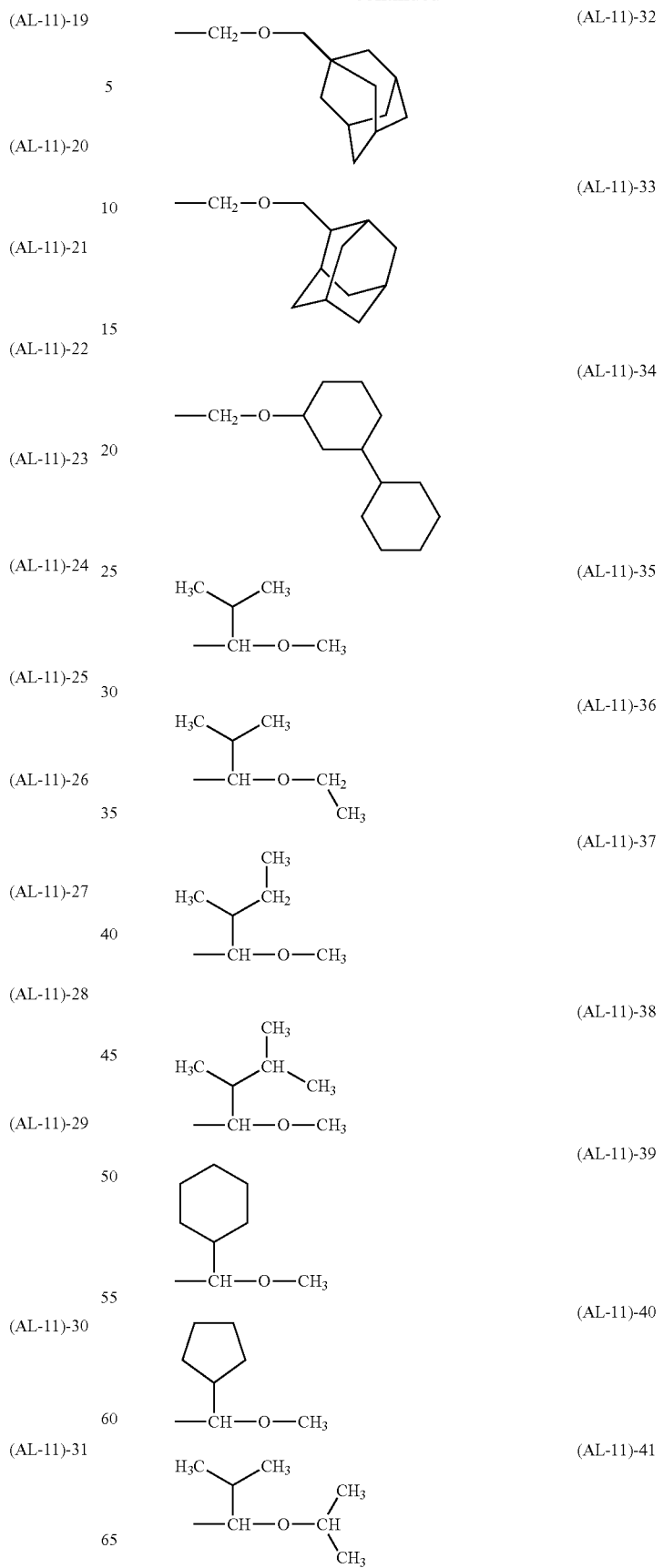

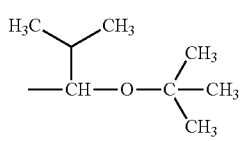 (AL-11)-42
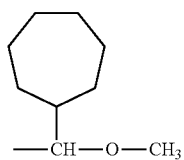 (AL-11)-43
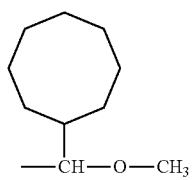 (AL-11)-44
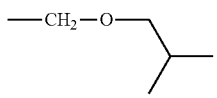 (AL-11)-45
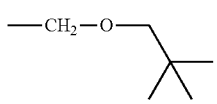 (AL-11)-46
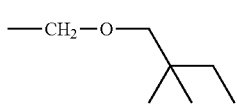 (AL-11)-47
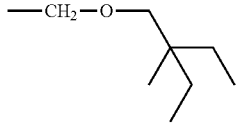 (AL-11)-48
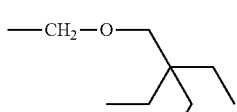 (AL-11)-49
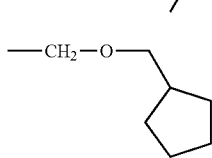 (AL-11)-50
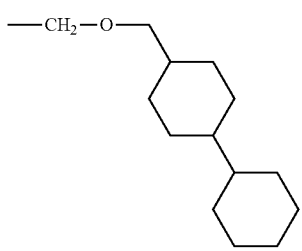 (AL-11)-51
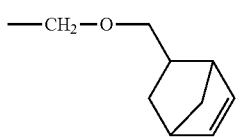 (AL-11)-52
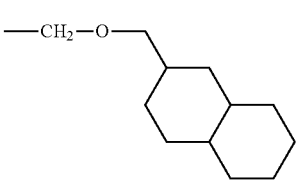 (AL-11)-53
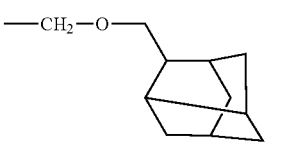 (AL-11)-54
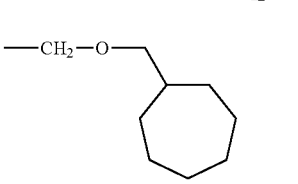 (AL-11)-55
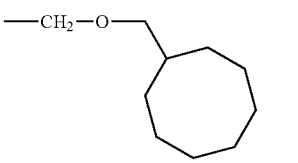 (AL-11)-56
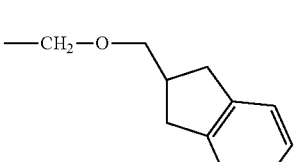 (AL-11)-57
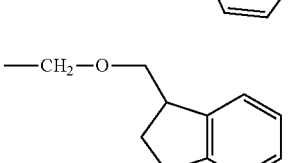 (AL-11)-58
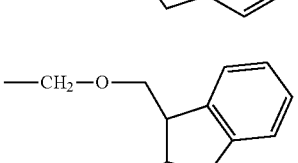 (AL-11)-59
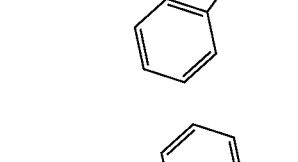 (AL-11)-60
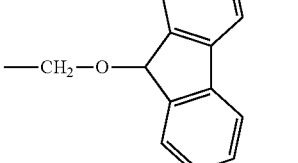 (AL-11)-61
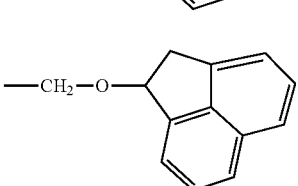

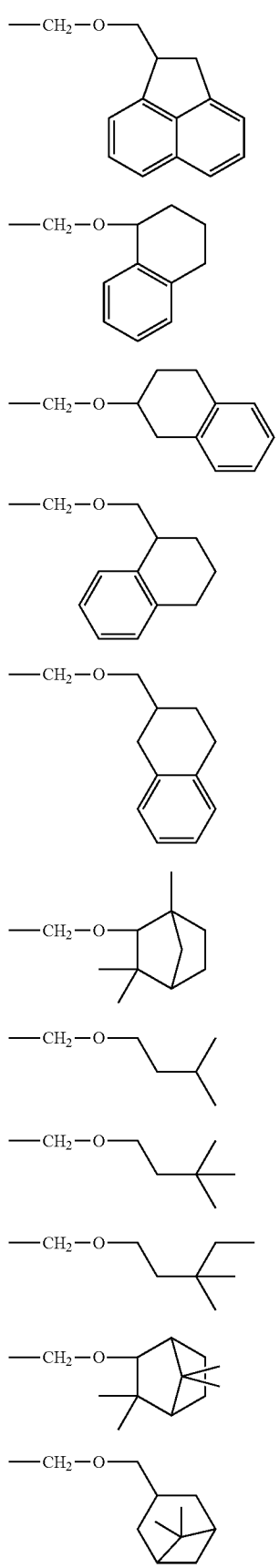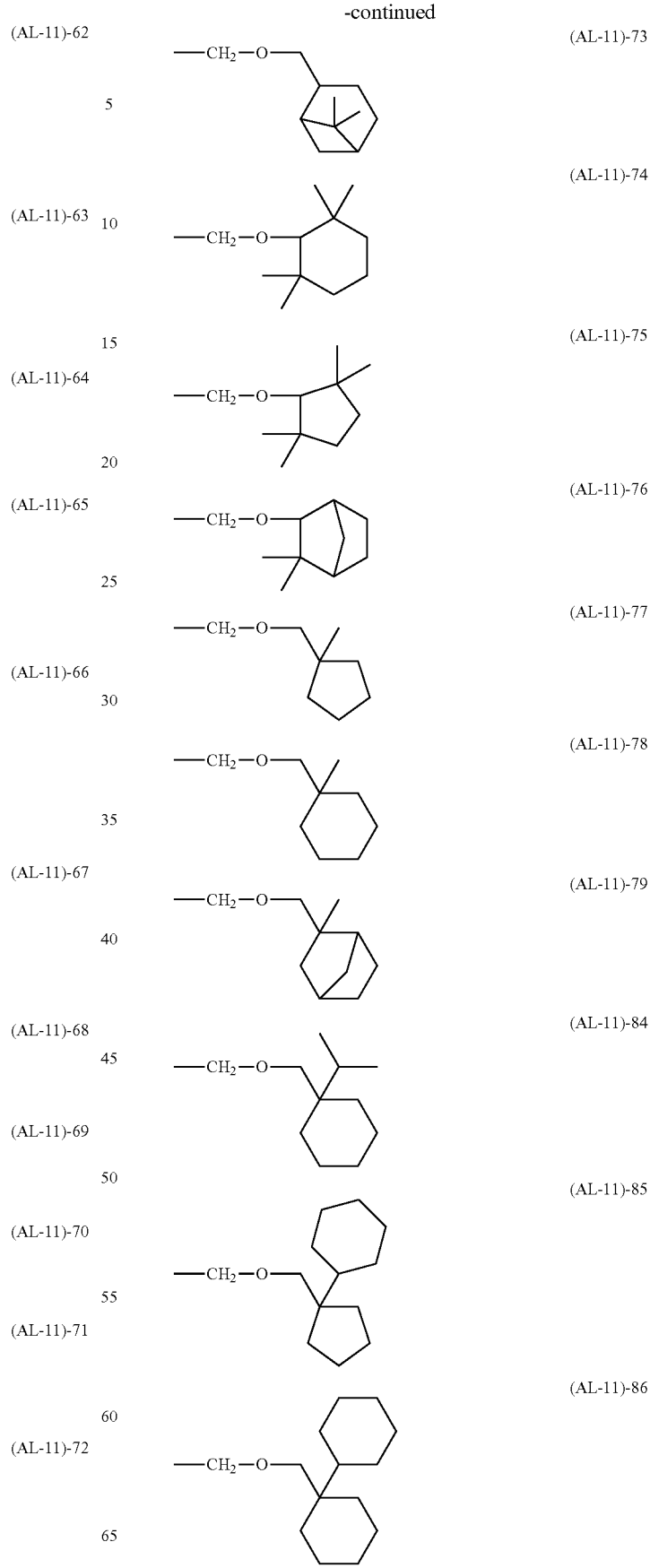

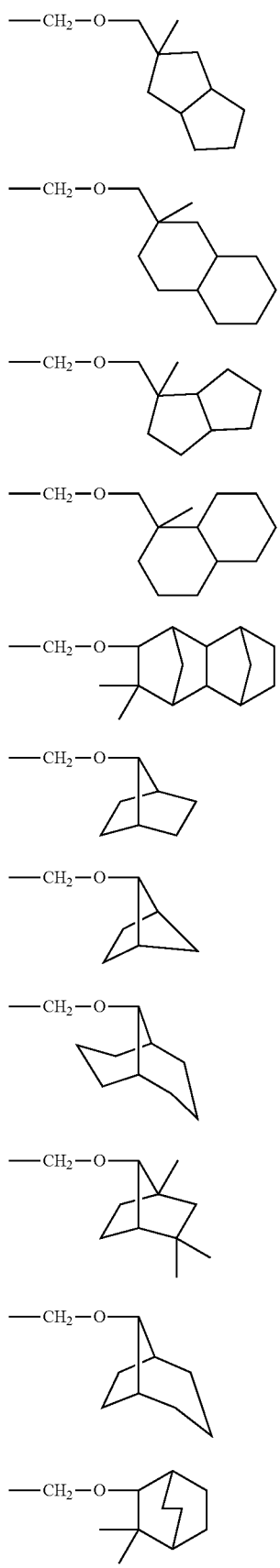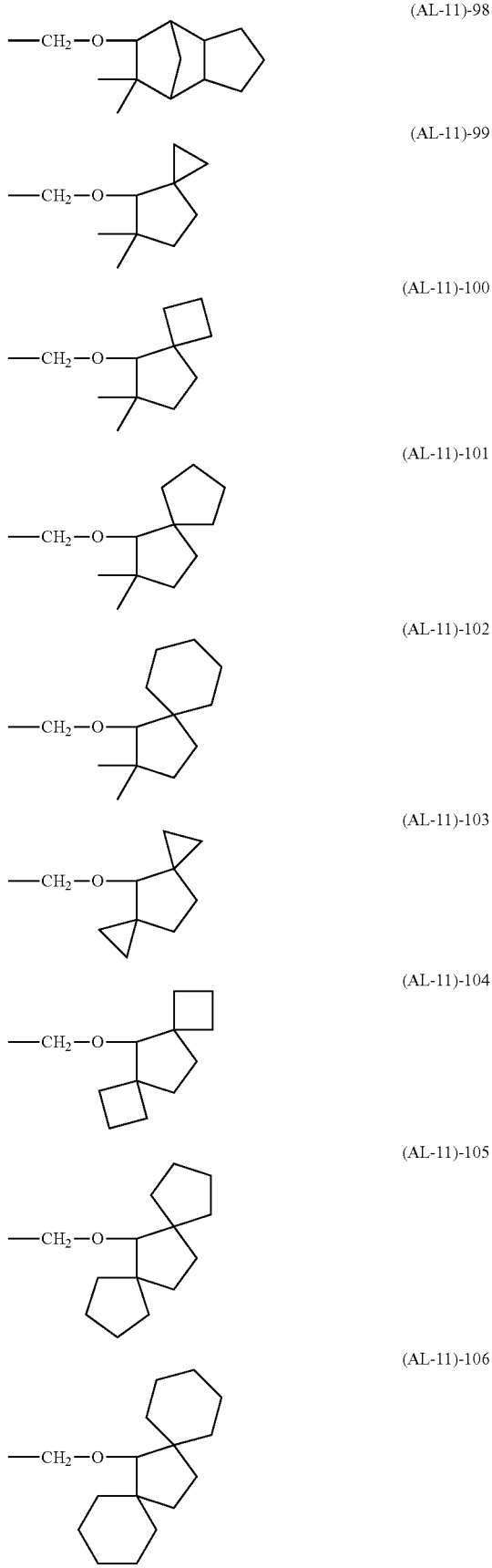

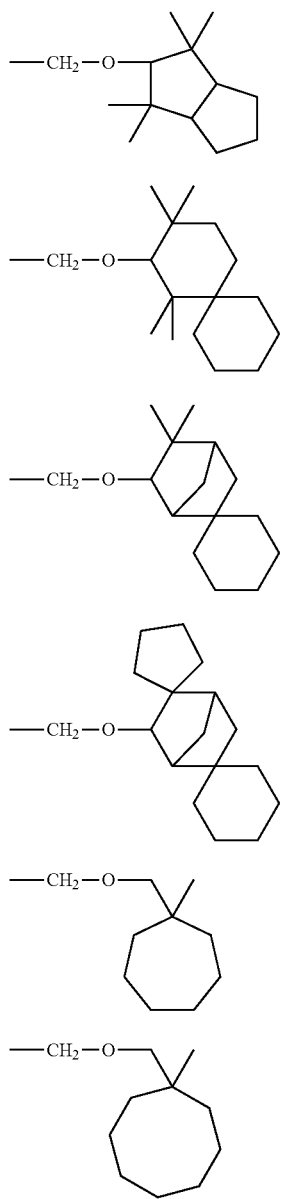

Other examples of acid labile groups include those of the following formula (AL-11a) or (AL-11b) while the polymer may be crosslinked within the molecule or between molecules with these acid labile groups.

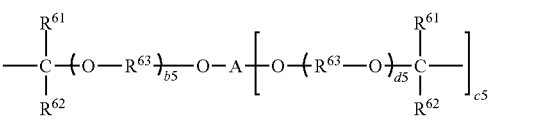

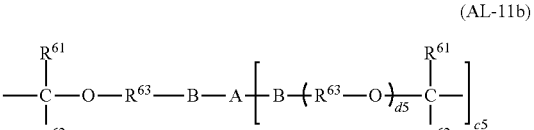

Herein $R^{61}$ and $R^{62}$ each are hydrogen or a straight, branched or cyclic $C_1$-$C_8$ alkyl group, or $R^{61}$ and $R^{62}$ may bond together to form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some hydrogen atoms attached to carbon atoms may be substituted by hydroxyl, carboxyl, carbonyl radicals or fluorine atoms. "B" is —CO—O—, —NHCO—O— or —NH-CONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some hydrogen atoms attached to carbon atoms may be substituted by hydroxyl, carboxyl, acyl radicals or halogen atoms. The subscript c5 is preferably an integer of 1 to 3.

The crosslinking acetal groups of formulae (AL-11a) and (AL-11b) are exemplified by the following formulae (AL-11)-113 through (AL-11)-120.

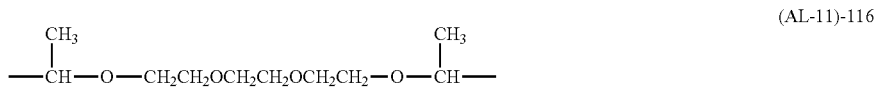

-continued
(AL-11)-117
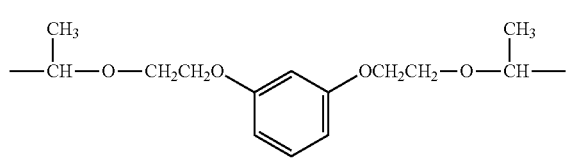
(AL-11)-118
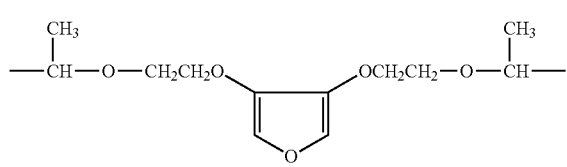
(AL-11)-119
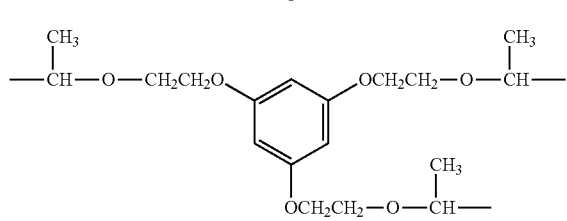
(AL-11)-120
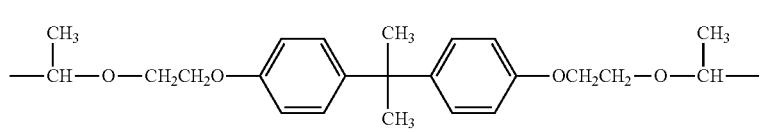
Illustrative examples of the tertiary alkyl group of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
(AL-12)-1
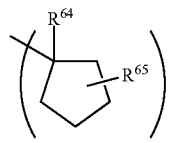
(AL-12)-2
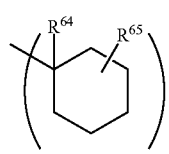
(AL-12)-3
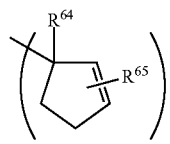
(AL-12)-4
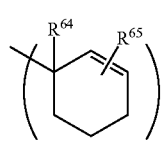
(AL-12)-5
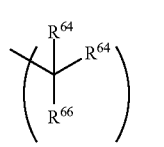
(AL-12)-6
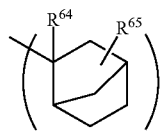
(AL-12)-7
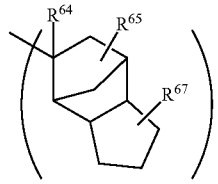
(AL-12)-8
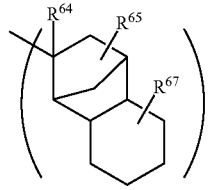
(AL-12)-9
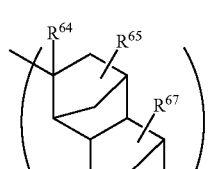
(AL-12)-10
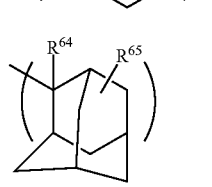

(AL-12)-11
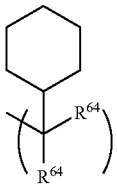

(AL-12)-12
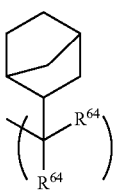

(AL-12)-13
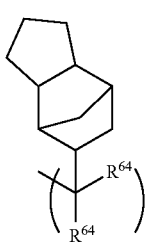

(AL-12)-14
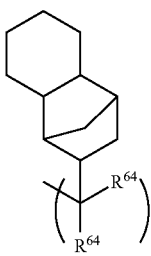

(AL-12)-15
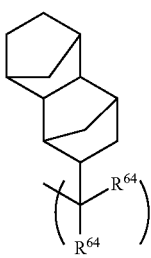

(AL-12)-16
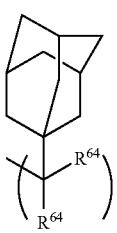

Herein $R^{64}$ is each independently a straight, branched or cyclic $C_1$-$C_8$ alkyl group, $C_6$-$C_{20}$ aryl group or $C_7$-$C_{20}$ aralkyl group, or two $R^{64}$ groups may bond together to form a ring, typically aliphatic ring, with the carbon atom to which they are attached, the ring being of 3 to 20 carbon atoms, specifically 4 to 16 carbon atoms; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With acid labile groups containing $R^{68}$ representative of a di- or poly-valent alkylene or arylene group as shown by formula (AL-12)-17, the polymer may be crosslinked within the molecule or between molecules. In formula (AL-12)-17, $R^{64}$ is as defined above, $R^{68}$ is a single bond, a straight, branched or cyclic $C_1$-$C_{20}$ alkylene group or arylene group, which may contain a heteroatom such as oxygen, sulfur or nitrogen, and b6 is an integer of 1 to 3. It is noted that formula (AL-12)-17 is applicable to all the foregoing acid labile groups.

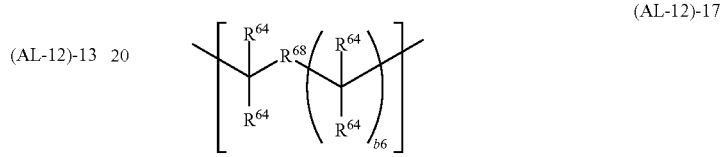

(AL-12)-17

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

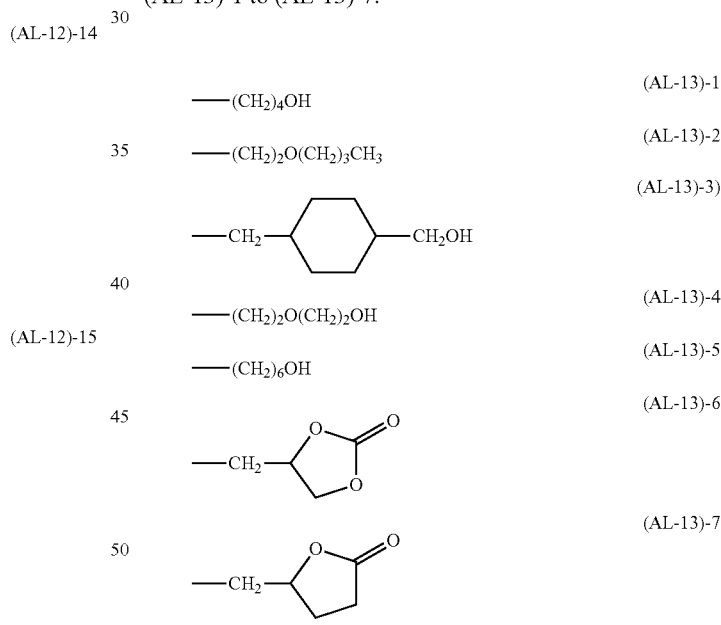

While the polymer used as the base resin in the resist composition comprises essentially recurring units (a1) to (a4) as represented by formula (1) and optionally (and preferably) recurring units (b) having an acid labile group, it may have further copolymerized therein recurring units (c) derived from monomers having adhesive groups such as hydroxy, cyano, carbonyl, ester, ether groups, lactone rings, carboxyl, carboxylic anhydride, sulfonic acid ester, disulfone or carbonate groups. Of these, recurring units having lactone ring as the adhesive group are most preferred.

Examples of suitable monomers from which recurring units (c) are derived are given below.

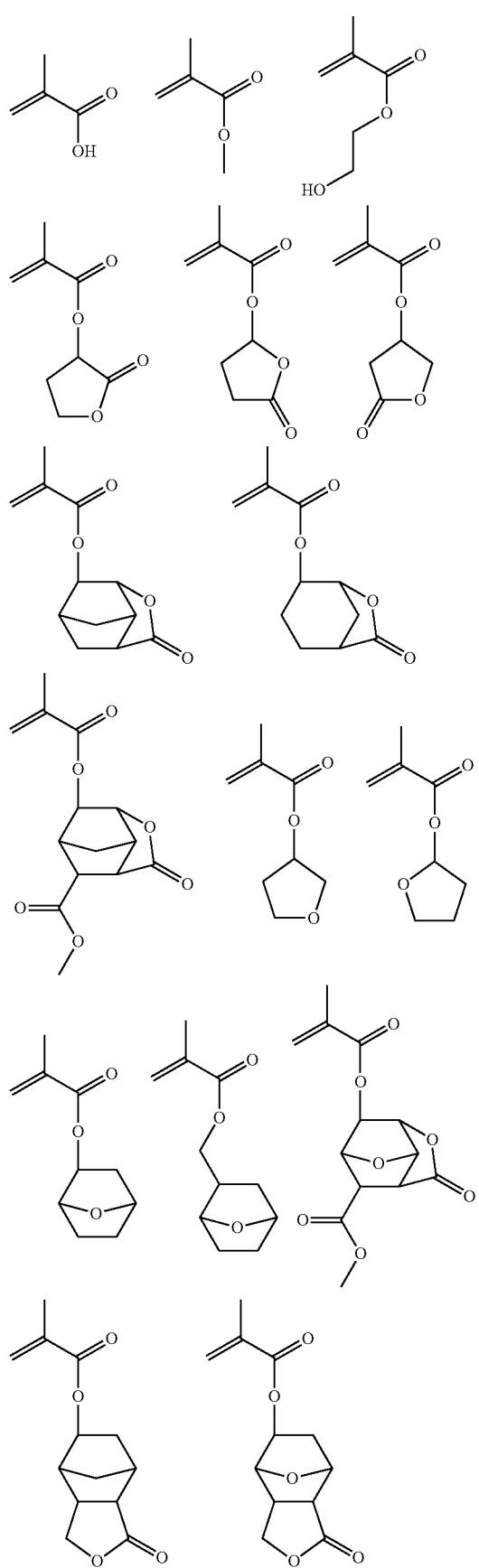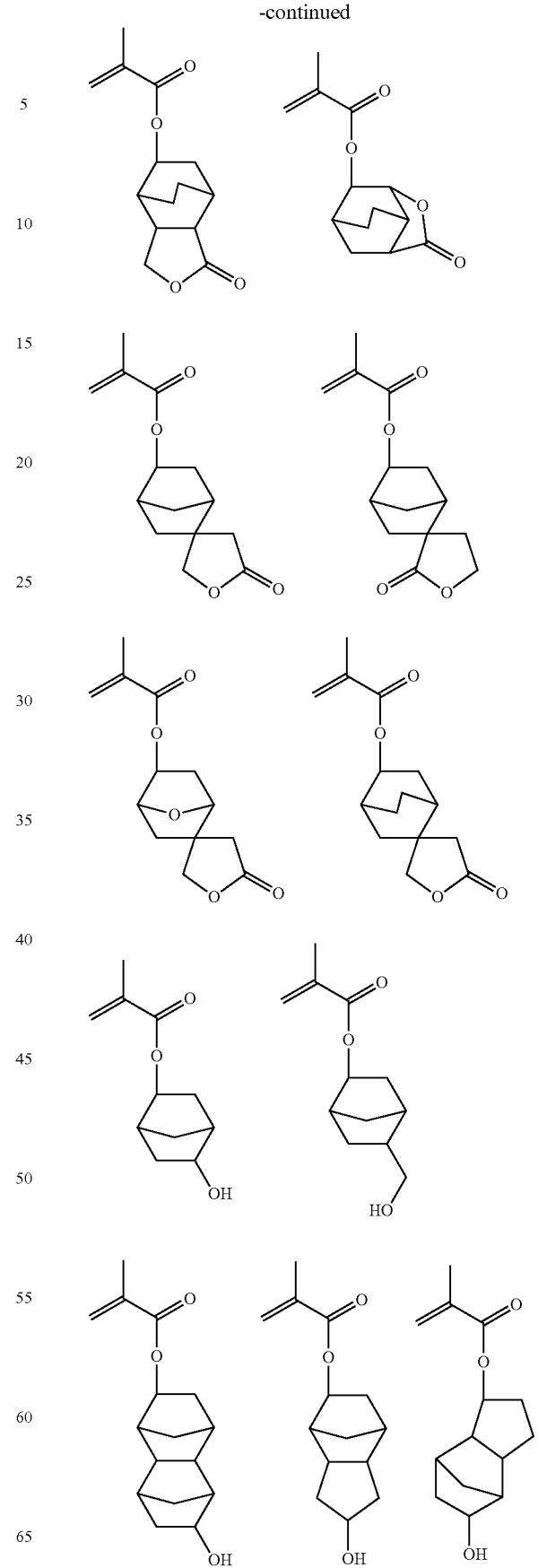

55
-continued
56
-continued
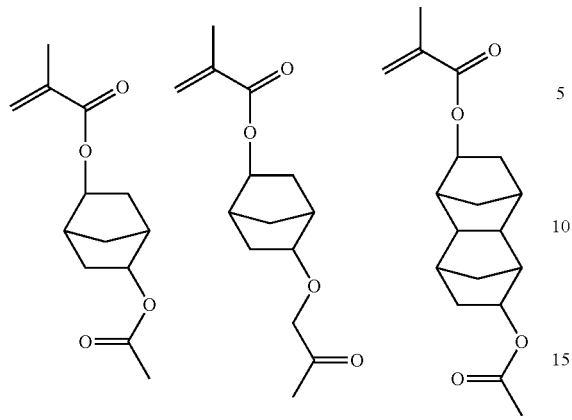
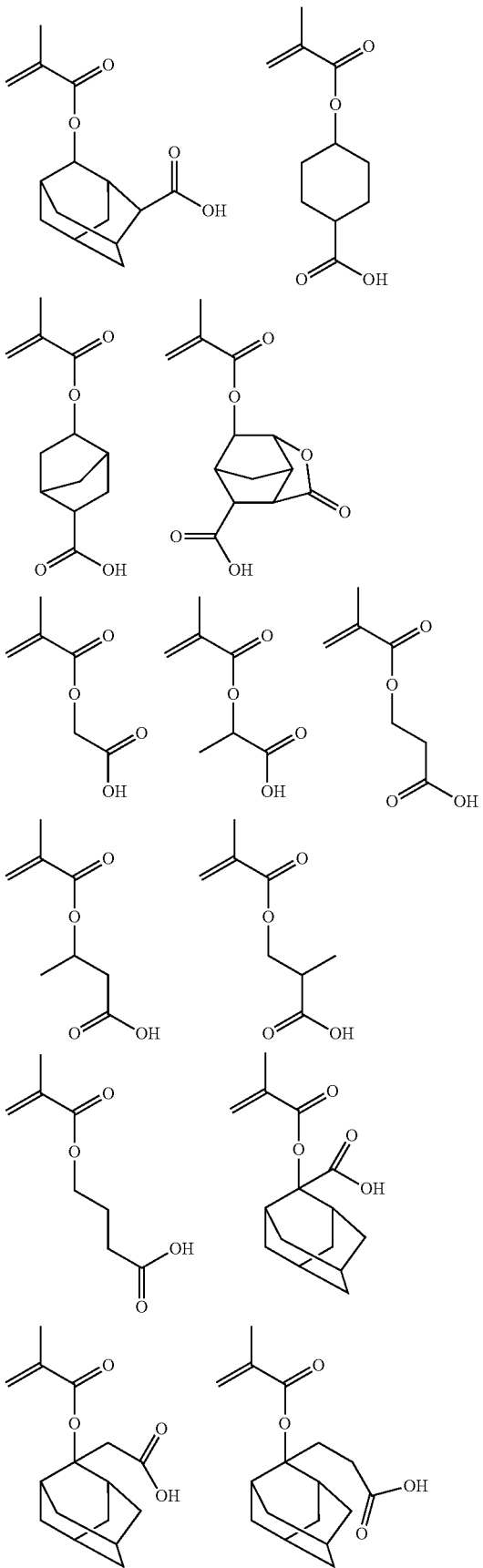

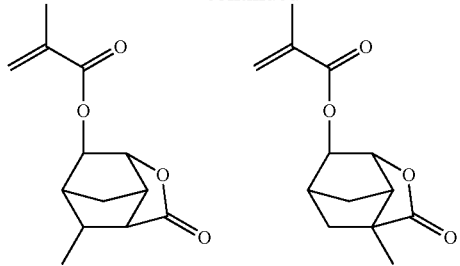
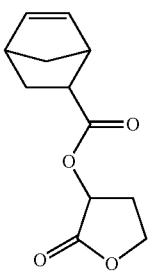
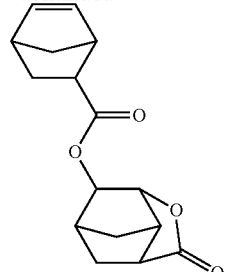
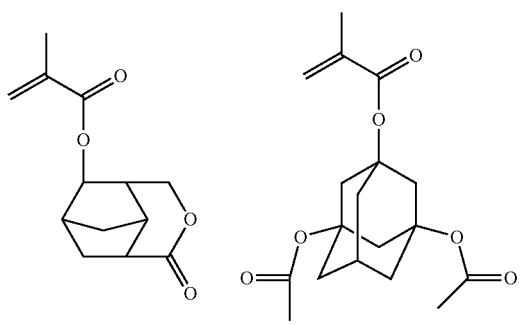
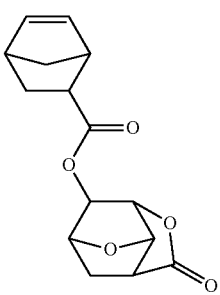
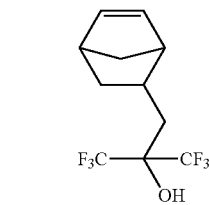
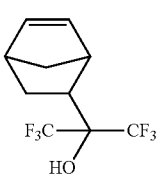
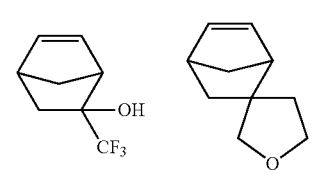
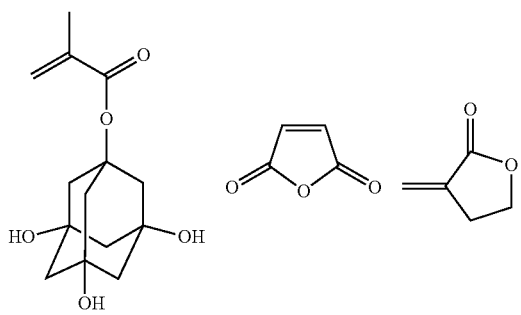
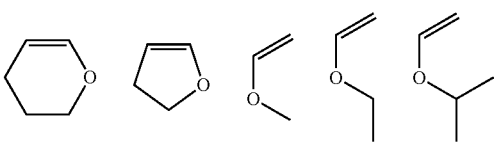
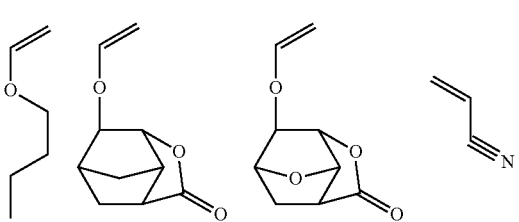
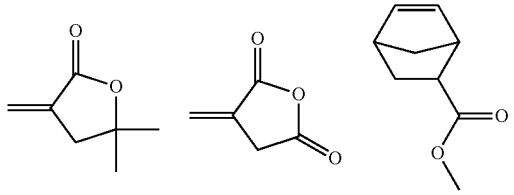
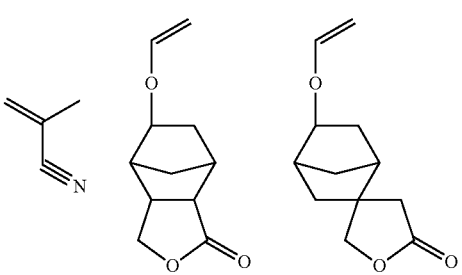
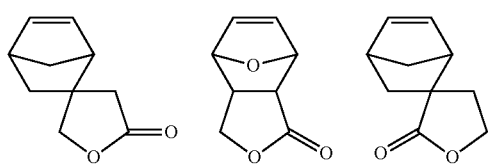
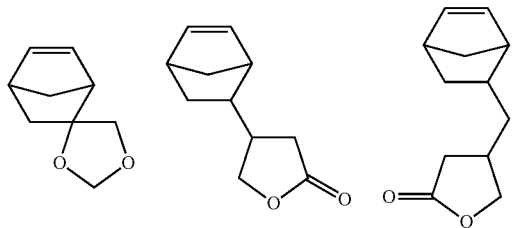
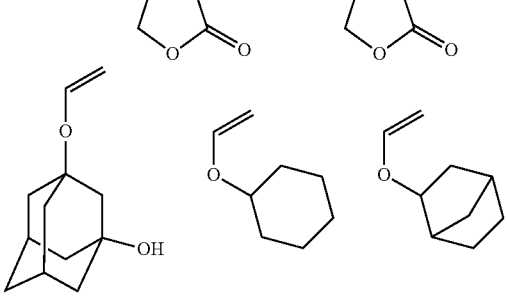

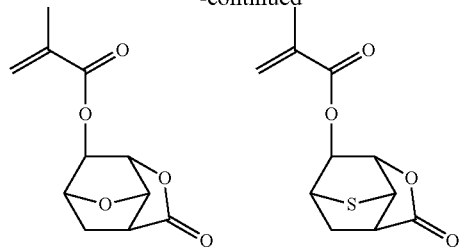
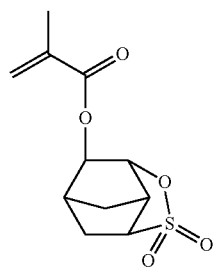
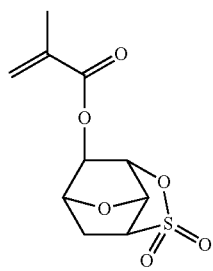
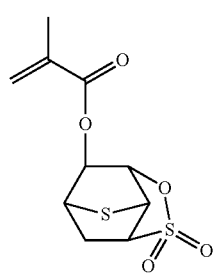
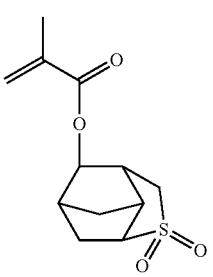
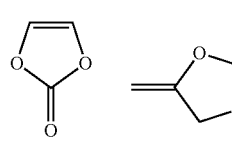
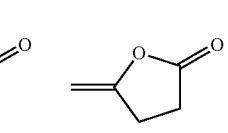
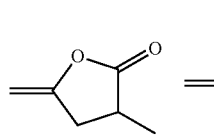
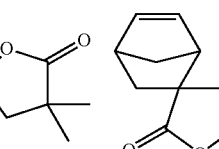
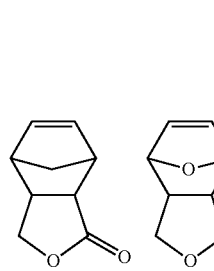
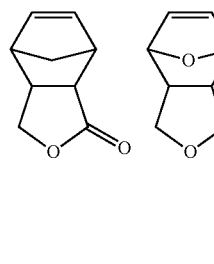
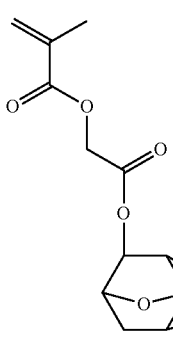
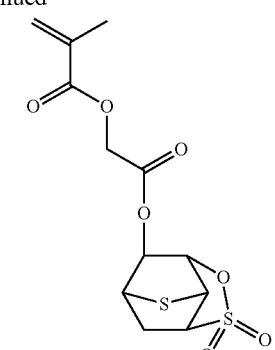
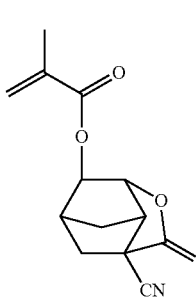
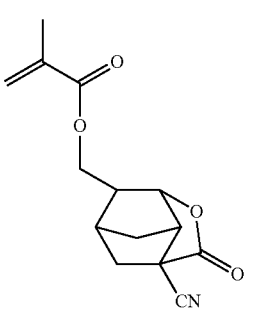
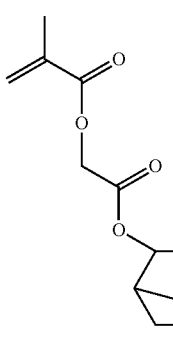
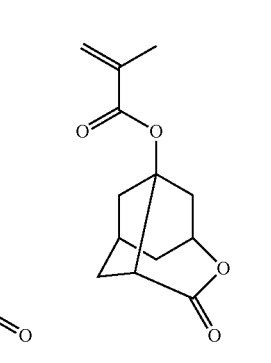
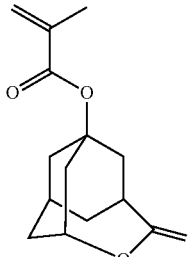
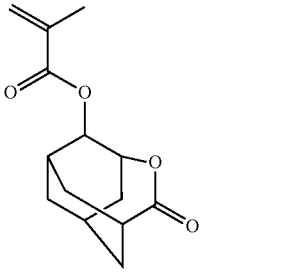
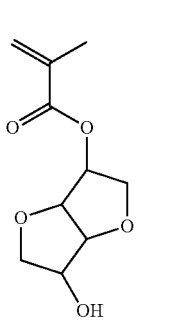
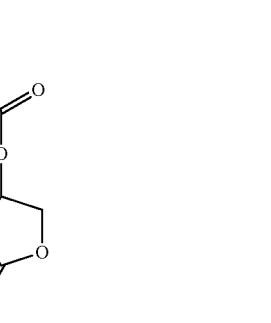

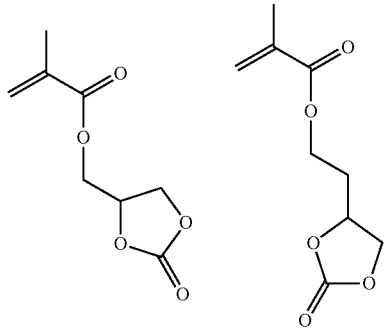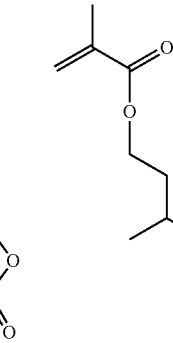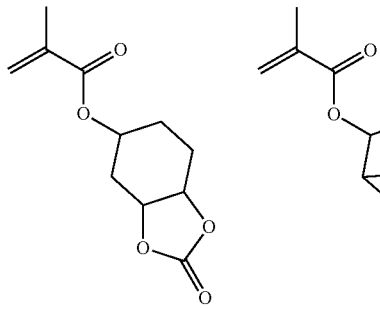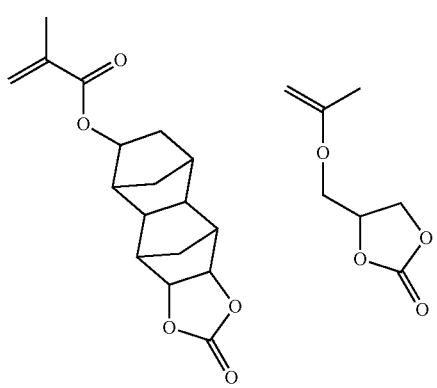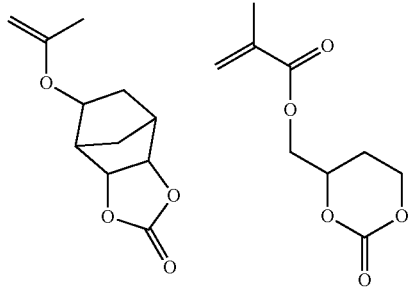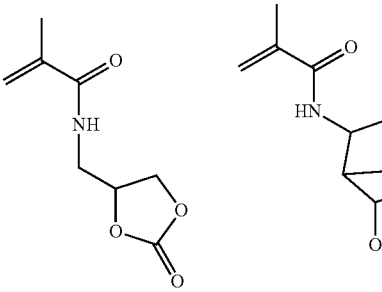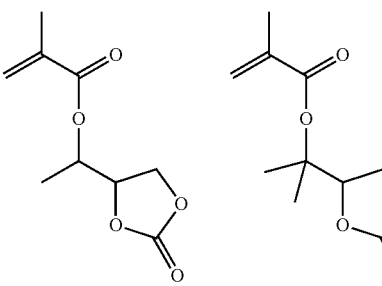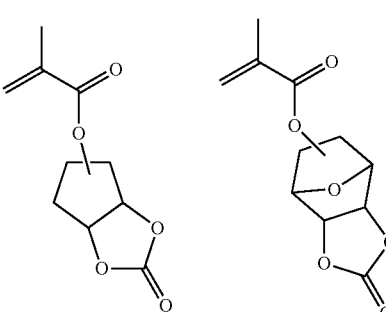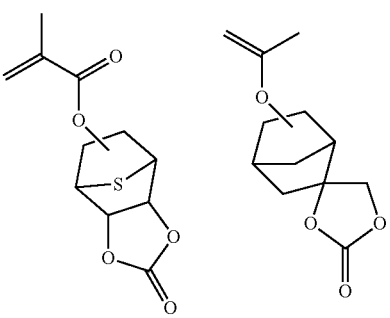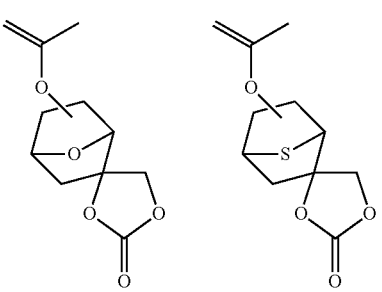

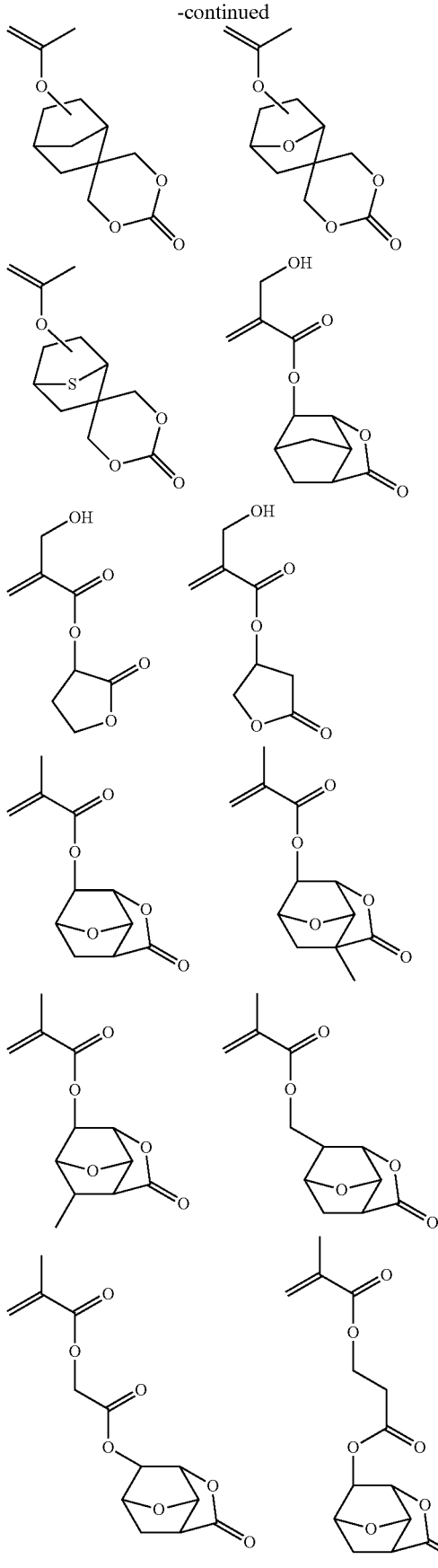
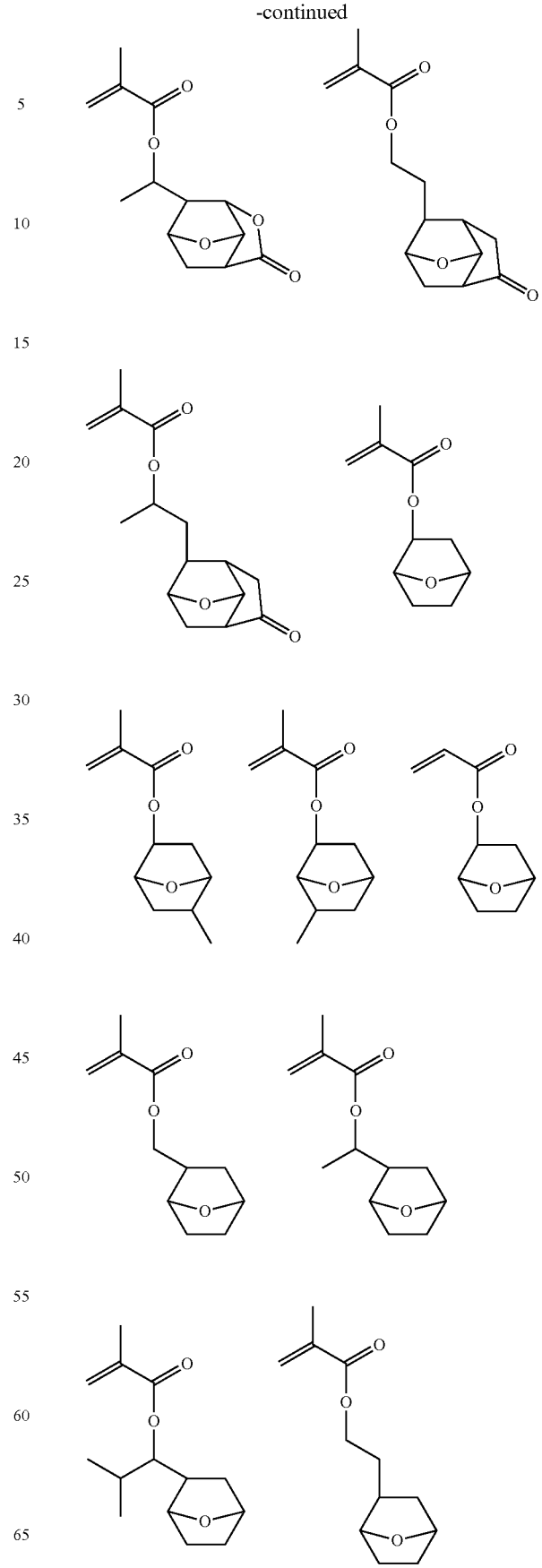

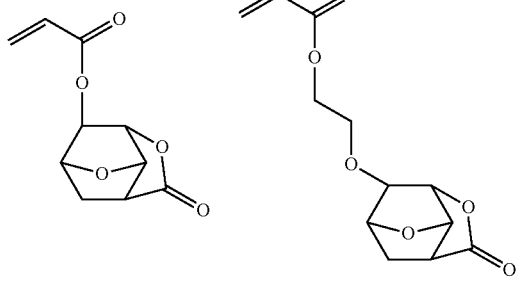
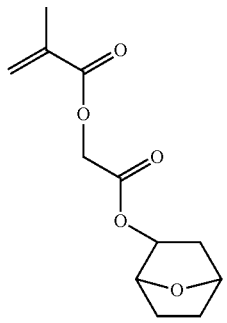
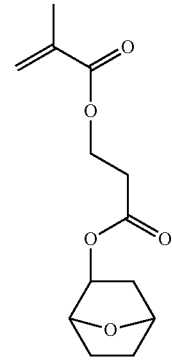
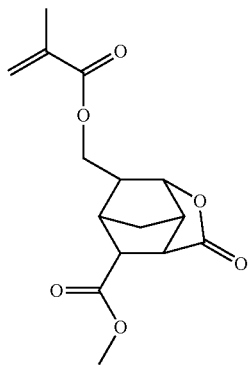
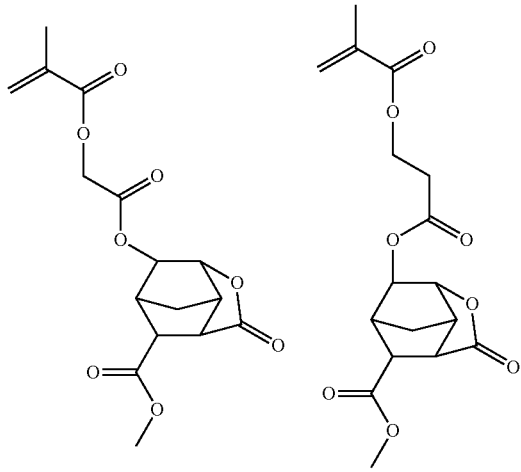
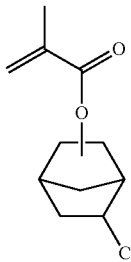
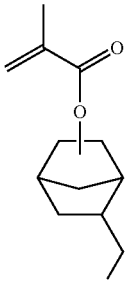
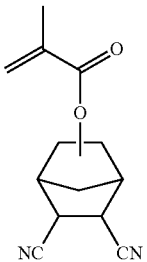
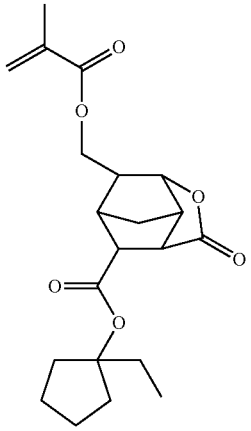
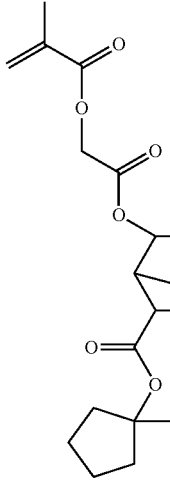
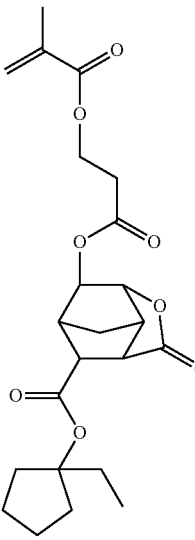
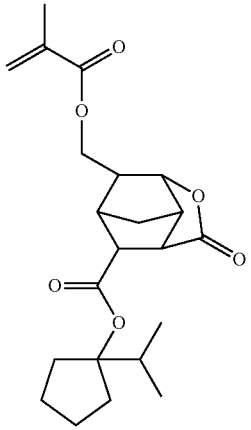

67
-continued
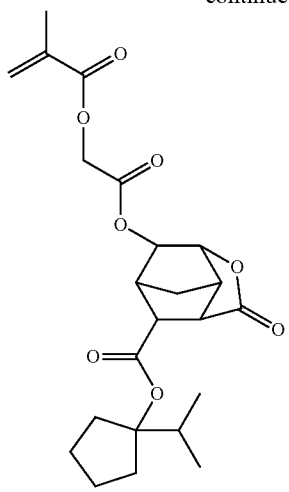
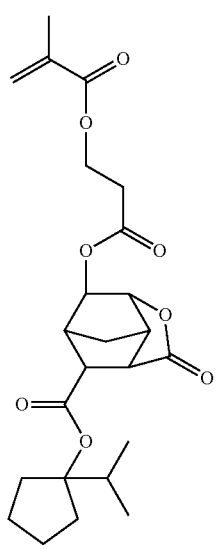
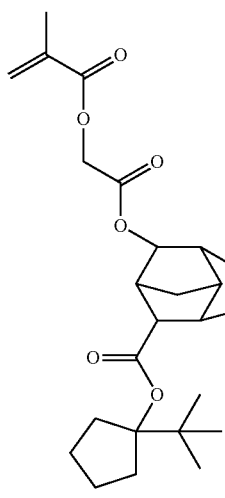
68
-continued
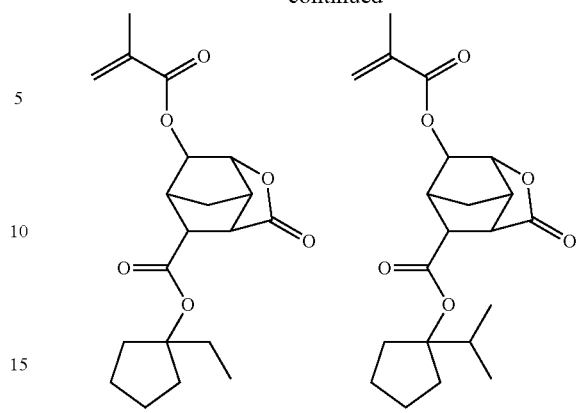
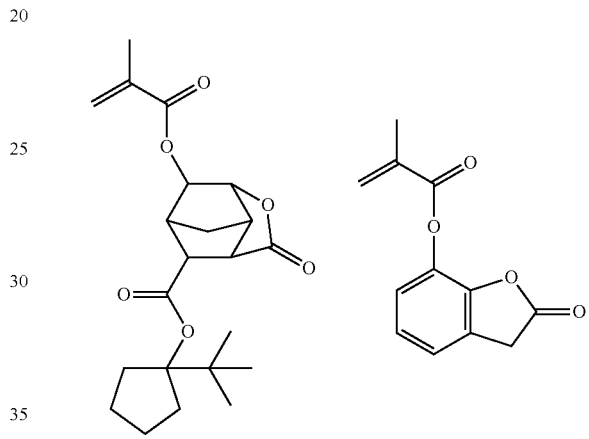
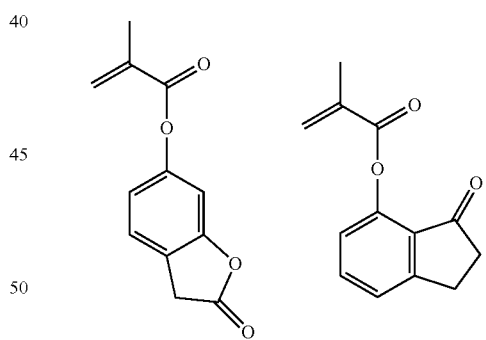
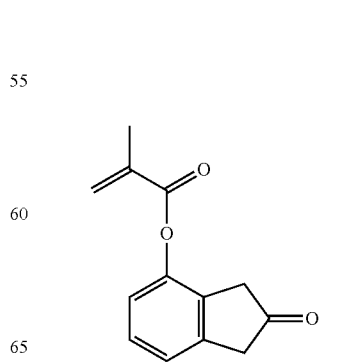

69
-continued
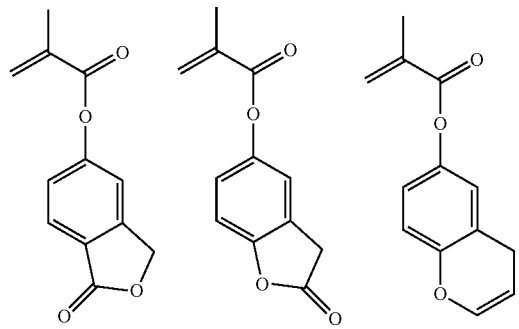
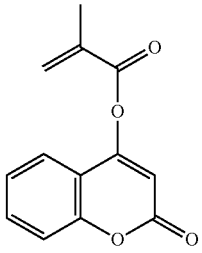
70
-continued
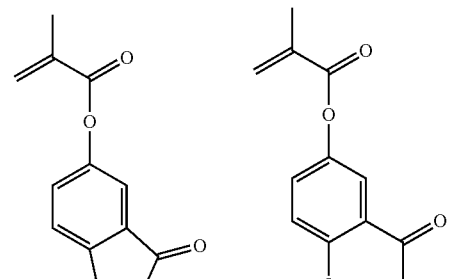
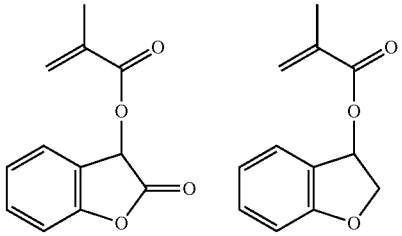
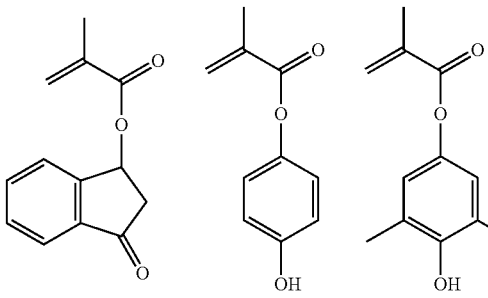
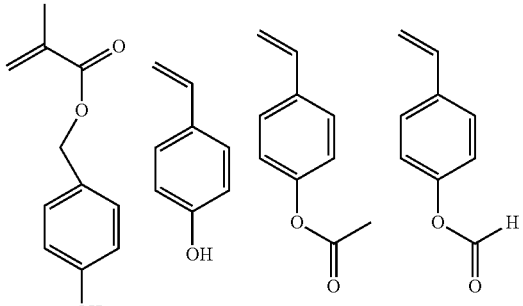
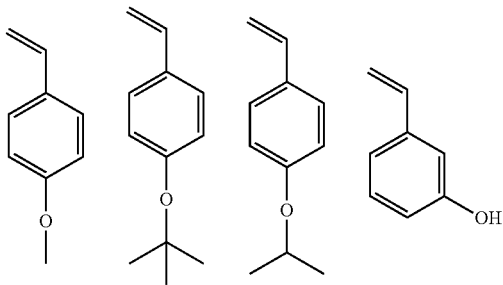

71
-continued
72
-continued
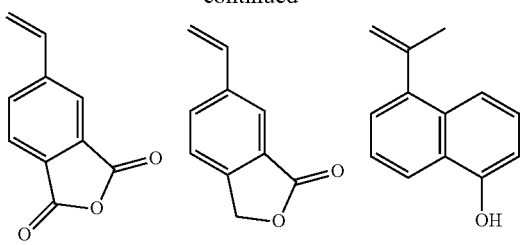
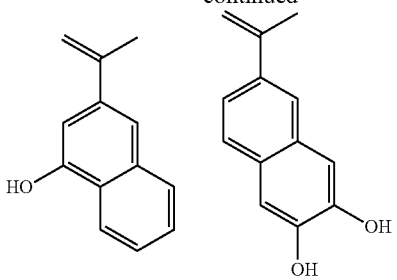
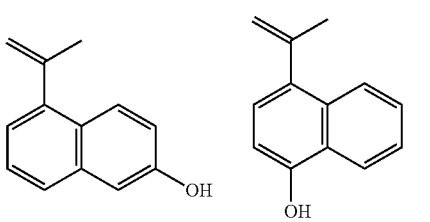
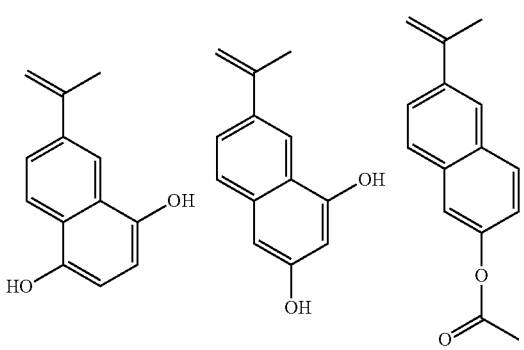
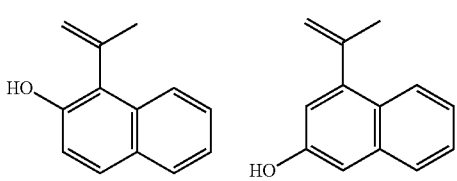
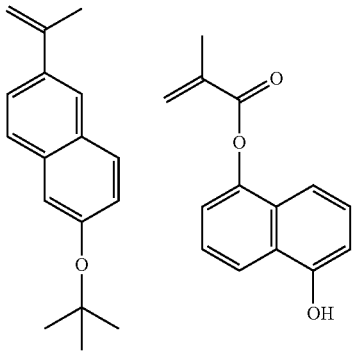
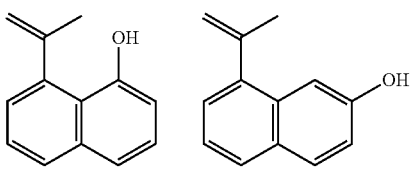
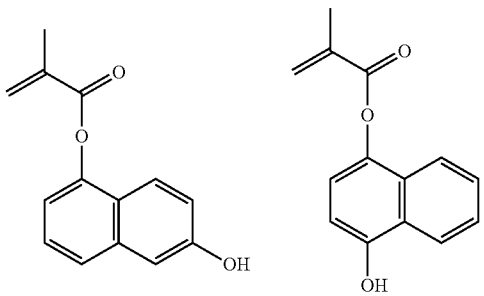
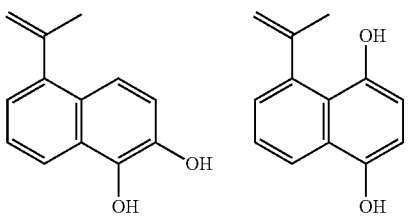
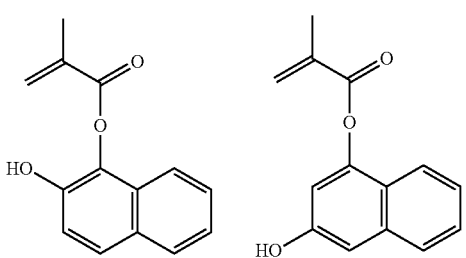
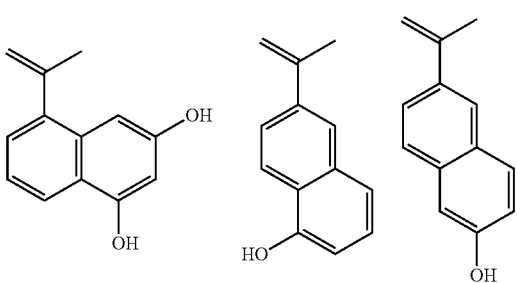
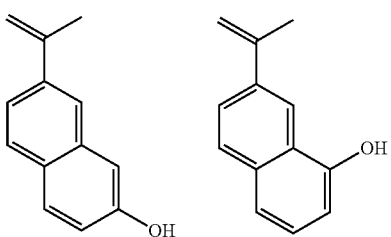

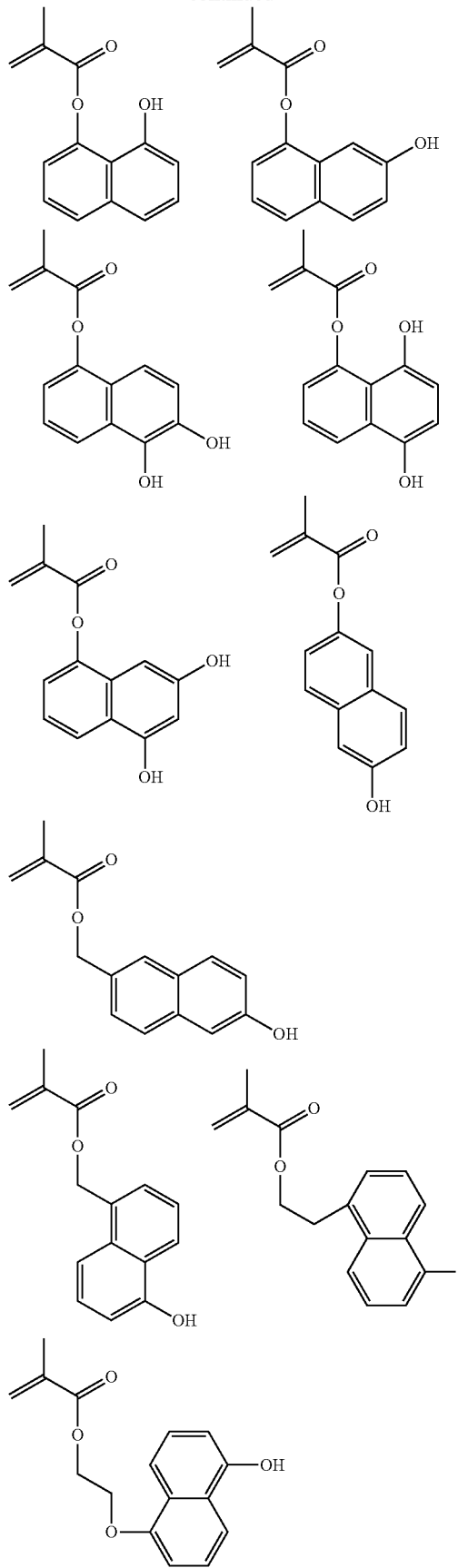
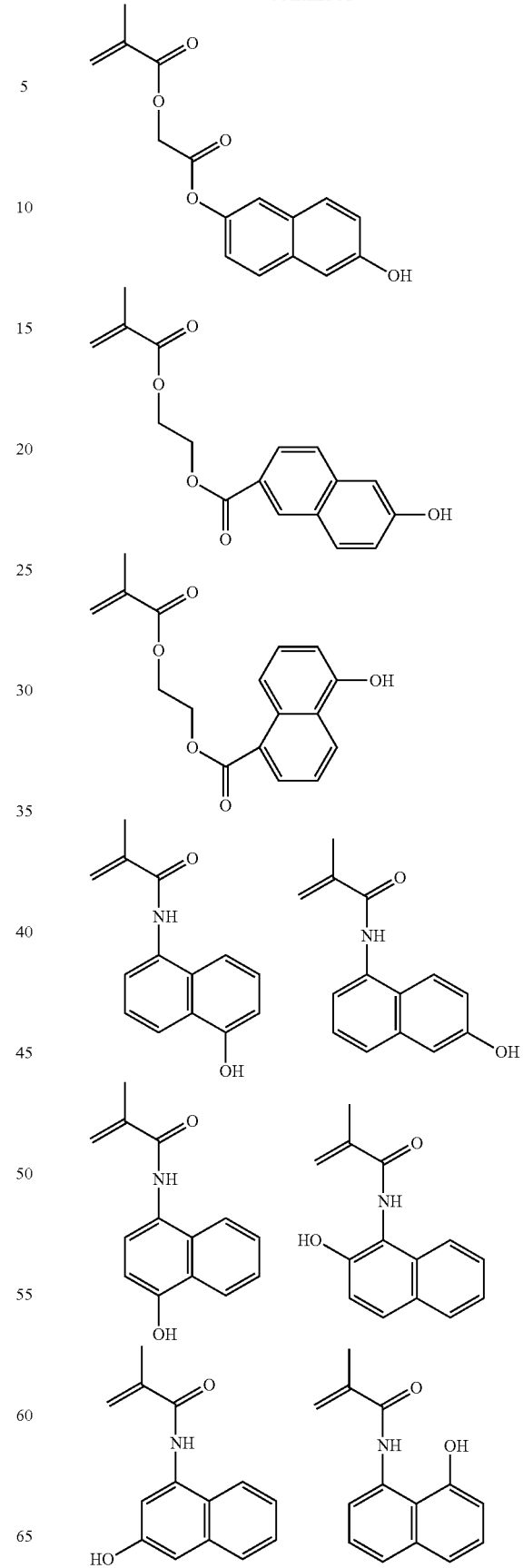

75
-continued
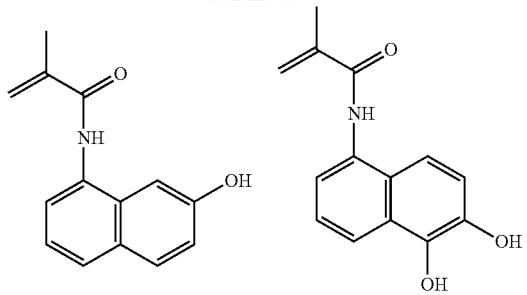
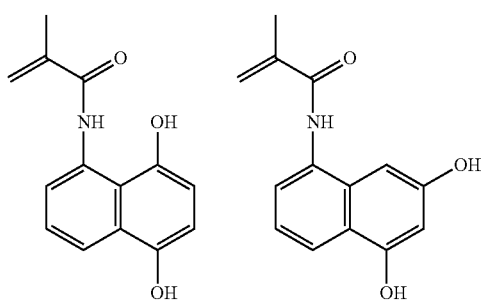
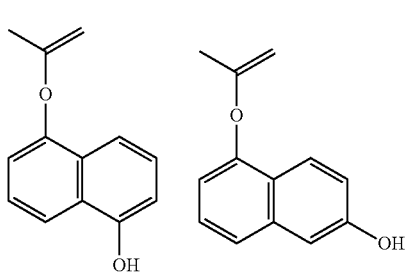
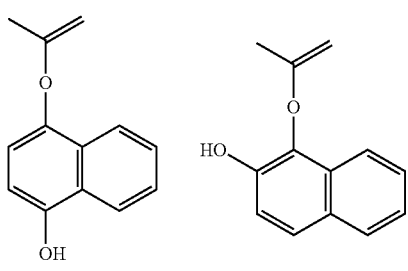
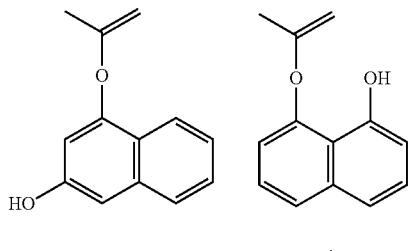
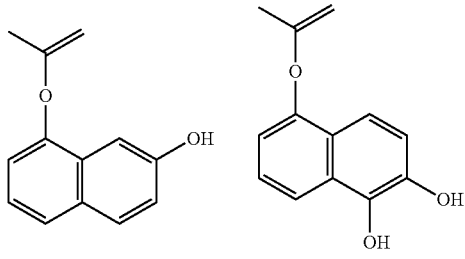
76
-continued
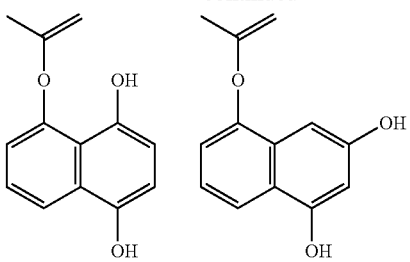
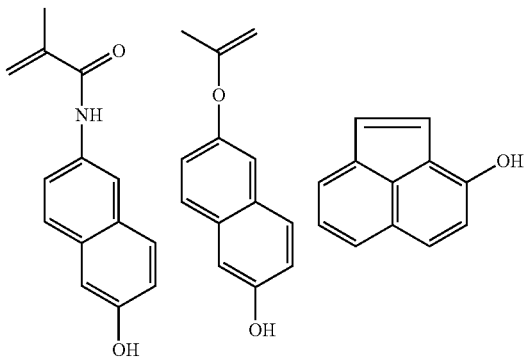
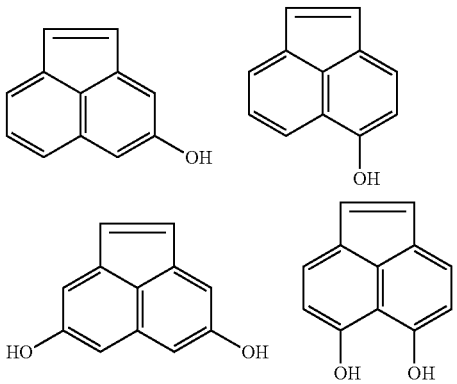
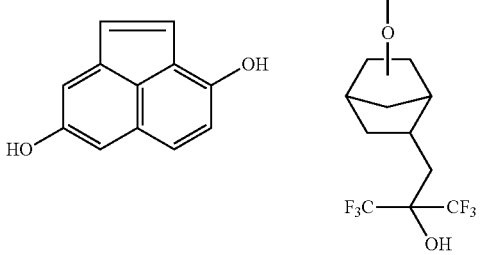
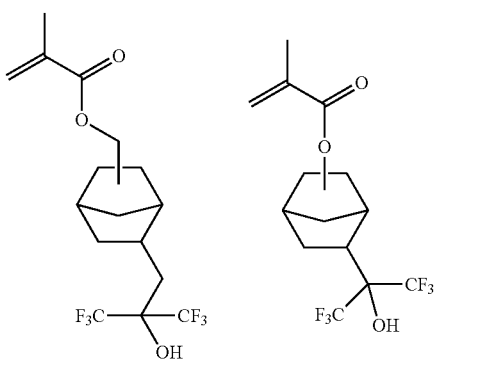

77
-continued
78
-continued
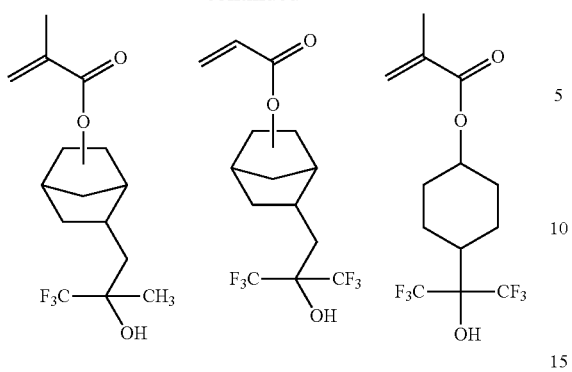
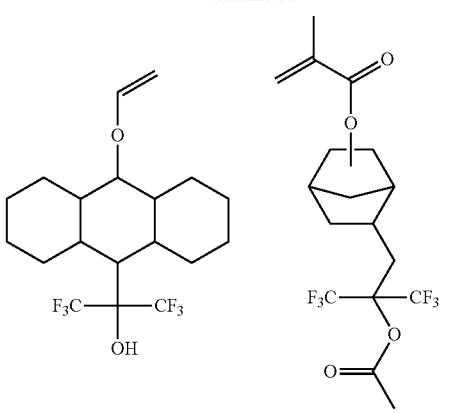
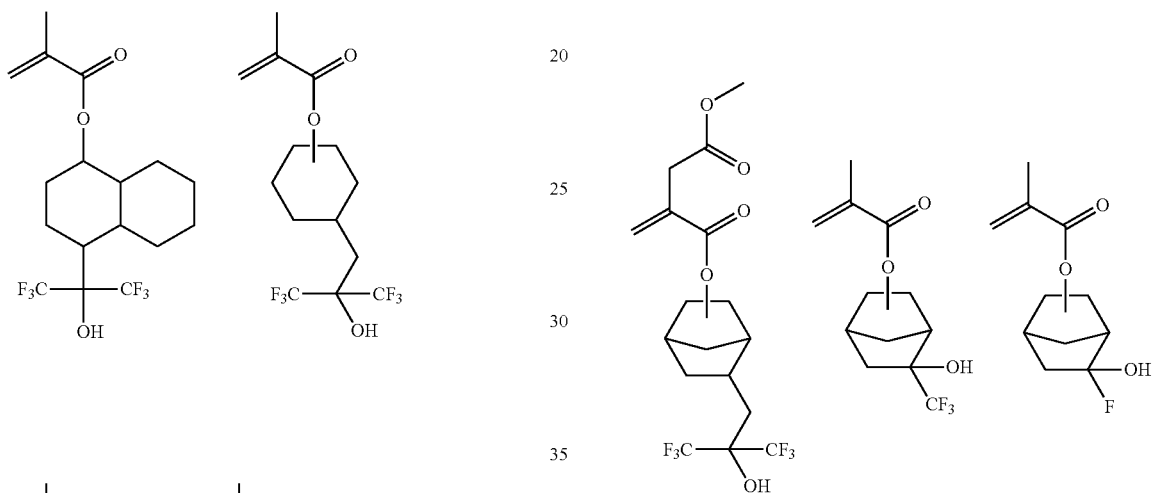
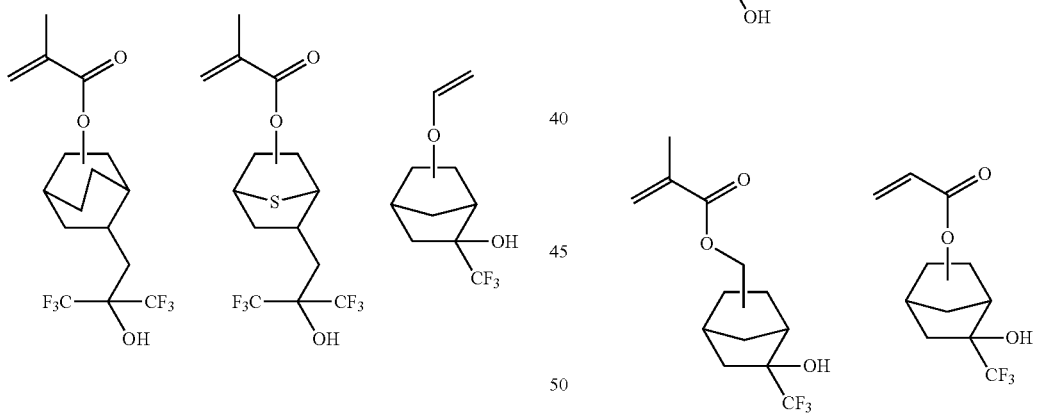
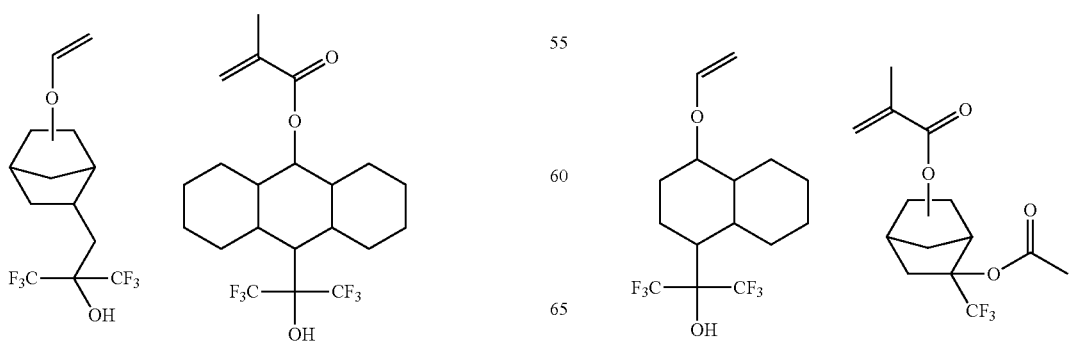

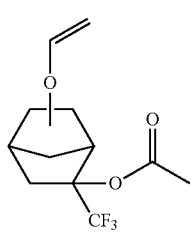
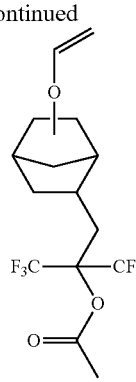
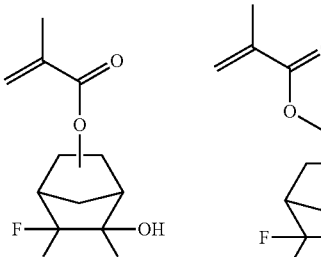
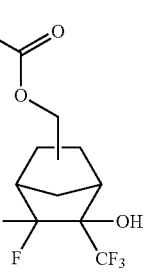
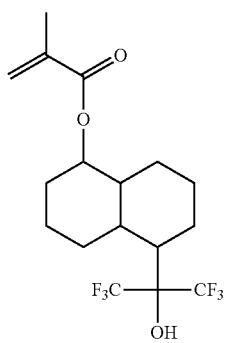
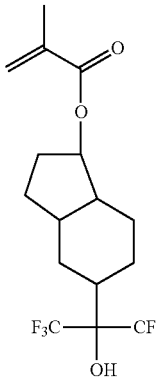
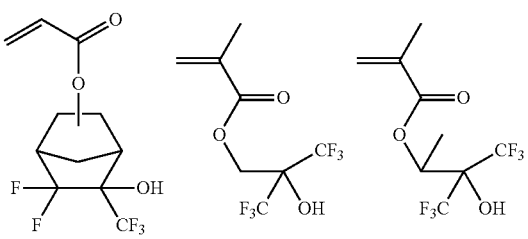
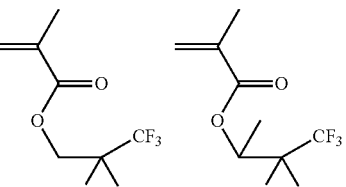
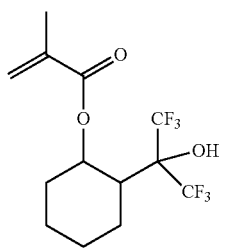
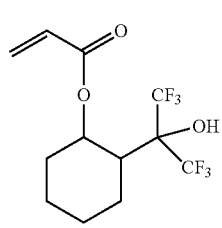
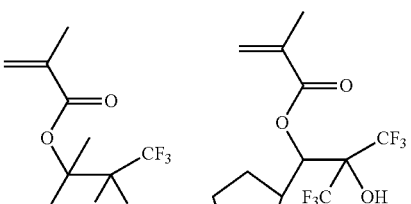
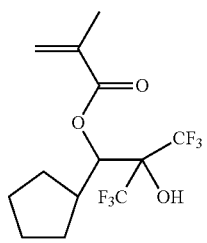
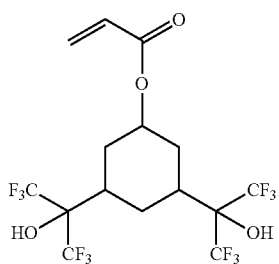
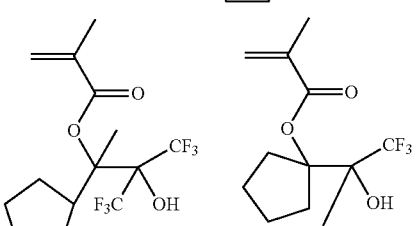
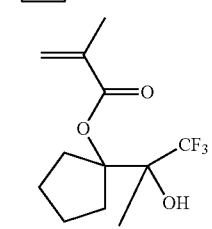
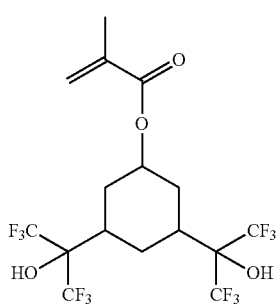
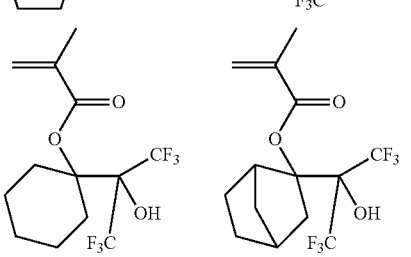
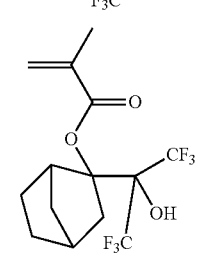
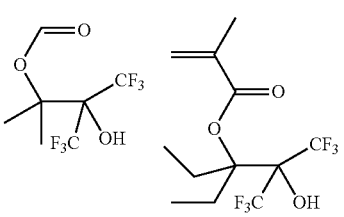
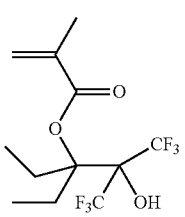
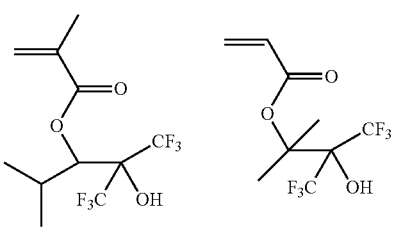
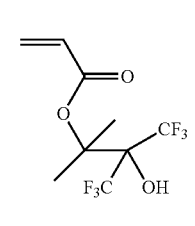

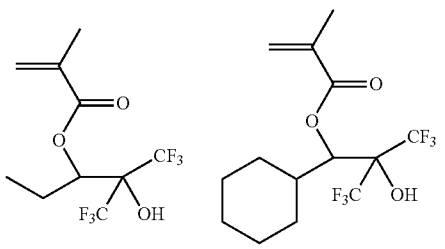
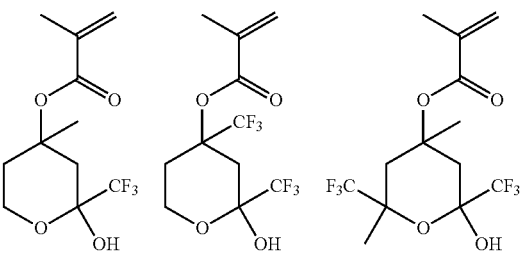
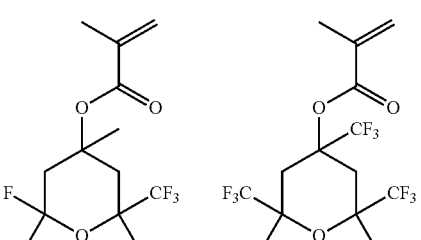
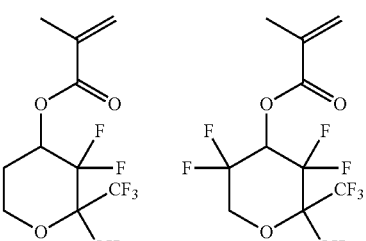
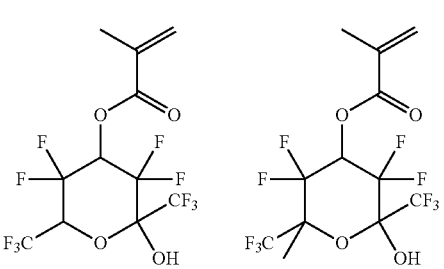
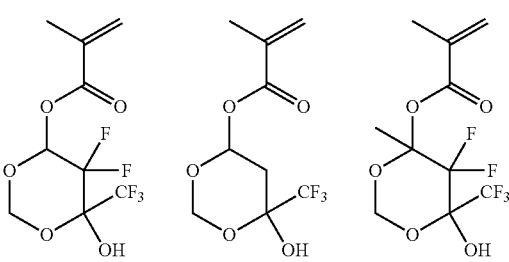
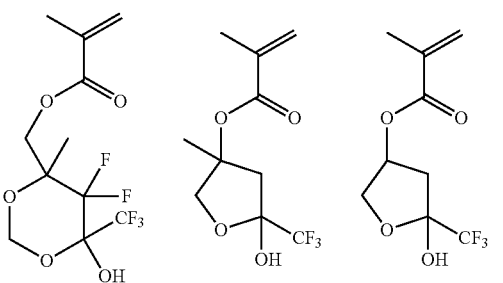

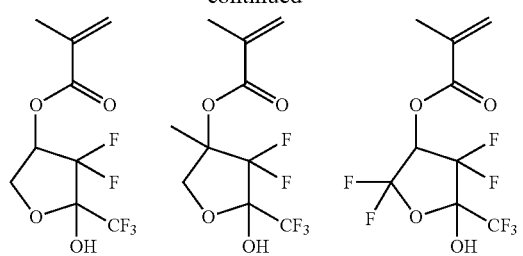
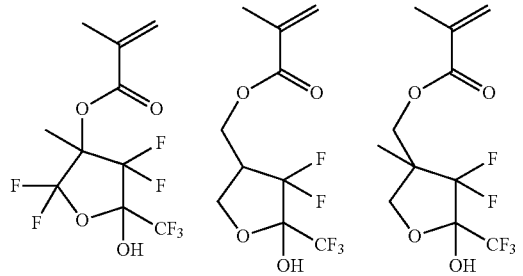
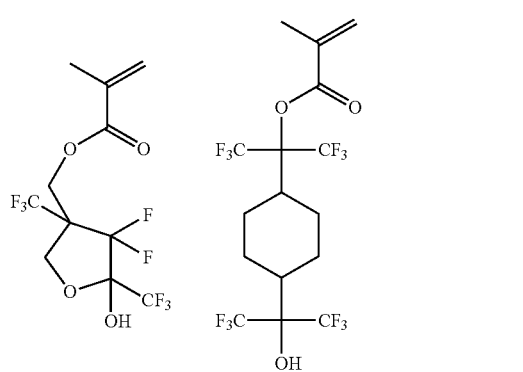
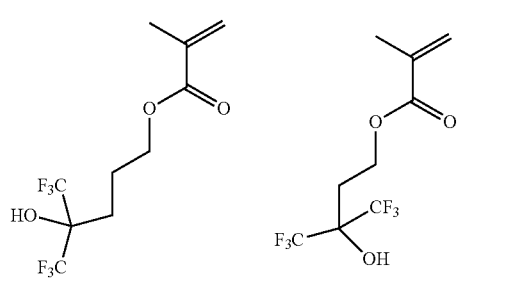
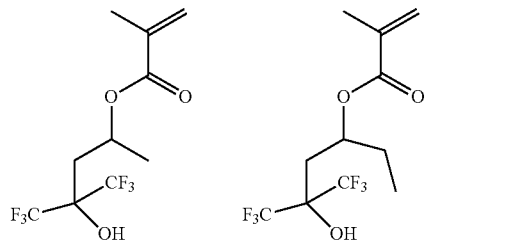
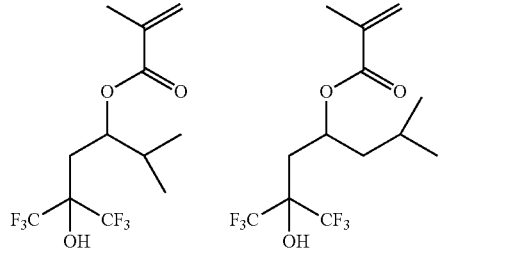
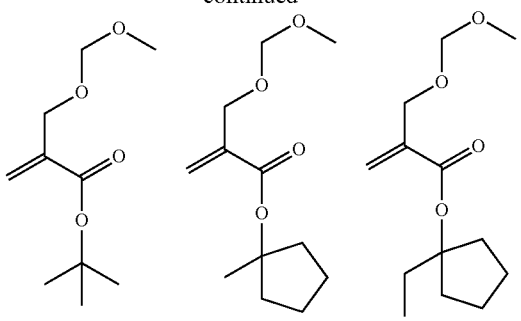
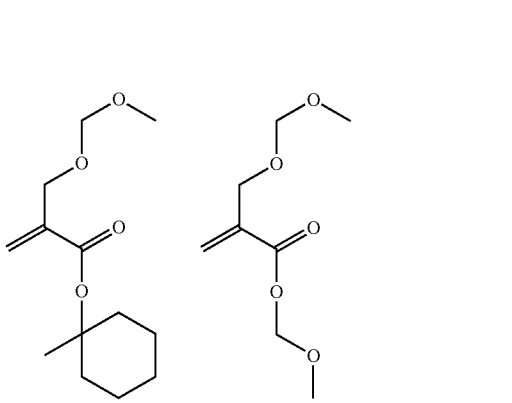
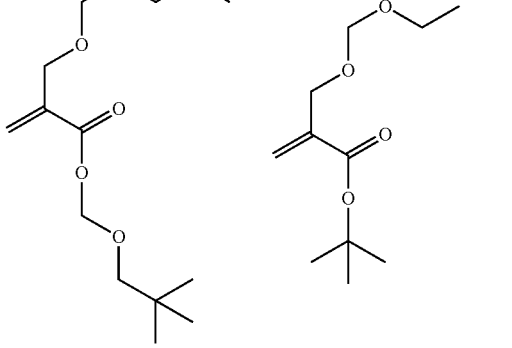
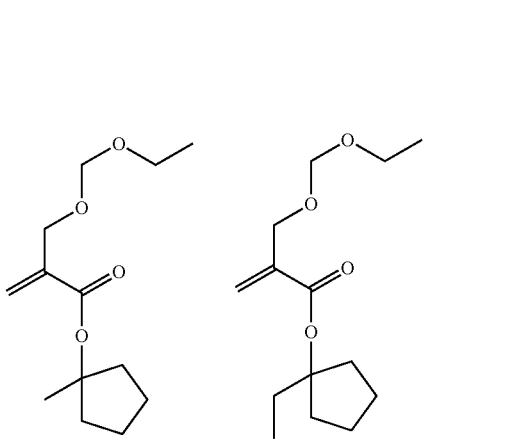

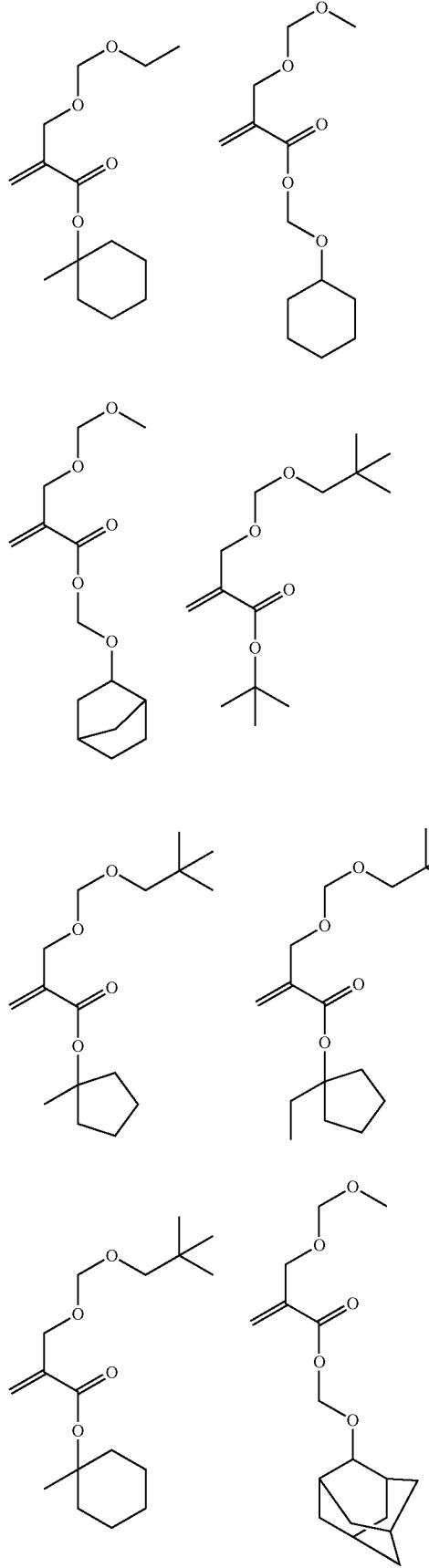
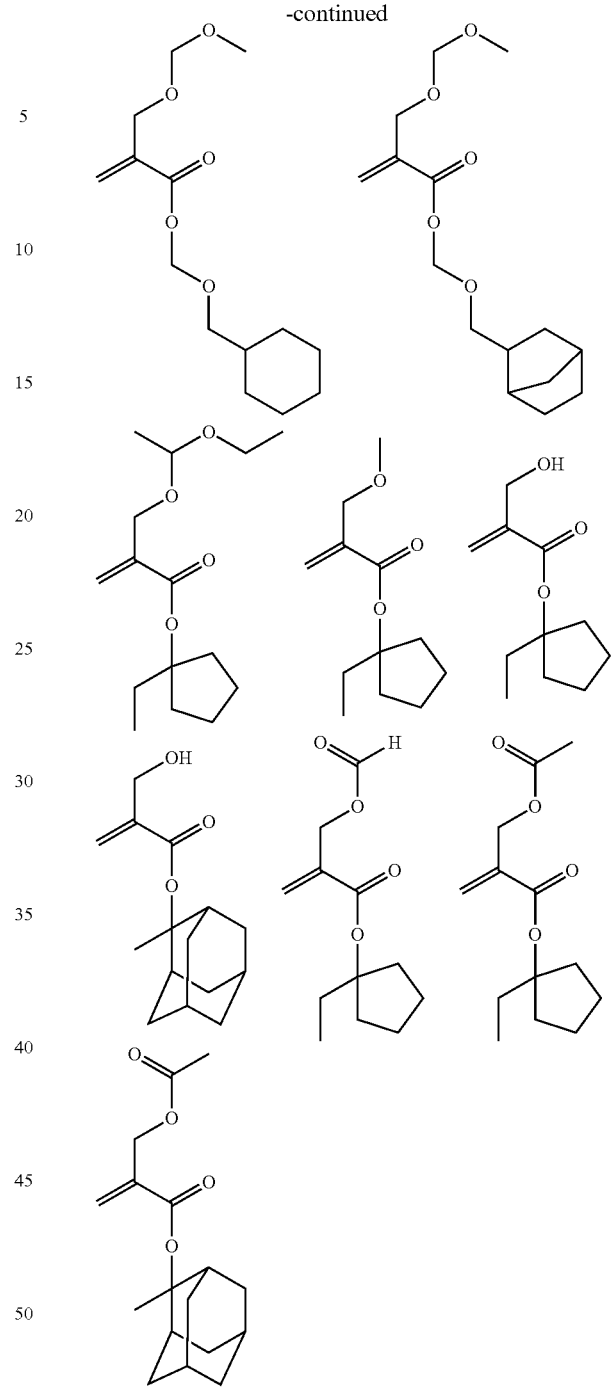
In a preferred embodiment, the polymer has further copolymerized therein units selected from sulfonium salts (d1) to (d3) represented by the general formulae below.
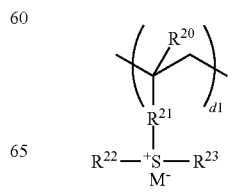
(d1)

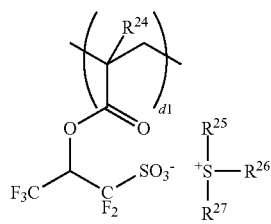

(d2)

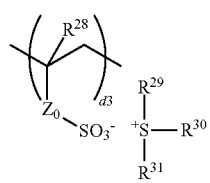

(d3)

Herein R[20], R[24] and R[28] each are hydrogen or methyl. R[21] is a single bond, phenylene, —O—R[33]—, or —C(=O)—Y—R[33]— wherein Y is oxygen or NH, and R[33] is a straight, branched or cyclic $C_1$-$C_6$ alkylene group, alkenylene group or phenylene group, which may contain a carbonyl (—CO—), ester (—COO—), ether (—O—) or hydroxyl radical. R[22], R[23], R[25], R[26], R[27], R[29], R[30], and R[31] are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group. $Z_0$ is a single bond, methylene, ethylene, phenylene, fluorophenylene, —O—R[32]—, or —C(=O)—$Z_1$—R[32]— wherein $Z_1$ is oxygen or NH, and R[32] is a straight, branched or cyclic $C_1$-$C_6$ alkylene group, alkenylene group or phenylene group, which may contain a carbonyl, ester, ether or hydroxyl radical. M⁻ is a non-nucleophilic counter ion. The subscripts d1, d2 and d3 are in the range: 0≤d1≤0.3, 0≤d2≤0.3, 0≤d3≤0.3, and 0≤d1+d2+d3≤0.3.

Besides the recurring units described above, the polymer may have further copolymerized therein additional recurring units, for example, recurring units (e) having a non-leaving hydrocarbon group as described in JP-A 2008-281980. Examples of the non-leaving hydrocarbon group other than those described in JP-A 2008-281980 include indene, acenaphthylene, and norbornadiene derivatives. Copolymerization of recurring units (e) having a non-leaving hydrocarbon group is effective for improving the dissolution of the polymer in organic solvent-based developer.

It is also possible to incorporate recurring units (f) having an oxirane or oxetane ring into the polymer. Where recurring units (f) having an oxirane or oxetane ring are copolymerized in the polymer, the exposed region of resist film will be crosslinked, leading to improvements in film retention of the exposed region and etch resistance. Examples of the recurring units (f) having an oxirane or oxetane ring are given below wherein R18 is hydrogen or methyl.

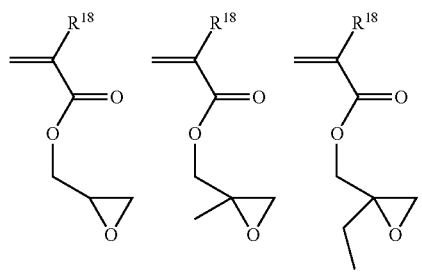

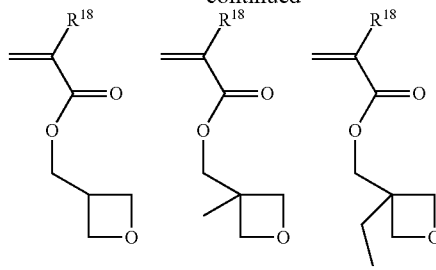

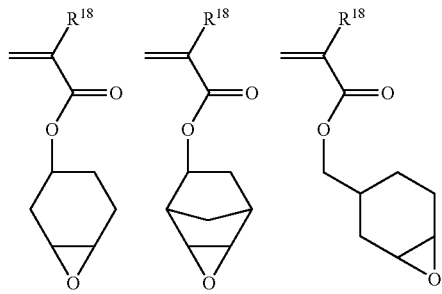

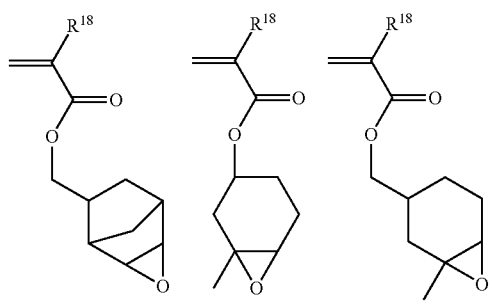

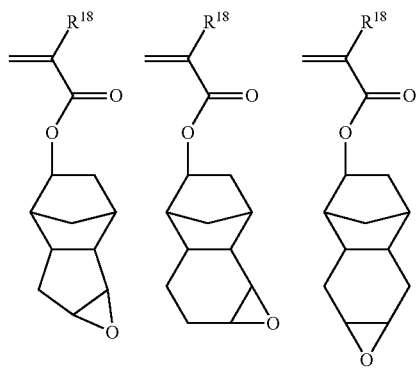

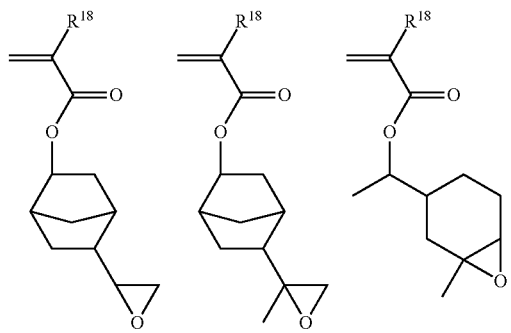

89
-continued
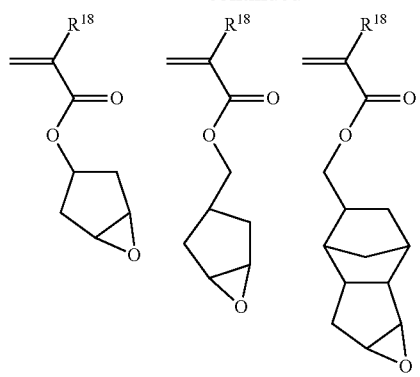
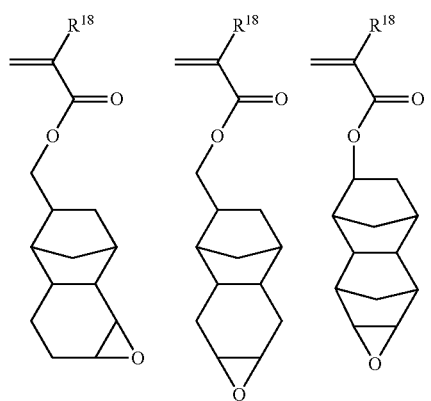
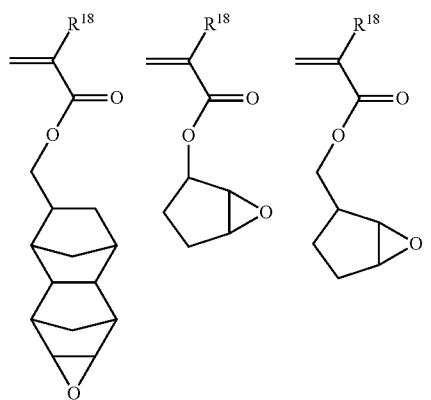
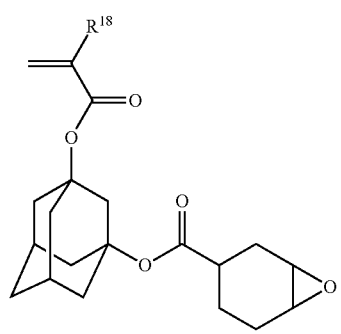
90
-continued
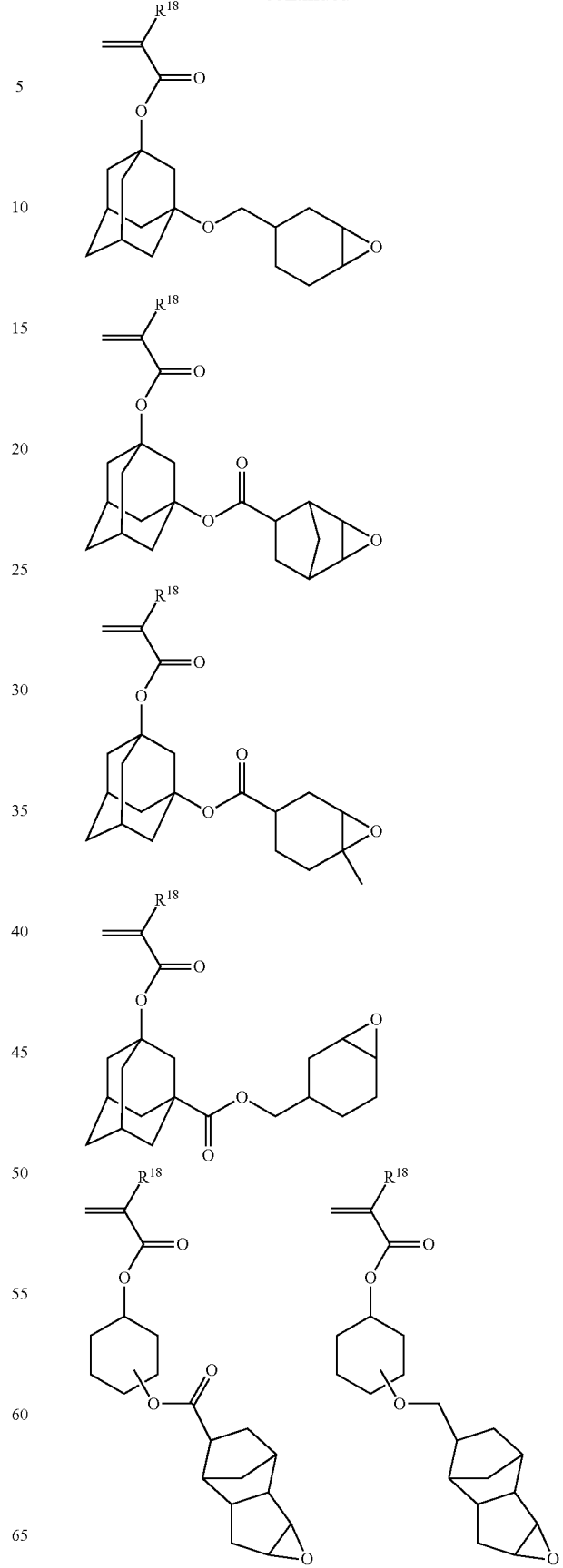

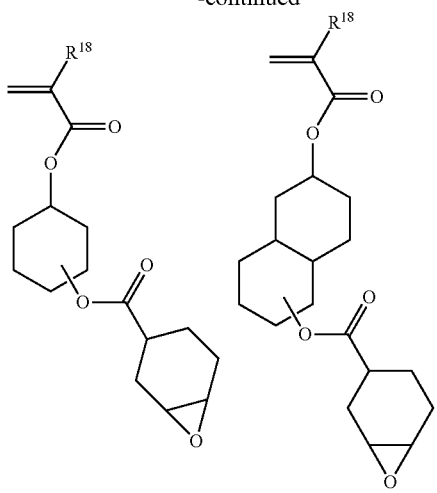
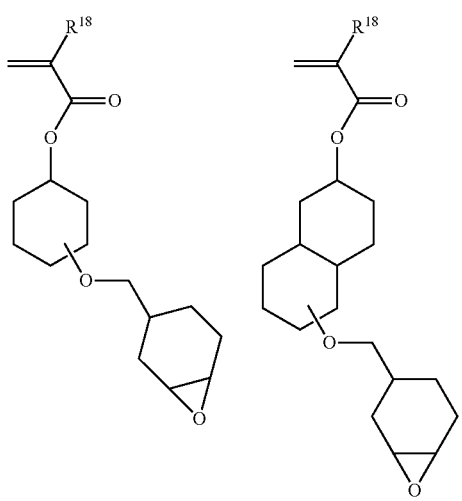
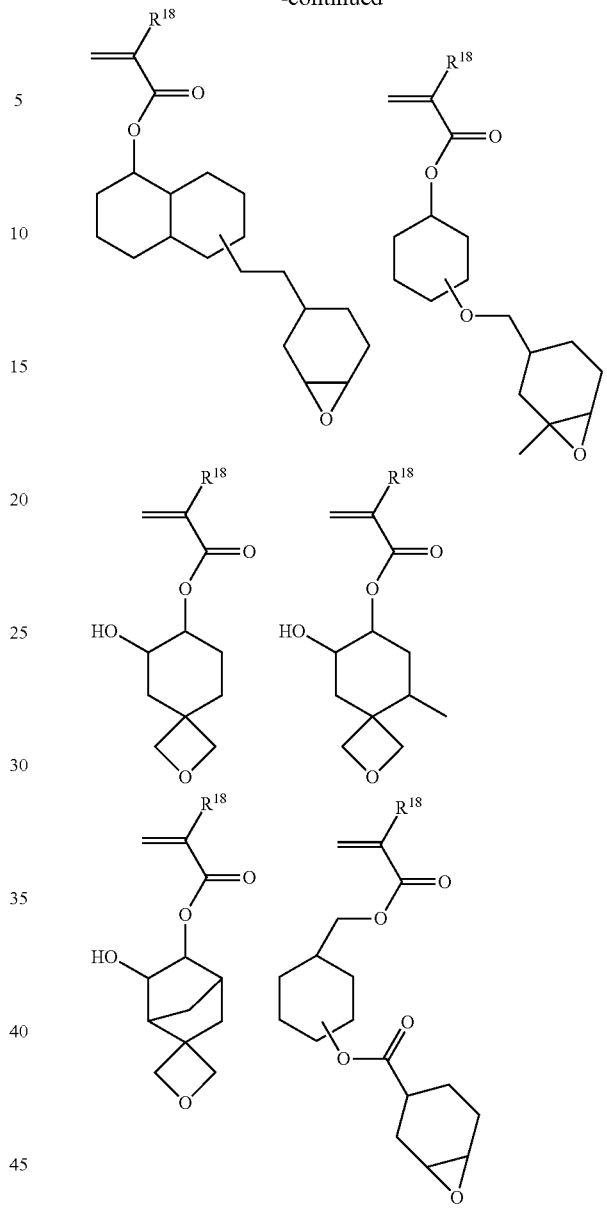

The subscripts a1, a2, a3, a4, b, c, d1, d2, d3, e, and f indicative of proportions of corresponding recurring units are in the range: $0 \le a1 < 1.0$, $0 \le a2 < 1.0$, $0 \le a3 < 1.0$, $0 \le a4 < 1.0$, $0 < a1+a2+a3+a4 < 1.0$, $0 \le b < 1.0$, $0 \le c < 1.0$, $0 \le d1 \le 0.3$, $0 \le d2 \le 0.3$, $0 \le d3 \le 0.3$, $0 \le d1+d2+d3 \le 0.3$, $0 \le e < 0.4$, and $0 \le f < 0.6$;

preferably $0 \le a1 \le 0.9$, $0 \le a2 \le 0.9$, $0 \le a3 \le 0.9$, $0 \le a4 \le 0.9$, $0.1 \le a1+a2+a3+a4 \le 0.9$, $0 \le b \le 0.9$, $0.1 \le c \le 0.9$, $0 \le d1 \le 0.2$, $0 \le d2 \le 0.2$, $0 \le d3 \le 0.2$, $0 \le d1+d2+d3 < 0.2$, $0 \le e \le 0.3$, and $0 \le f \le 0.5$, provided that $a1+a2+a3+a4+b+c+d1+d2+d3+e+f=1$.

The polymer serving as the base resin in the resist composition used in the pattern forming process of the invention should preferably have a weight average molecular weight (Mw) in the range of 1,000 to 500,000, and more preferably 2,000 to 30,000, as measured by GPC versus polystyrene standards using tetrahydrofuran solvent. With too low a Mw, a film thickness loss is likely to occur upon organic solvent development. A polymer with too high a Mw may lose solubility in organic solvent and have a likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

The polymer used herein may be synthesized by any desired method, for example, by dissolving unsaturated bond-containing monomers corresponding to the respective units (a1), (a2), (a3), (a4), (b), (c), (d1), (d2), (d3), (e), and (f) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the product may be protected or partially protected after polymerization.

It is acceptable to use a blend of two or more polymers which differ in compositional ratio, molecular weight or dispersity as well as a blend of an inventive polymer and another polymer free of an acid labile group-substituted hydroxyl group or a blend of an inventive polymer and a polymer comprising recurring units having an acid labile group-substituted hydroxyl or carboxyl group, for example, a polymer comprising recurring units (b) and/or (c).

In a further embodiment, the inventive polymer may be blended with a polymer of the conventional type wherein the exposed region is dissolved on alkaline development such as (meth)acrylate polymer, polynorbornene, cycloolefin-maleic anhydride copolymer, or ring-opening metathesis polymerization (ROMP) polymer. Also, the inventive polymer may be blended with a (meth)acrylate polymer having an acid labile group-substituted hydroxyl group wherein the exposed region is not dissolved by alkaline development, but a negative pattern is formed by organic solvent development.

The onium salt of perfluoroalkyl ether carboxylic acid may be a salt (Q1) or (Q2) having the general formula (2).

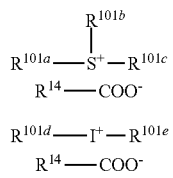

Herein $R^{101a}$, $R^{101b}$ and $R^{101c}$ are each independently a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which some or all hydrogen atoms may be substituted by ether, ester, carbonyl, carbonate, hydroxyl, carboxyl, halogen, cyano, amino, amide, nitro, sultone, sulfonic acid ester, sulfone groups, or substituent groups having sulfonium salt. Alternatively, $R^{101b}$ and $R^{101c}$ may bond together to form a ring with the sulfur atom to which they are attached, $R^{101b}$ and $R^{101c}$ each are a $C_1$-$C_6$ alkylene group when they form a ring. $R^{101d}$ and $R^{101e}$ each are a $C_6$-$C_{20}$ aryl group which may contain a straight, branched or cyclic $C_1$-$C_6$ alkyl or alkoxy radical, or $R^{101d}$ and $R^{101e}$ may bond together to form a ring with the iodine atom to which they are attached. $R^{14}$ is a straight, branched or cyclic $C_2$-$C_{20}$ alkyl or alkenyl group having at least one ether radical and a plurality of fluorine atoms.

Examples of perfluoroalkyl ether carboxylate ion $R^{14}$—COO$^-$, which is the anion moiety in formula (2), are shown below.

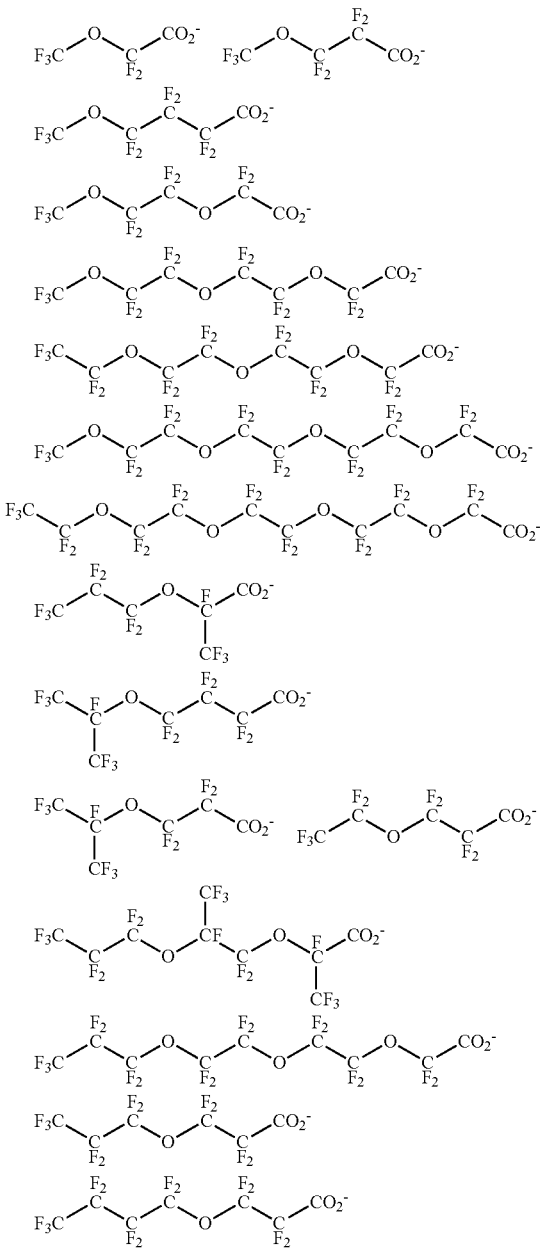

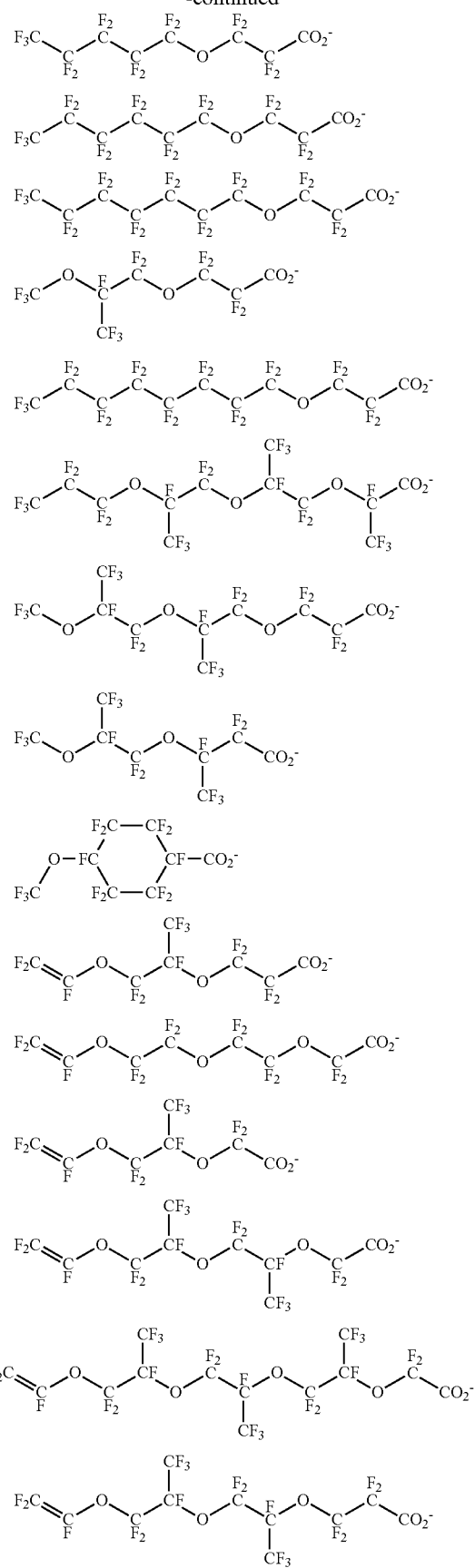
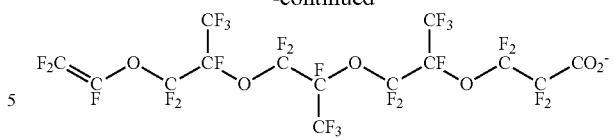
Examples of the cation moiety in formula (2) are shown below.
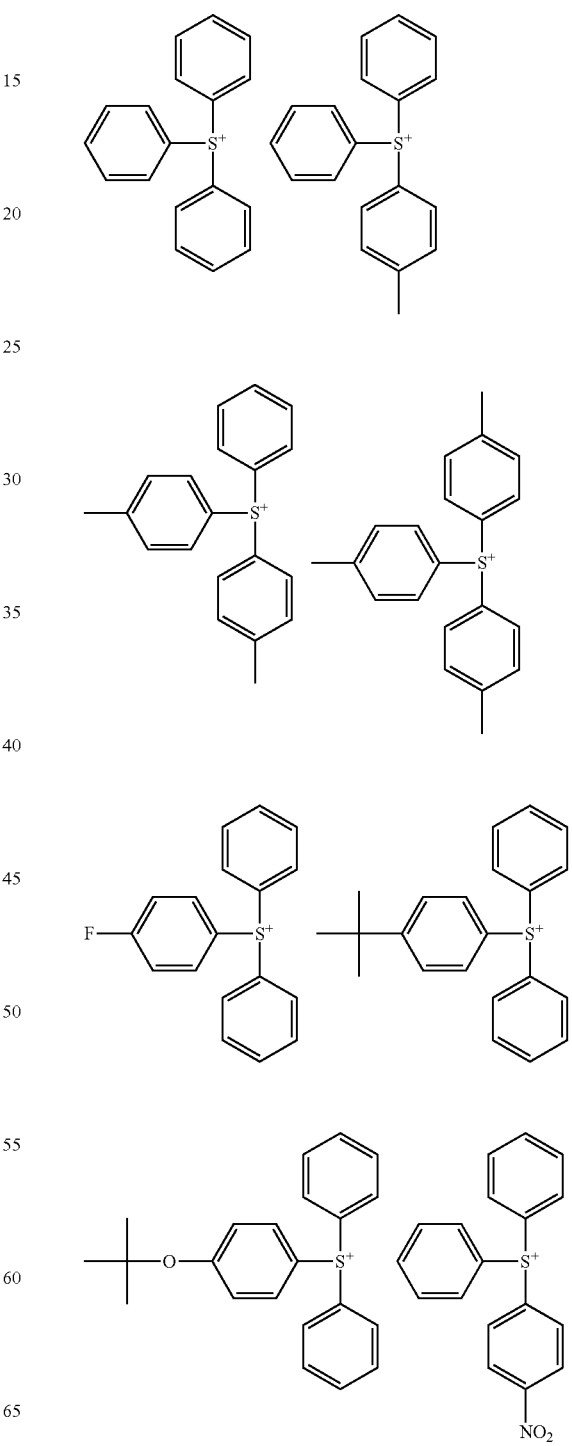

97
-continued
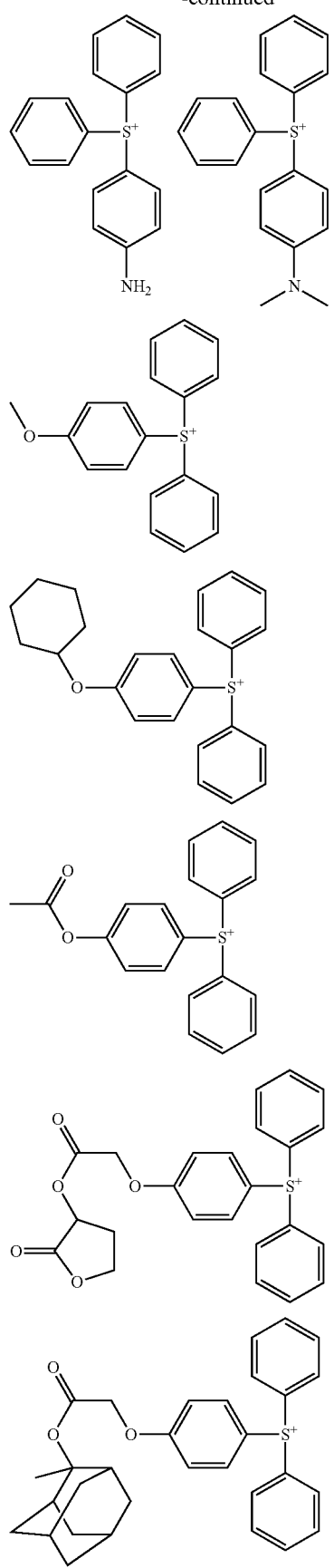
98
-continued
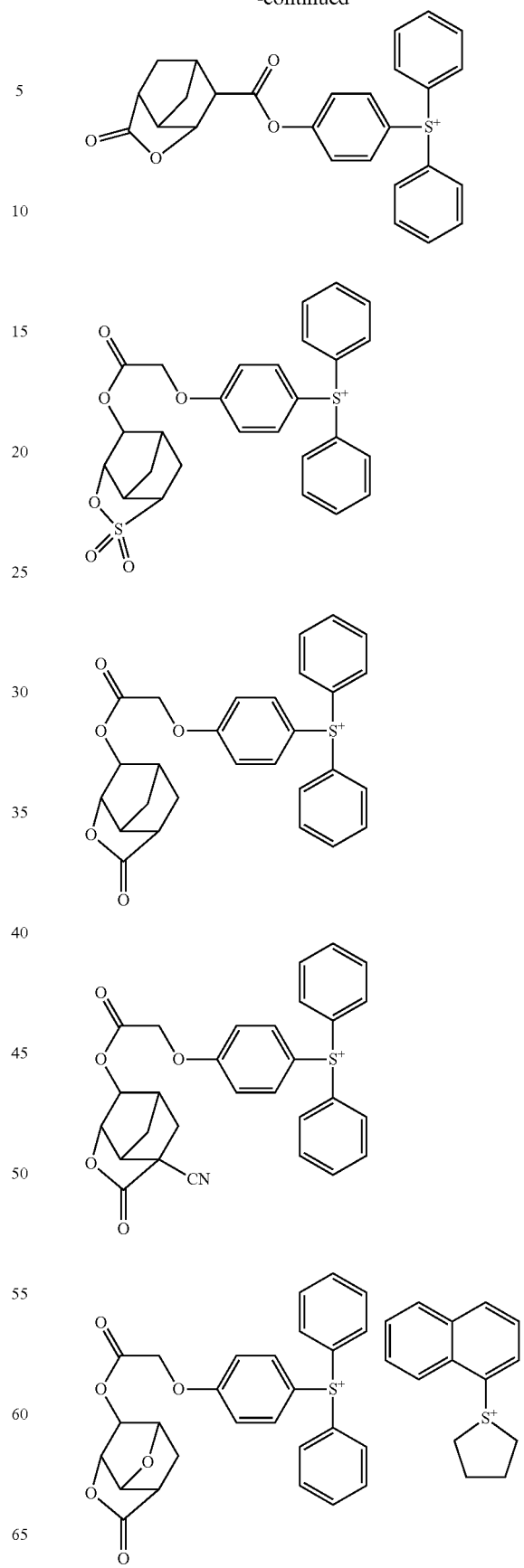

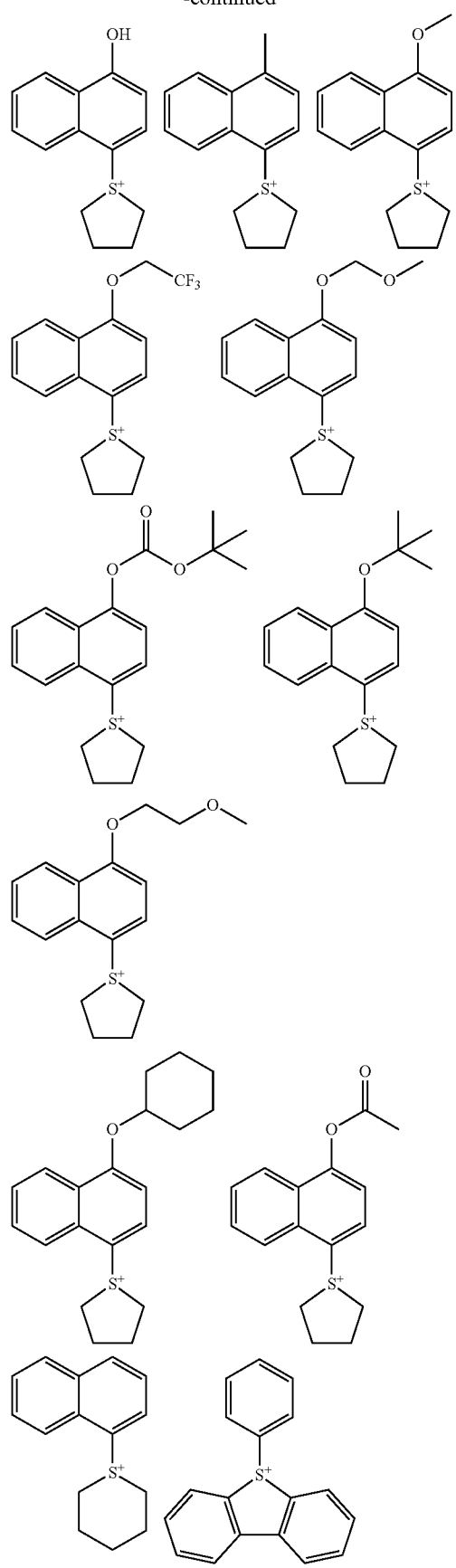
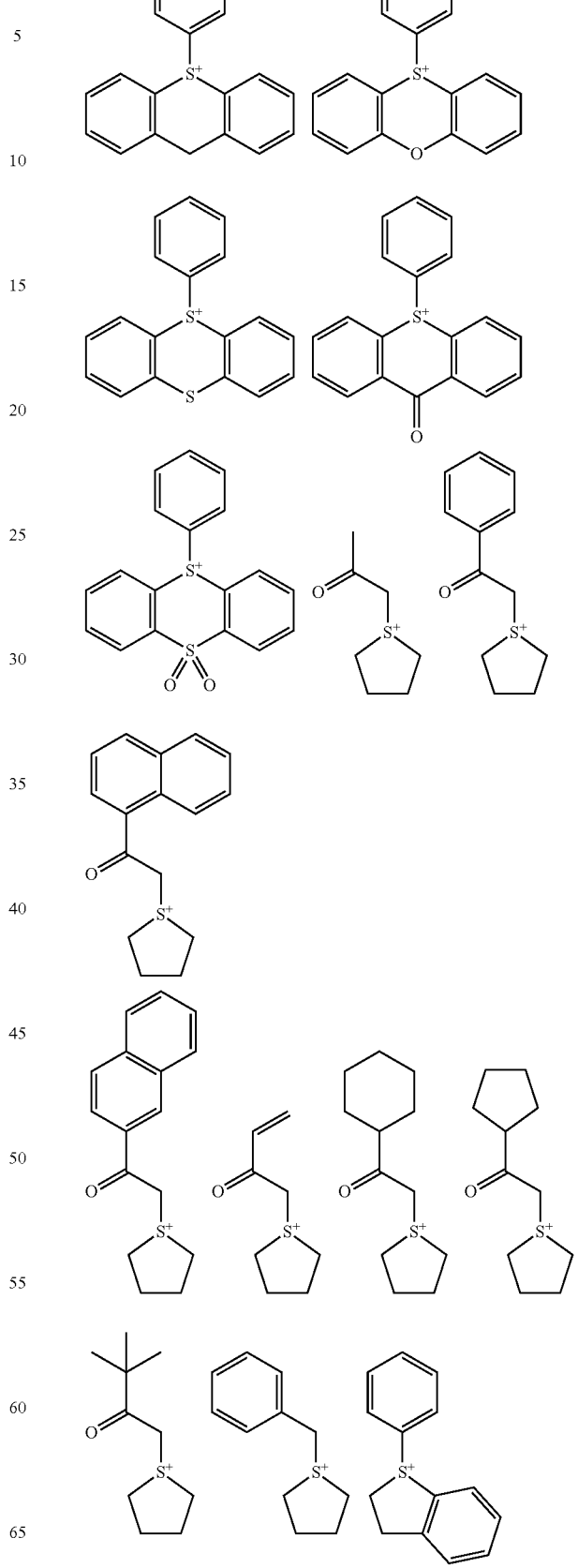

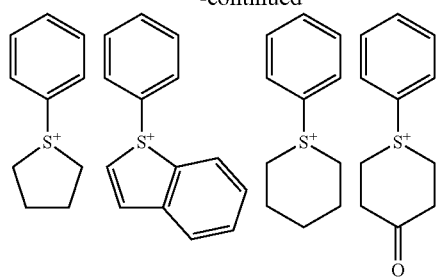
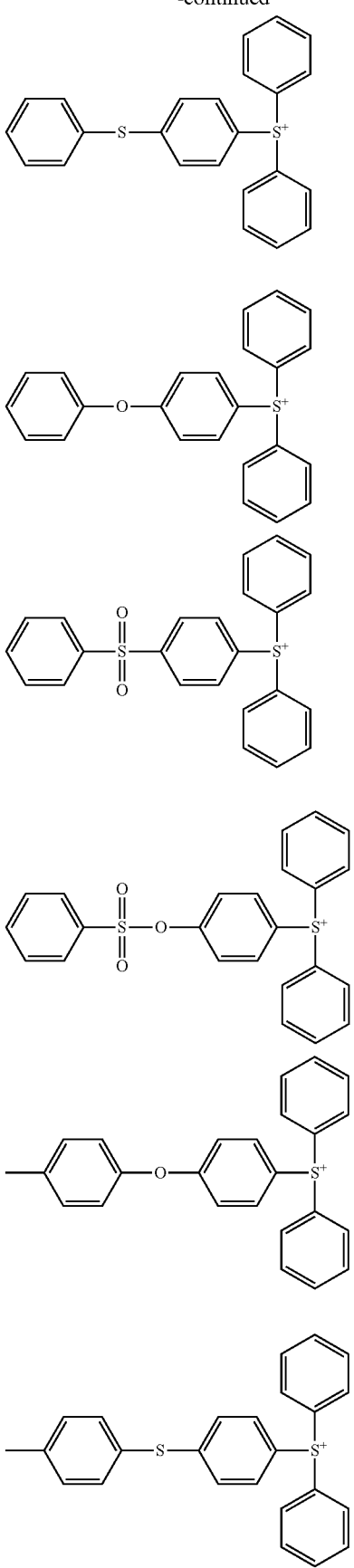

103
-continued
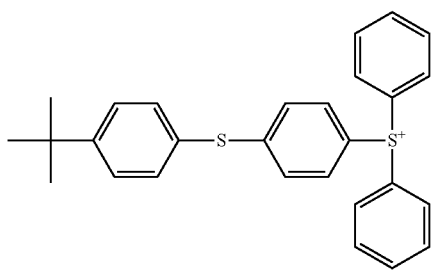
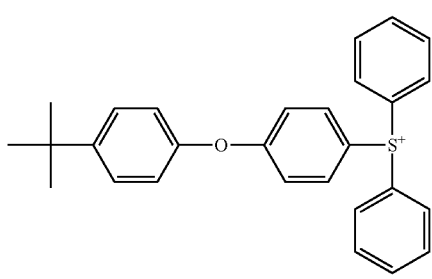
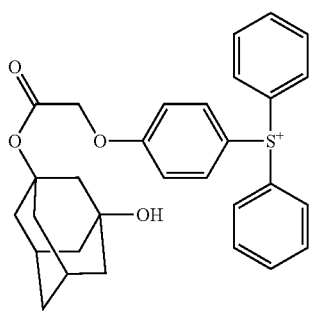
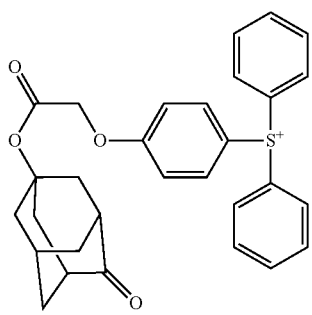
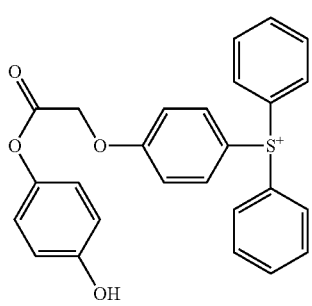
104
-continued
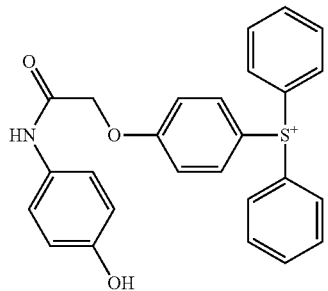
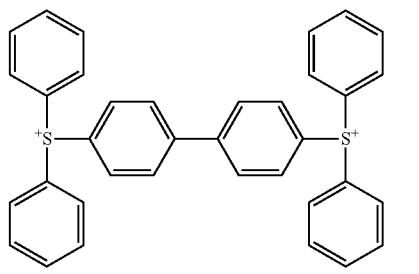
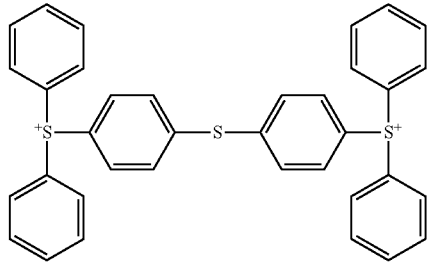
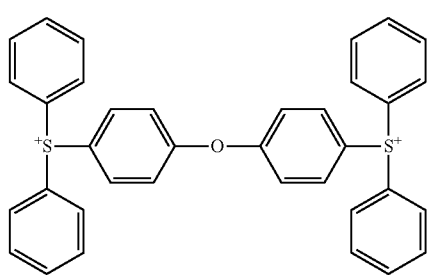
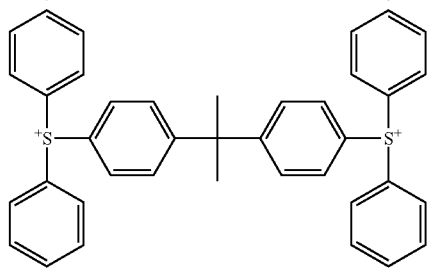
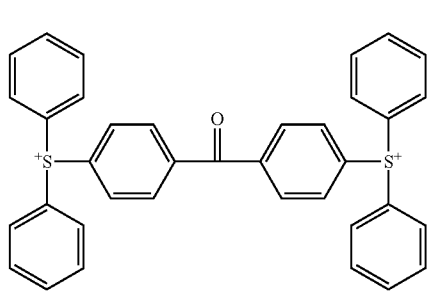

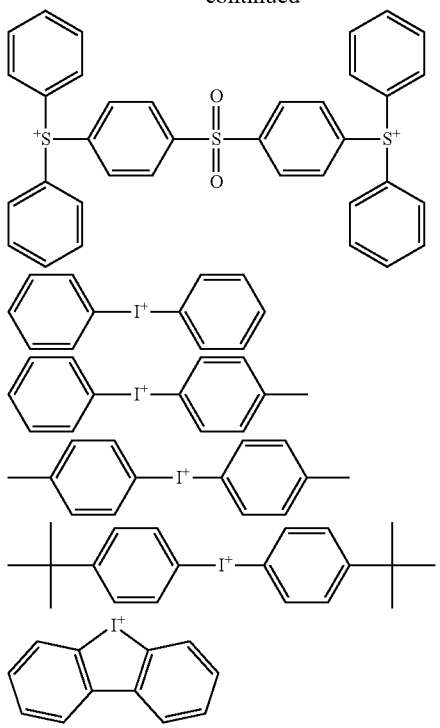

Of these cations, triarylsulfonium cations are preferred in view of the thermal stability of the resultant sulfonium salts. Since the perfluoroalkyl ether carboxylic acid has a low acid strength, a combination thereof with alkylsulfonium cation has too low thermal stability to use in practice.

The resist composition used in the pattern forming process of the invention may further comprise an organic solvent, a compound capable of generating an acid in response to high-energy radiation (known as "acid generator"), and optionally, a dissolution regulator, basic compound, surfactant, acetylene alcohol, and other components.

The resist composition used herein may include an acid generator in order for the composition to function as a chemically amplified positive resist composition. Typical of the acid generator used herein is a photoacid generator (PAG) capable of generating an acid in response to actinic light or radiation. The PAG may preferably be compounded in an amount of 0.5 to 30 parts and more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Typically acid generators generate such acids as sulfonic acids, imide acids and methide acids. Of these, sulfonic acids which are fluorinated at α-position are most commonly used. In case the acid labile group is an acetal group which is susceptible to deprotection, the sulfonic acid need not necessarily be fluorinated at α-position. In the embodiment wherein the base polymer has recurring units (d1), (d2) or (d3) of acid generator copolymerized therein, the acid generator need not be separately added.

Examples of the organic solvent used herein are described in JP-A 2008-111103, paragraphs [0144] to [0145] (U.S. Pat. No. 7,537,880). Specifically, exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof. Where the acid labile group used is of acetal type, a high-boiling alcohol solvent may be added for accelerating deprotection reaction of acetal, for example, diethylene glycol, propylene glycol, glycerol, 1,4-butane diol, and 1,3-butane diol.

While the resist composition used herein is characterized by comprising an onium salt of perfluoroalkyl ether carboxylic acid as a quencher, basic compounds such as amines may be added thereto.

Exemplary basic compounds include primary, secondary and tertiary amine compounds, specifically amine compounds having a hydroxyl, ether, ester, lactone, cyano or sulfonic acid ester group, as described in JP-A 2008-111103, paragraphs [0146] to [0164], and compounds having a carbamate group, as described in JP 3790649.

Onium salts such as sulfonium salts, iodonium salts and ammonium salts of sulfonic acids which are not fluorinated at α-position as described in US 20080153030 (JP-A 2008-158339) and similar onium salts of carboxylic acids as described in U.S. Pat. No. 6,136,500 (JP 3991462) and JP-A 2008-158339 may be used as the quencher.

In case the acid labile group is an acetal group which is very sensitive to acid, the acid for eliminating the protective group need not necessarily be an α-fluorinated sulfonic acid, imide acid or methide acid. Sometimes, deprotection reaction may take place even with α-position non-fluorinated sulfonic acid. In this case, since an onium salt of sulfonic acid cannot be used as the quencher, an onium salt of perfluoroalkyl ether carboxylic acid is preferably used alone as the quencher.

Exemplary surfactants are described in JP-A 2008-111103, paragraphs [0165] to [0166]. Exemplary dissolution regulators are described in JP-A 2008-122932 (US 2008090172), paragraphs to [0178], and exemplary acetylene alcohols in paragraphs [0179] to [0182].

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590 and JP-A 2008-111103. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin. Amounts of the dissolution inhibitor, surfactant, and acetylene alcohol used may be determined as appropriate to meet a particular purpose of addition.

Process

As alluded previously, the pattern forming process of the invention comprises the steps of coating the positive resist composition defined above onto a substrate, prebaking the resist composition to form a resist film, exposing a selected region of the resist film to high-energy radiation, baking (PEB), and developing the exposed resist film in an organic solvent-based developer so that the unexposed region of film is dissolved and the exposed region of film is left, thereby forming a negative tone pattern such as a hole or trench pattern.

Now referring to the drawings, the pattern forming process of the invention is illustrated in FIG. 1. First, the positive resist composition is coated on a substrate to form a resist film thereon. Specifically, a resist film 40 of a positive resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1B. For the exposure, preference is given to high-energy radiation having a wavelength of 140 to 250 nm, EUV having a wavelength of 13.5 nm, and electron beam (EB), and especially ArF excimer laser radiation of 193 nm wavelength. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves exposing the prebaked resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in the aforementioned organic solvent developers. In particular, protective film-forming materials having 1,1,1,3,3,3-hexafluoro-2-propanol residues as described in JP-A 2007-025634 and 2008-003569 readily dissolve in the organic solvent-based developer.

In the protective film-forming composition, an amine compound or amine salt may be added, or a polymer comprising recurring units containing an amino group or amine salt copolymerized therein may be used as the base resin. This component is effective for controlling diffusion of the acid generated in the exposed region of the resist film to the unexposed region for thereby preventing any hole opening failure. A useful protective film-forming composition having an amine compound added thereto is described in JP-A 2008-003569. A useful protective film-forming composition containing a polymer having an amino group or amine salt copolymerized therein is described in JP-A 2007-316448. The amine compound or amine salt may be selected from the compounds enumerated as the basic compound to be added to the resist composition. An appropriate amount of the amine compound or amine salt added is 0.01 to 10 parts, preferably 0.02 to 8 parts by weight per 100 parts by weight of the base resin.

After formation of the resist film, deionized water rinsing (or post-soaking) may be carried out for extracting the acid generator and other components from the film surface or washing away particles, or after exposure, rinsing (or post-soaking) may be carried out for removing water droplets left on the resist film. If the acid evaporating from the exposed region during PEB deposits on the unexposed region to deprotect the protective group on the surface of the unexposed region, there is a possibility that the surface edges of holes after development are bridged to close the holes. Particularly in the case of negative development, regions surrounding the holes receive light so that acid is generated therein. There is a possibility that the holes are not opened if the acid outside the holes evaporates and deposits inside the holes during PEB. Provision of a protective film is effective for preventing evaporation of acid and for avoiding any hole opening failure. A protective film having an amine compound or amine salt added thereto is more effective for preventing acid evaporation. On the other hand, a protective film formed of a composition comprising a polymer and an acidic compound having a carboxyl or sulfo group or a composition comprising a polymer having an acidic compound having a carboxyl or sulfo group copolymerized therein is not preferred because a hole opening failure can occur.

The other embodiment is a pattern forming process comprising the steps of applying a resist composition comprising a polymer comprising recurring units having a hydroxyl group substituted with an acid labile group as represented by formula (1), an acid generator, and an organic solvent onto a substrate, prebaking the composition to form a resist film, forming a protective film on the resist film, exposing the resist film to high-energy radiation, typically by immersion lithography, baking, and applying an organic solvent-based developer to dissolve away the protective film and the unexposed region of the resist film for forming a negative pattern wherein the exposed region of film is not dissolved. The protective film is preferably formed from a composition comprising a polymer bearing a 1,1,1,3,3,3-hexafluoro-2-propanol residue and an amino group or amine salt-containing compound, or a composition comprising a polymer comprising recurring units having a 1,1,1,3,3,3-hexafluoro-2-propanol residue and recurring units having an amino group or amine salt copolymerized, the composition further comprising an alcohol solvent of at least 4 carbon atoms, an ether solvent of 8 to 12 carbon atoms, or a mixture thereof.

Examples of suitable recurring units having a 1,1,1,3,3,3-hexafluoro-2-propanol residue include those derived from hydroxyl-bearing monomers selected from among the monomers listed on pages 51, 52 and 53. Examples of the amino group-containing compound include the amine compounds described in JP-A 2008-111103, paragraphs [0146] to [0164] as being added to photoresist compositions. Examples of the amine salt-containing compound include salts of the foregoing amine compounds with carboxylic acids or sulfonic acids.

Suitable alcohols of 4 or more carbon atoms include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether solvents of 8 to 12 carbon atoms include di-n-butyl ether, diisobutyl ether, di-sec-butyl ether, di-n-pentyl ether, diisopentyl ether, di-sec-pentyl ether, di-t-amyl ether, and di-n-hexyl ether.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Thereafter the exposed resist film is developed in an organic solvent-based developer for 0.1 to 3 minutes, preferably 0.5 to 2 minutes by any conventional techniques such as dip, puddle and spray techniques. In this way, the unexposed region of resist film is dissolved away, leaving a negative resist pattern 40 on the substrate 10 as shown in FIG. 1C.

The organic solvent used as the developer is preferably selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone; and esters such as propyl acetate, butyl acetate, isobutyl acetate, amyl acetate, isoamyl acetate, butenyl acetate, methyl propionate, ethyl propionate, ethyl 3-ethoxypropionate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene. In some cases, rinsing is omitted, and the developer may be dried by spin drying and baking.

A hole pattern after reversal may be shrunk by the RELACS® process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is at a temperature of 70 to 180° C., preferably 80 to 170° C., for a time of 10 to 300 seconds. The extra shrink agent is stripped and the hole pattern is shrunk. For removal of the shrink agent, water, developer, alcohol solvent or a mixture thereof may be used. Where negative development in organic solvent is carried out using a conventional resist polymer having a carboxyl group substituted with an acid labile group, the remaining resist film is a film containing an alkali soluble carboxyl group. In this case, if the shrink agent is stripped in an alkaline developer, not only the shrink agent, but also the resist film are dissolved away, that is, the pattern is lost in its entirety. In contrast, a resist base polymer comprising an acid labile group-substituted hydroxyl group according to the invention allows for stripping of the shrink agent in alkaline developer because the resist film after deprotection is not dissolved in alkaline developer.

Where a hole pattern is formed by negative tone development, exposure by double dipole illuminations of X- and Y-direction line patterns provides the highest contrast light. The contrast may be further increased by combining dipole illumination with s-polarized illumination.

In a preferred embodiment, the exposure step is carried out, specifically by ArF immersion lithography, using a halftone phase shift mask bearing a lattice-like shifter pattern, whereby a pattern of holes is formed at the intersections between gratings of the lattice-like shifter pattern after development. In a further preferred embodiment, the halftone phase shift mask bearing a lattice-like shifter pattern has a transmittance of 3 to 15%. In a further preferred embodiment, the phase shift mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed. In a further preferred embodiment, the phase shift mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

Figure 3:
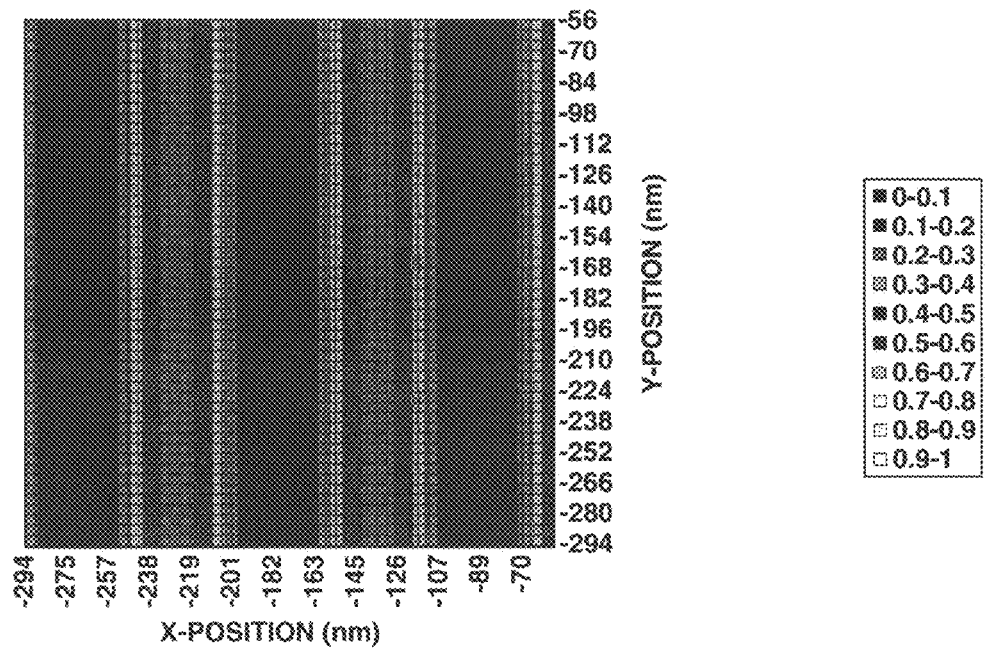
FIG. 3 is an optical image of Y-direction lines like FIG. 2.
Figure 4:
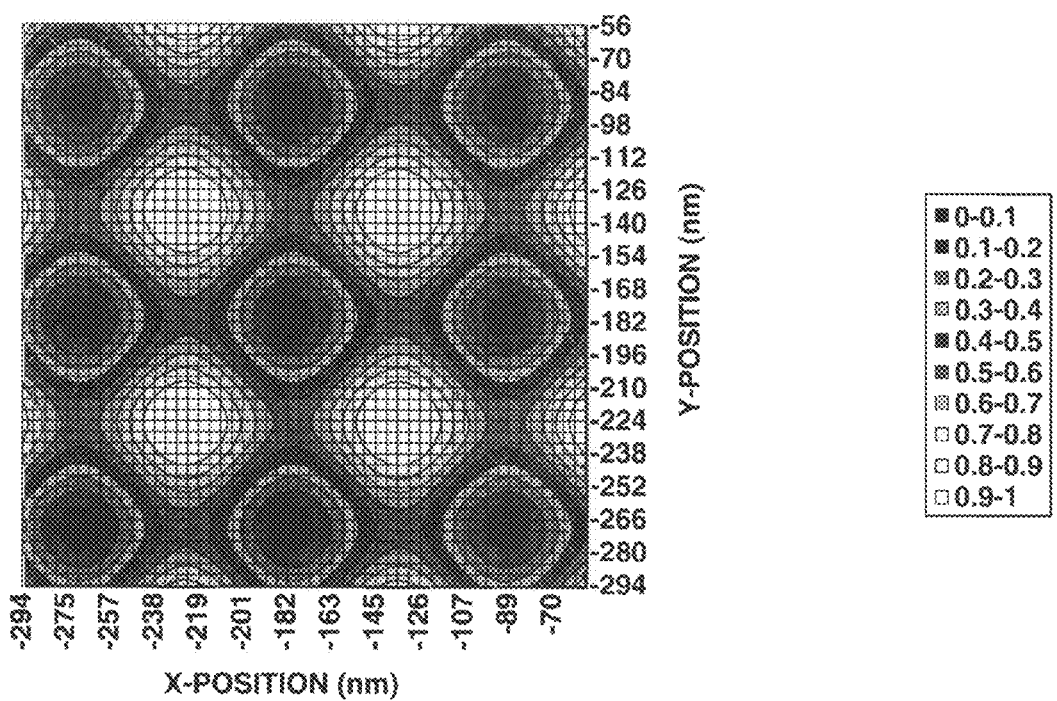
FIG. 4 shows a contrast image obtained by overlaying the optical image of X-direction lines in FIG. 2 with the optical image of Y-direction lines in FIG. 3.

FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization. FIG. 3 is an optical image of Y-direction lines having a pitch of 90 nm and a line size of 45 nm printed under conditions: ArF excimer laser of wavelength 193 nm, NA 1.3 lens, dipole illumination, 6% halftone phase shift mask, and s-polarization. A black area is a light shielded area while a white area is a high light intensity area. A definite contrast difference is recognized between white and black, indicating the presence of a fully light shielded area. FIG. 4 shows a contrast image obtained by overlaying the optical image of X-direction lines in FIG. 2 with that of Y-direction lines in FIG. 3. Against the expectation that a combination of X and Y lines may form a lattice-like image, weak light black areas draw circular shapes. As the pattern (circle) size becomes larger, the circular shape changes to a rhombic shape to merge with adjacent ones. As the circle size becomes smaller, circularity is improved, which is evidenced by the presence of a fully light shielded small circle.

Exposure by double dipole illuminations of X- and Y-direction lines combined with polarized illumination presents a method of forming light of the highest contrast. This method, however, has the drawback that the throughput is substantially reduced by double exposures and mask exchange therebetween. To continuously carry out two exposures while exchanging a mask, the exposure tool must be equipped with two mask stages although the existing exposure tool includes a single mask stage. Higher throughputs may be obtained by carrying out exposure of X direction lines continuously on 25 wafers in a front-opening unified pod (FOUP), exchanging the mask, and carrying out exposure continuously on the same 25 wafers, rather than exchanging a mask on every exposure of a single wafer. However, a problem arises that as the time duration until the first one of 25 wafers is exposed in the second exposure is prolonged, the environment affects the resist such that the resist after development may change its size and shape. To block the environmental impact on wafers in standby until the second exposure, it is effective that the resist film is overlaid with a protective film.

To proceed with a single mask, it is proposed in Non-Patent Document 1 to carry out two exposures by dipole illuminations in X and Y directions using a mask bearing a lattice-like pattern. When this method is compared with the above method using two masks, the optical contrast is somewhat reduced, but the throughput is improved by the use of a single mask. As described in Non-Patent Document 1, the method involves forming X-direction lines in a first photoresist film by X-direction dipole illumination using a mask bearing a lattice-like pattern, insolubilizing the X-direction lines by light irradiation, coating a second photoresist film thereon, and forming Y-direction lines by Y-direction dipole illumination, thereby forming holes at the interstices between X- and Y-direction lines. Although only a single mask is needed, this method includes additional steps of insolubilizing the first photoresist pattern between the two exposures, and coating and developing the second photoresist film. Then the wafer must be removed from the exposure stage between the two exposures, giving rise to the problem of an increased alignment error. To minimize the alignment error between two exposures, two exposures must be continuously carried out without removing the wafer from the exposure stage.

Figure 16:
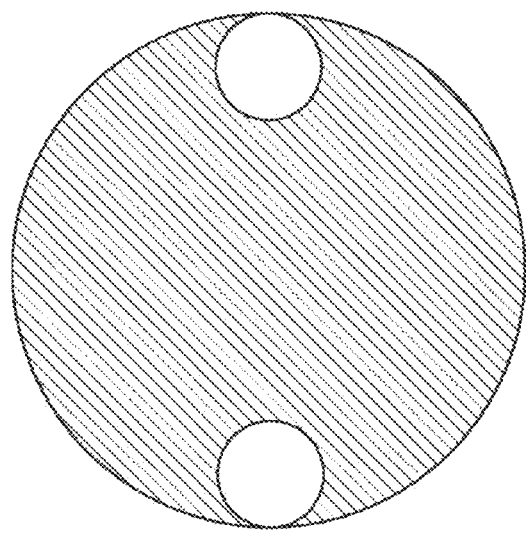
FIG. 16 illustrates an aperture configuration in an exposure tool of dipole illumination for enhancing the contrast of X-direction lines.
Figure 17:
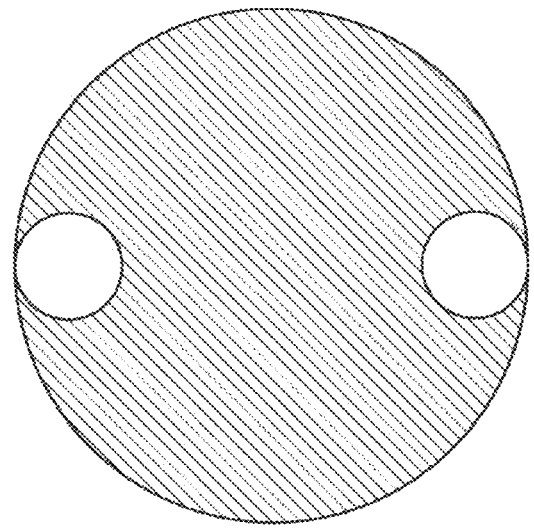
FIG. 17 illustrates an aperture configuration in an exposure tool of dipole illumination for enhancing the contrast of Y-direction lines.

FIG. 16 shows the shape of apertures for dipole illumination for forming X-direction or horizontal lines using a mask bearing a lattice-like pattern, and FIG. 17 shows the shape of apertures for dipole illumination for forming Y-direction or vertical lines. The addition of s-polarized illumination to dipole illumination provides a further improved contrast and is thus preferably employed. After two exposures for forming X- and Y-direction lines using a lattice-like mask are performed in an overlapping manner, development is performed to form a hole pattern.

Figure 18:
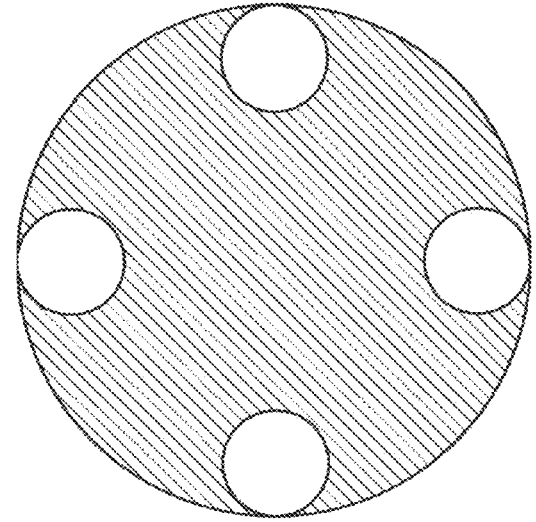
FIG. 18 illustrates an aperture configuration in an exposure tool of cross-pole illumination for enhancing the contrast of both X and Y-direction lines.

When it is desired to form a hole pattern via a single exposure using a lattice-like mask, a quadra-pole illumination or cross-pole illumination in the aperture configuration shown in FIG. 18 is used. The contrast may be improved by combining it with X-Y polarized illumination or azimuthally polarized illumination of circular polarization.

In the hole pattern forming process of the invention, when two exposures are involved, these exposures are carried out by changing the illumination and mask for the second exposure from those for the first exposure, whereby a fine size pattern can be formed at the highest contrast and to dimensional uniformity. The masks used in the first and second exposures bear first and second patterns of intersecting lines whereby a pattern of holes at intersections of lines is formed in the resist film after development. The first and second lines are preferably at right angles although an angle of intersection other than 90° may be employed. The first and second lines may have the same or different size and/or pitch. If a single mask bearing first lines in one area and second lines in a different area is used, it is possible to perform first and second exposures continuously. In this case, however, the maximum area available for exposure is one half. Notably, the continuous exposures lead to a minimized alignment error. Of course, the single exposure provides a smaller alignment error than the two continuous exposures.

Figure 5:
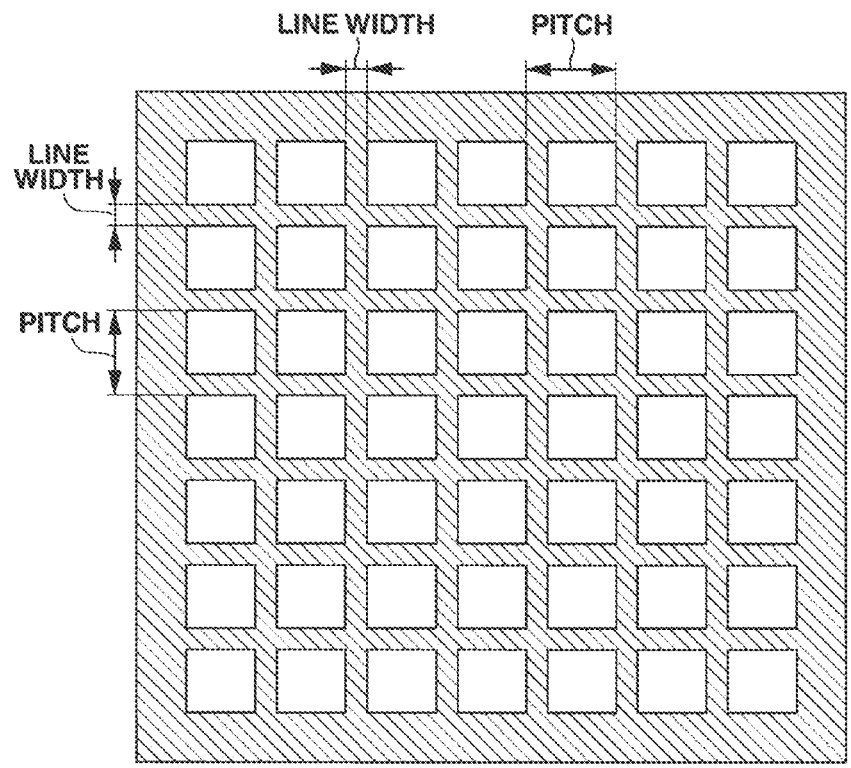
FIG. 5 illustrates a mask bearing a lattice-like pattern.
Figure 7:
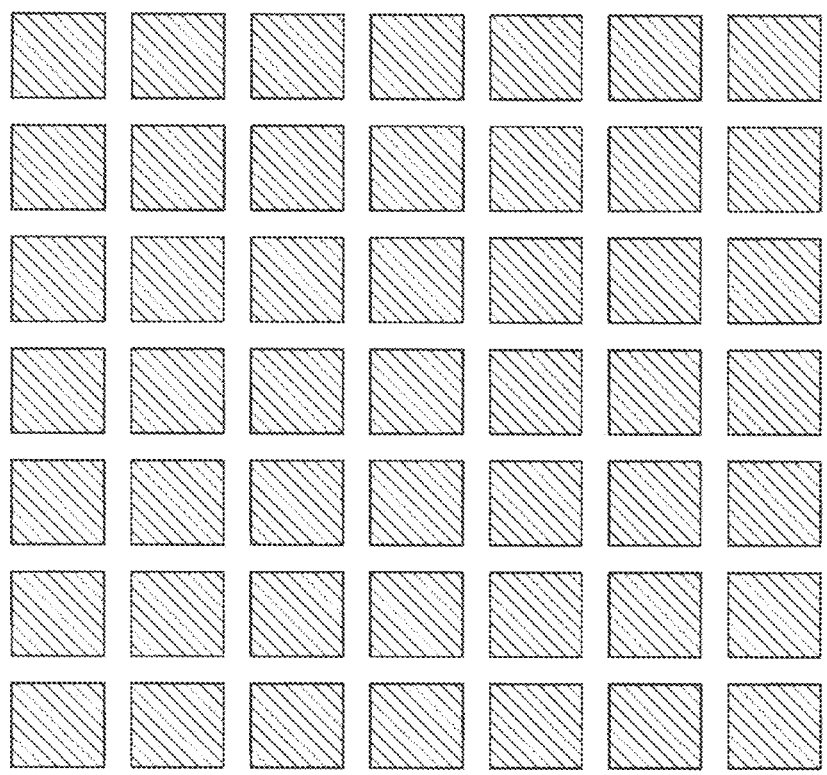
FIG. 7 illustrates a mask bearing a dot pattern of square dots having a pitch of 90 nm and a side width of 55 nm.
Figure 11:
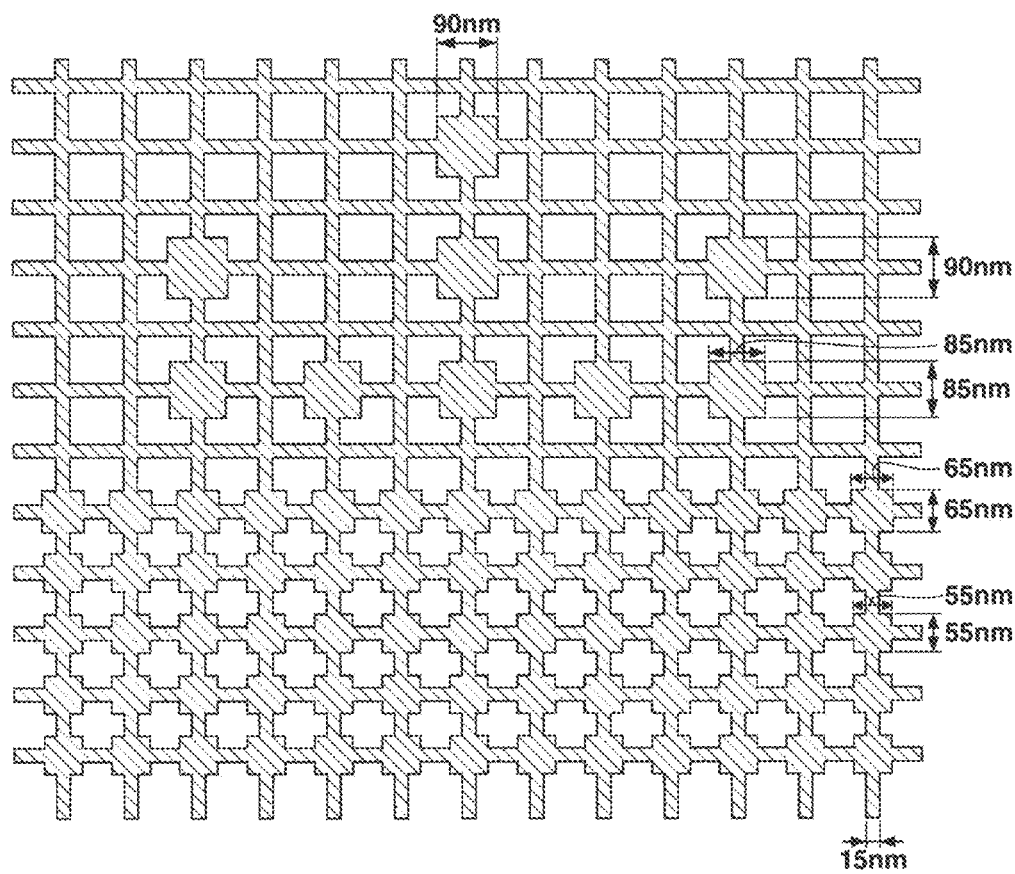
FIG. 11 illustrates a mask bearing a lattice-like pattern having a pitch of 90 nm and a line width of 15 nm on which thick dots are disposed where dots are to be formed.

When two exposures are performed using a single mask without reducing the exposure area, the mask pattern may be a lattice-like pattern as shown in FIG. 5, a dot pattern as shown in FIG. 7, or a combination of a dot pattern and a lattice-like pattern as shown in FIG. 11. The use of a lattice-like pattern contributes to the most improved light contrast, but has the drawback of a reduced resist sensitivity due to a lowering of light intensity. On the other hand, the use of a dot pattern suffers a lowering of light contrast, but provides the merit of an improved resist sensitivity.

Where holes are arrayed in horizontal and vertical directions, the above-described illumination and mask pattern are used. Where holes are arrayed at a different angle, for example, at an angle of 45°, a mask of a 45° arrayed pattern is combined with dipole illumination or cross-pole illumination.

Where two exposures are performed, a first exposure by a combination of dipole illumination with polarized illumination for enhancing the contrast of X-direction lines is followed by a second exposure by a combination of dipole illumination with polarized illumination for enhancing the contrast of Y-direction lines. Two continuous exposures with the X- and Y-direction contrasts emphasized through a single mask can be performed on a currently commercially available scanner.

The method of combining X and Y polarized illuminations with cross-pole illumination using a mask bearing a lattice-like pattern can form a hole pattern through a single exposure, despite a slight lowering of light contrast as compared with two exposures of dipole illumination. The method is estimated to attain a substantial improvement in throughput and avoids the problem of misalignment between two exposures.

Using such a mask and illumination, a hole pattern of the order of 40 nm can be formed at a practically acceptable cost.

Figure 6:
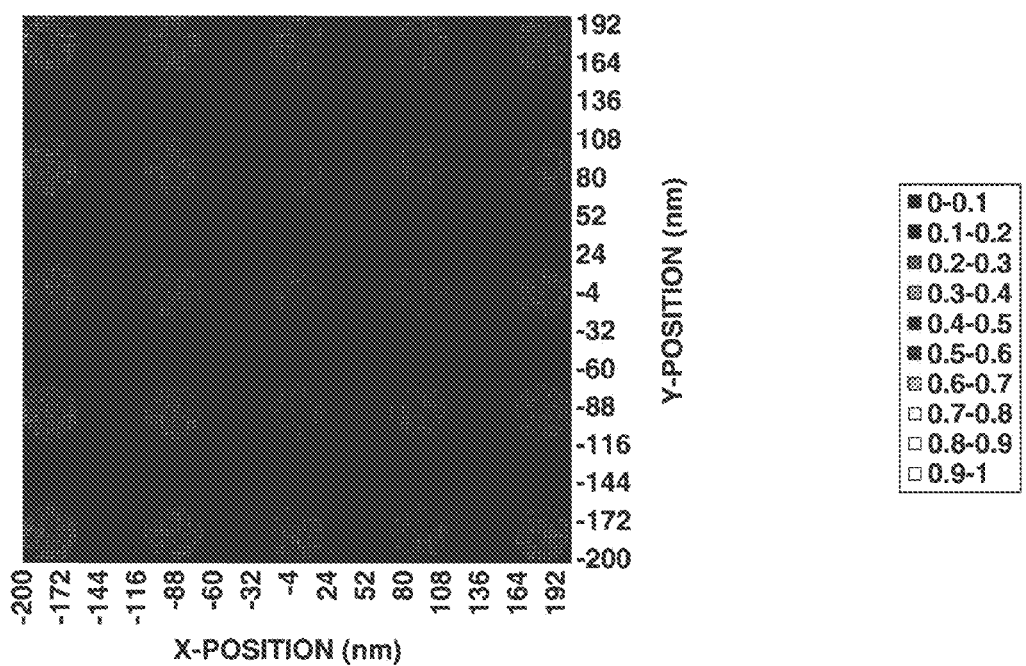
FIG. 6 is an optical image of a lattice-like line pattern having a pitch of 90 nm and a line width of 30 nm printed under conditions: NA 1.3 lens, cross-pole illumination, 6% halftone phase shift mask, and azimuthally polarized illumination.

On use of a mask bearing a lattice-like pattern as shown in FIG. 5 where light is fully shielded at intersections between gratings, black spots having a very high degree of light shielding appear as shown in FIG. 6. FIG. 6 is an optical image of a lattice-like line pattern having a pitch of 90 nm and a line width of 30 nm printed under conditions: NA 1.3 lens, crosspole illumination, 6% halftone phase shift mask, and azimuthally polarized illumination. A fine hole pattern may be formed by performing exposure through a mask bearing such a pattern and organic solvent development entailing positive/negative reversal.

Figure 8:
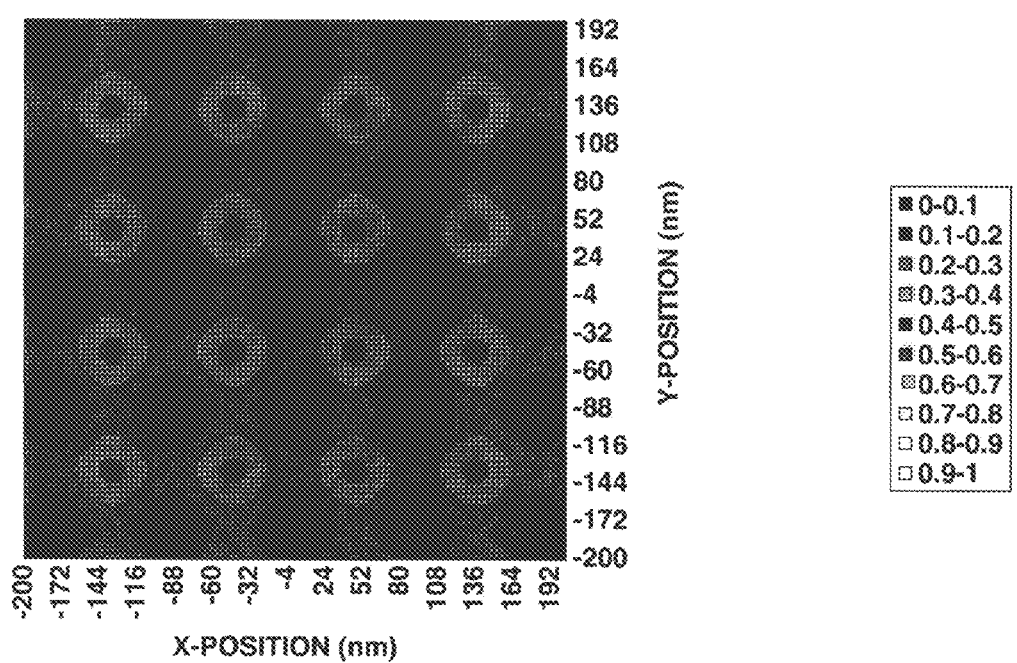
FIG. 8 is an optical image resulting from the mask of FIG. 7, printed under conditions: NA 1.3 lens, cross-pole illumination, 6% halftone phase shift mask, and azimuthally polarized illumination, showing its contrast.

On use of a mask bearing a dot pattern of square dots having a pitch of 90 nm and a side width of 55 nm as shown in FIG. 7, under conditions: NA 1.3 lens, cross-pole illumination, 6% halftone phase shift mask, and azimuthally polarized illumination, an optical image is obtained as shown in FIG. 8 that depicts the contrast thereof. Although the circle of fully light shielded spot in FIG. 8 has a smaller area than in FIG. 6, which indicates a low contrast as compared with the lattice-like pattern mask, the formation of a hole pattern is possible owing to the presence of black or light shielded spots.

It is difficult to form a fine hole pattern that holes are randomly arrayed at varying pitch and position. The superresolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Proc. SPIE Vol. 5753, p171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

Figure 9:
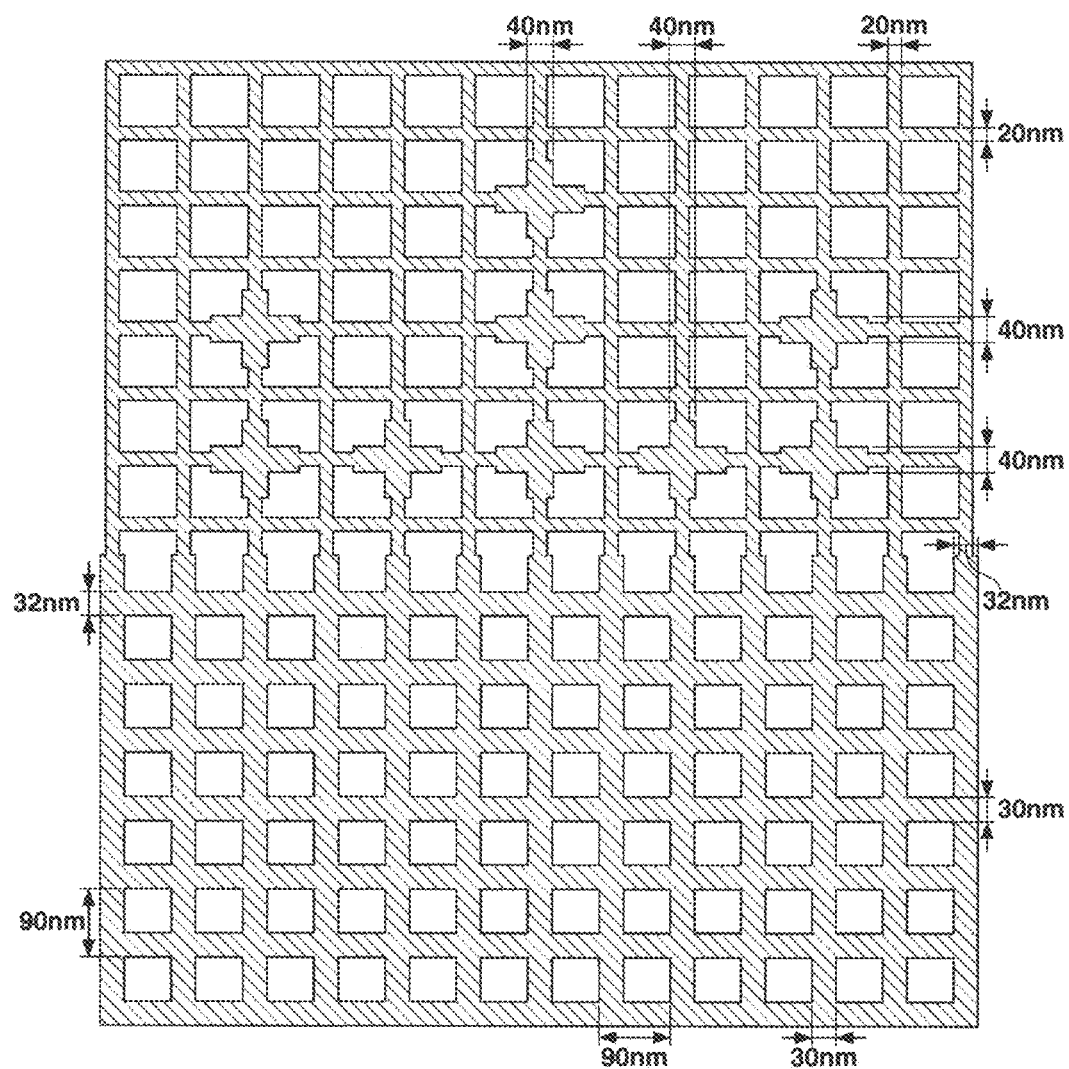
FIG. 9 illustrates a mask bearing a lattice-like pattern having a pitch of 90 nm and a line width of 20 nm on which thick crisscross or intersecting line segments are disposed where dots are to be formed.
Figure 10:
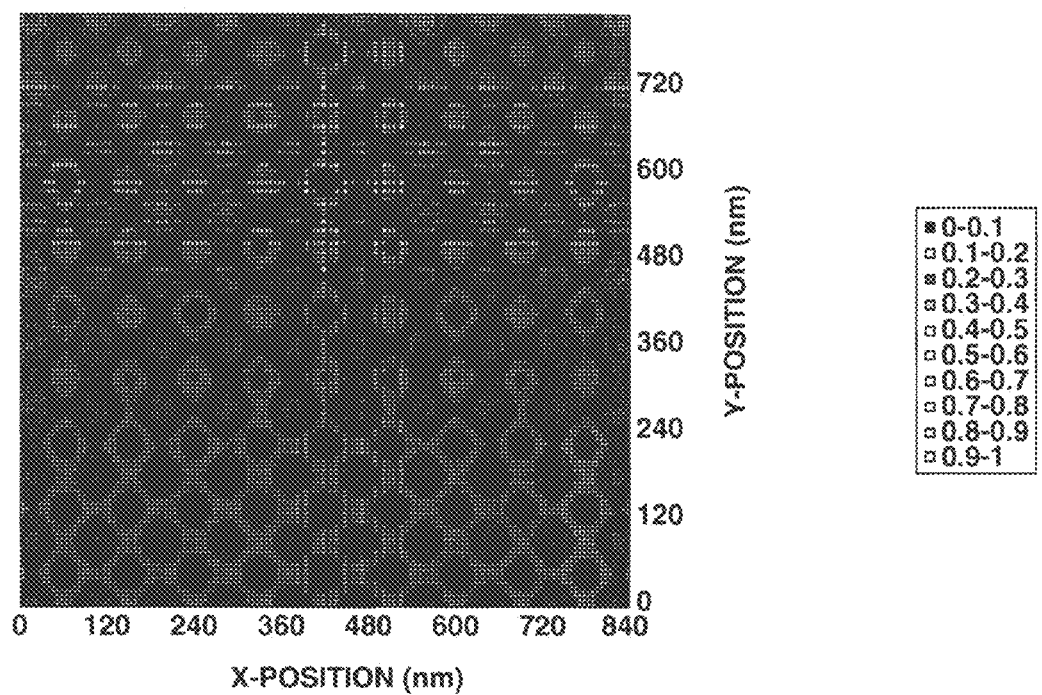
FIG. 10 is an optical image resulting from the mask of FIG. 9, showing its contrast.

To form a random pitch hole pattern by organic solvent development entailing positive/negative reversal, a mask is used in which a lattice-like pattern is arrayed over the entire surface and the width of gratings is thickened only where holes are to be formed. As shown in FIG. 9, on a lattice-like pattern having a pitch of 90 nm and a line width of 20 nm, thick crisscross or intersecting line segments are disposed where dots are to be formed. A black area corresponds to the halftone shifter portion. Line segments with a width of 30 nm are disposed in the dense pattern portion whereas thicker line segments (width 40 nm in FIG. 9) are disposed in more isolated pattern portions. Since the isolated pattern provides light with a lower intensity than the dense pattern, thicker line segments are used. Since the peripheral area of the dense pattern provides light with a relatively low intensity, line segments having a width of 32 nm are assigned to the peripheral area which width is slightly greater than that in the internal area of the dense pattern. FIG. 10 shows an optical image from the mask of FIG. 9, indicating the contrast thereof. Black or light shielded areas are where holes are formed via positive/negative reversal. Black spots are found at positions other than where holes are formed, but few are transferred in practice because they are of small size. Optimization such as reduction of the width of grating lines corresponding to unnecessary holes can inhibit transfer of unnecessary holes.

Also useful is a mask in which a lattice-like pattern is arrayed over the entire surface and thick dots are disposed only where holes are to be formed. As shown in FIG. 11, on a lattice-like pattern having a pitch of 90 nm and a line width of 15 nm, thick dots are disposed where dots are to be formed. A black area corresponds to the halftone shifter portion. Square dots having one side with a size of 55 nm are disposed in the dense pattern portion whereas larger square dots (side size 90 nm in FIG. 11) are disposed in more isolated pattern portions. Although square dots are shown in the figure, the dots may have any shape including rectangular, rhombic, pentagonal, hexagonal, heptagonal, octagonal, and polygonal shapes and even circular shape.

Figure 12:
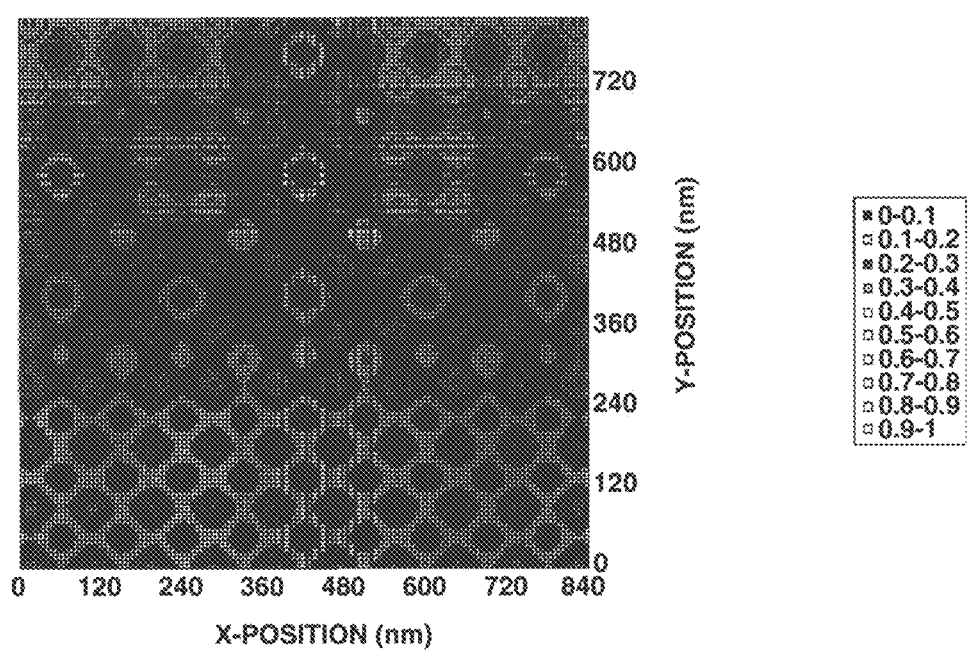
FIG. 12 is an optical image resulting from the mask of FIG. 11, showing its contrast.

FIG. 12 shows an optical image from the mask of FIG. 11, indicating the contrast thereof. The presence of black or light shielded spots substantially equivalent to those of FIG. 10 indicates that holes are formed via positive/negative reversal.

Figure 13:
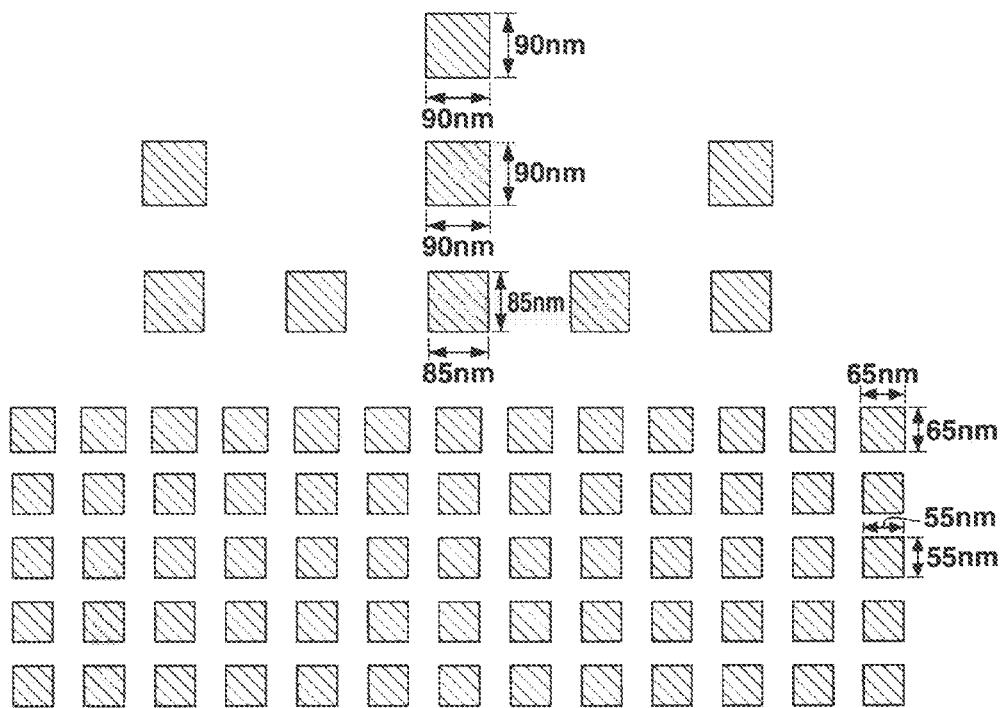
FIG. 13 illustrates a mask without a lattice-like pattern.
Figure 14:
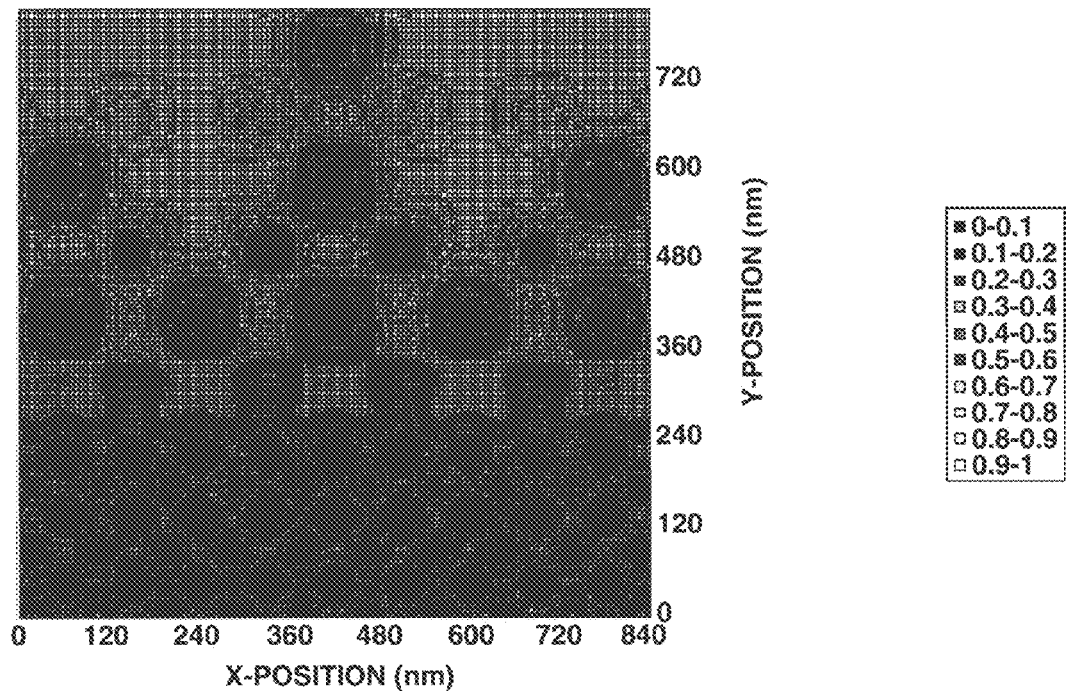
FIG. 14 is an optical image resulting from the mask of FIG. 13, showing its contrast.

On use of a mask bearing no lattice-like pattern arrayed as shown in FIG. 13, black or light shielded spots do not appear as shown in FIG. 14. In this case, holes are difficult to form, or even if holes are formed, a variation of mask size is largely reflected by a variation of hole size because the optical image has a low contrast.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent. For measurement of the hole size of a pattern, a top-down scanning electron microscope (TDSEM) S-9380 (Hitachi High Technologies Corp.) was used.

Synthesis Example

Various polymers (Resist Polymers 1 to 20) for use in resist compositions were prepared by combining suitable monomers, effecting copolymerization reaction in tetrahydrofuran solvent, pouring into methanol for crystallization, repeatedly washing with hexane, isolation, and drying. The polymers were analyzed by 1H-NMR to determine their composition and by GPC to determine Mw and dispersity Mw/Mn.

Resist Polymer 1
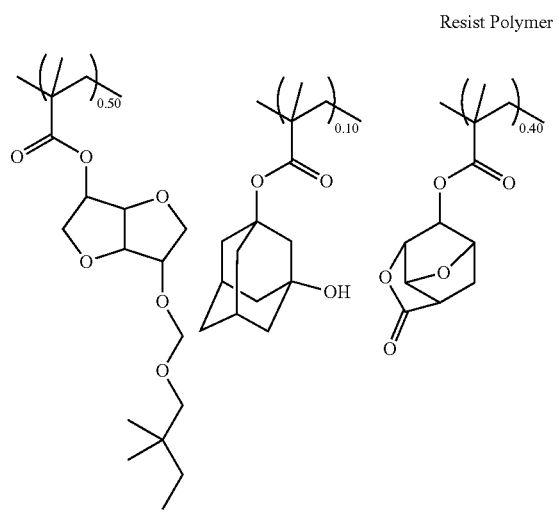
Mw = 8,600
Mw/Mn = 1.87
Resist Polymer 2
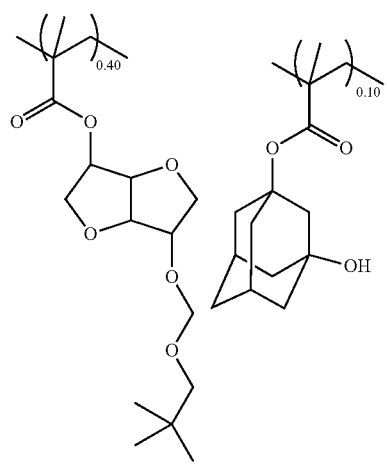
Mw = 8,600
Mw/Mn = 1.87
Resist Polymer 3
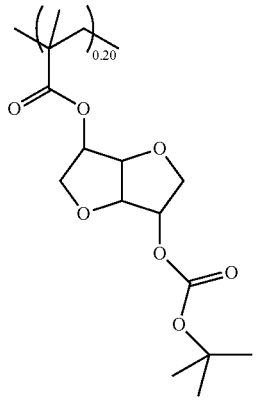
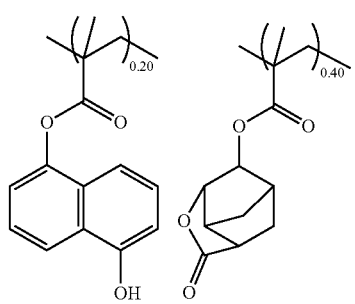
Mw = 8,100
Mw/Mn = 1.66
Resist Polymer 4
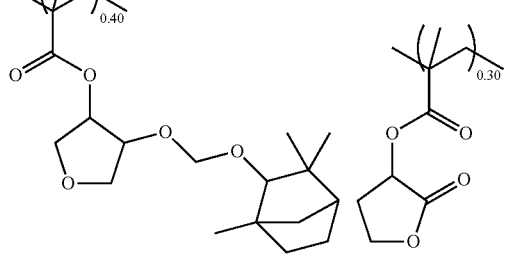
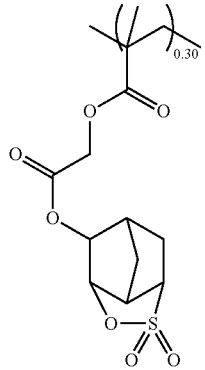
Mw = 8,900
Mw/Mn = 1.89

-continued
Resist Polymer 5
Resist Polymer 5
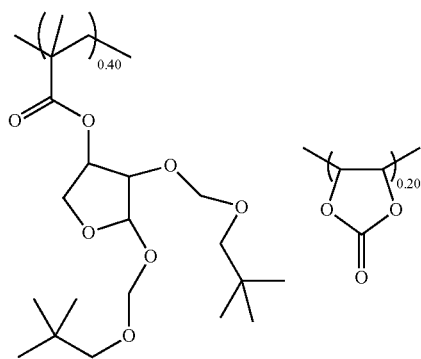
Mw = 7,300
Mw/Mn = 1.98
Resist Polymer 6
Resist Polymer 6
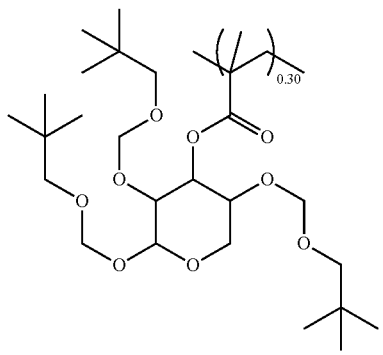
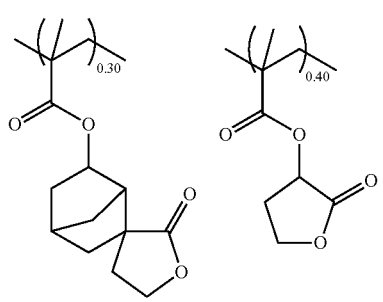
Mw = 7,800
Mw/Mn = 1.78
-continued
Resist Polymer 7
Resist Polymer 7
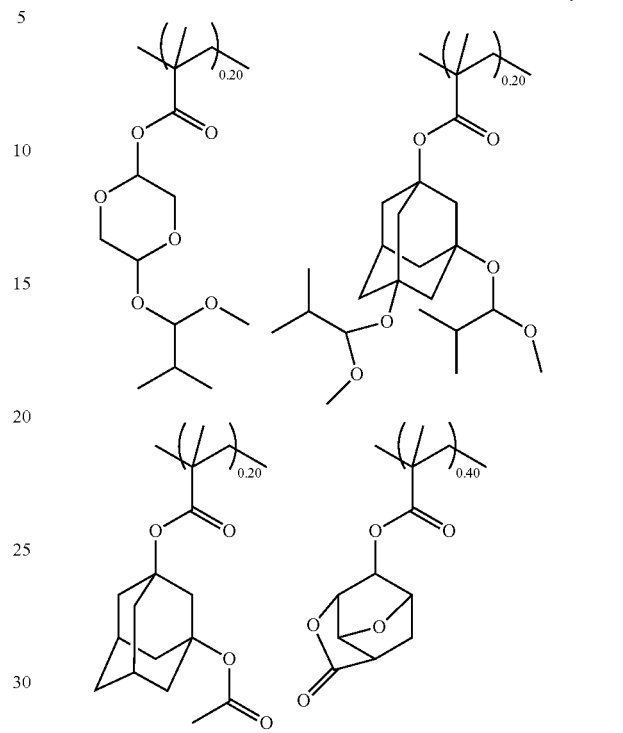
Mw = 8,600
Mw/Mn = 1.83
Resist Polymer 8
Resist Polymer 8
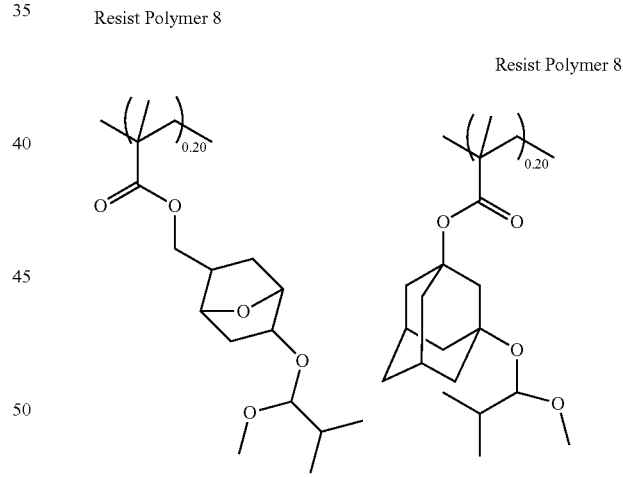
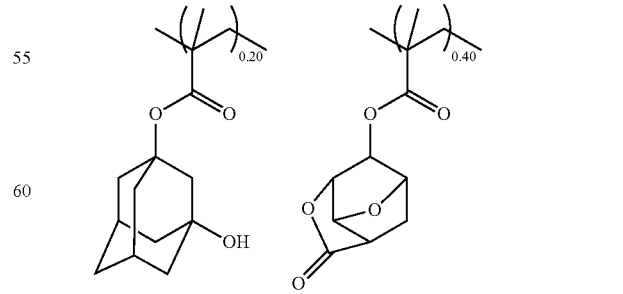
Mw = 8,100
Mw/Mn = 1.55

Resist Polymer 9
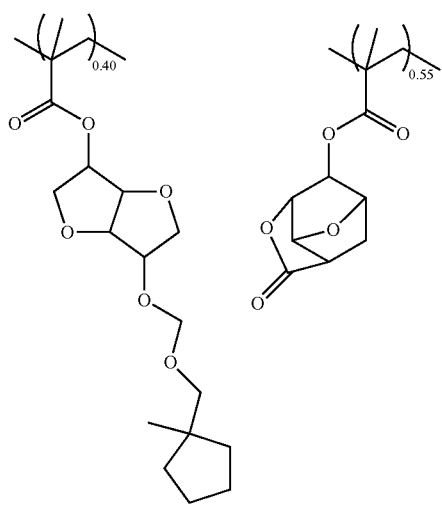
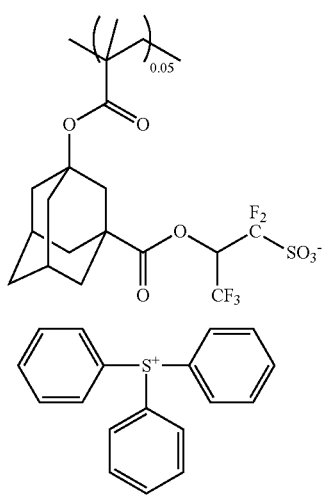
Mw = 7,400
Mw/Mn = 1.88
Resist Polymer 10
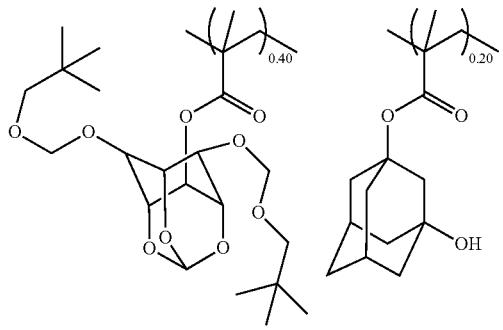
Resist Polymer 9
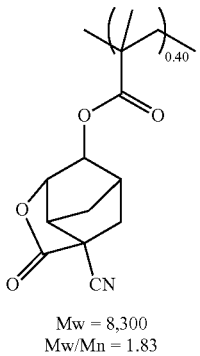
Mw = 8,300
Mw/Mn = 1.83
Resist Polymer 11
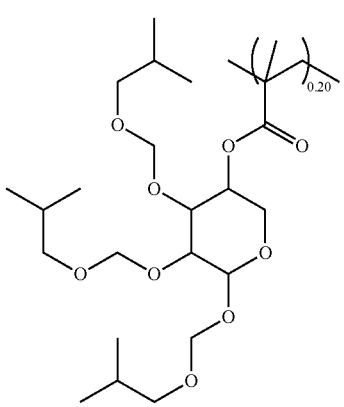
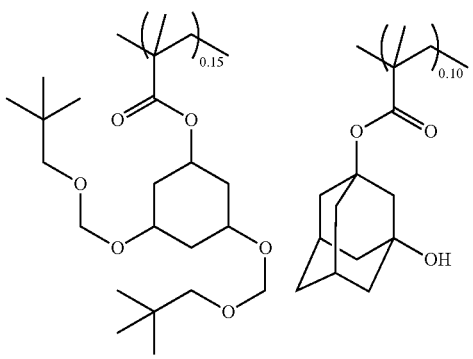
Resist Polymer 10
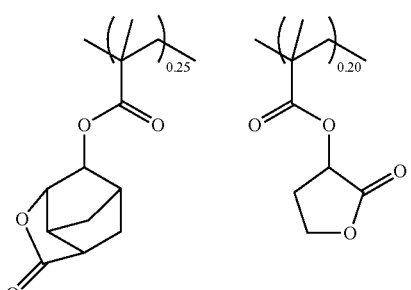
Mw = 10,800
Mw/Mn = 1.88

Resist Polymer 12
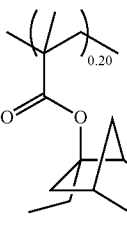
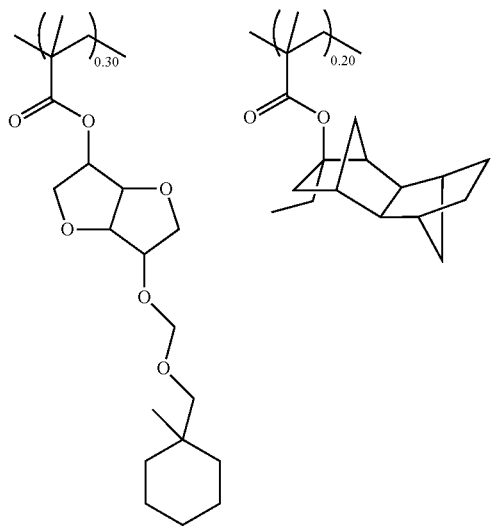
Resist Polymer 13
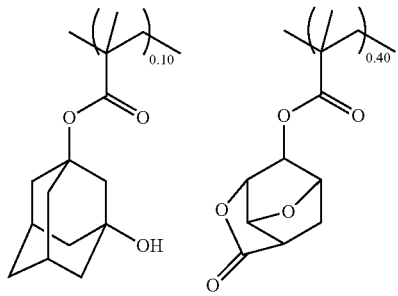
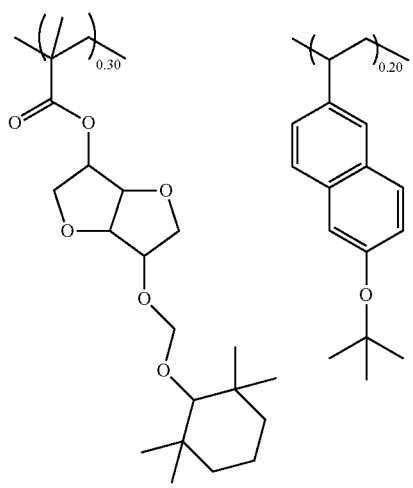
Mw = 8,400
Mw/Mn = 1.87
Resist Polymer 12
-continued
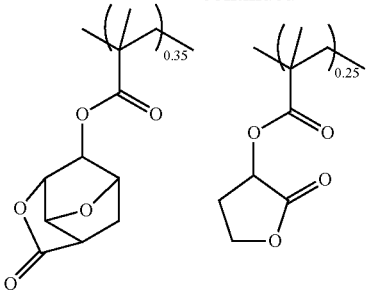
Mw = 7,500
Mw/Mn = 1.85
Resist Polymer 14
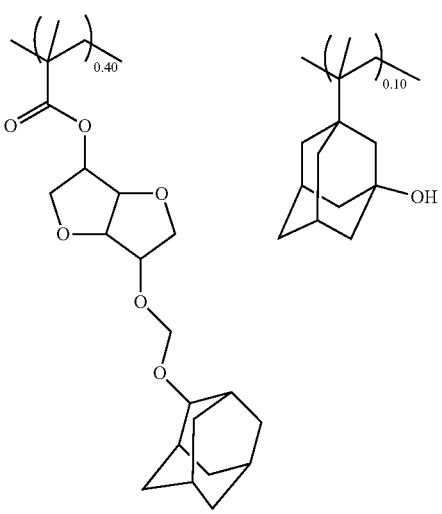
Resist Polymer 14
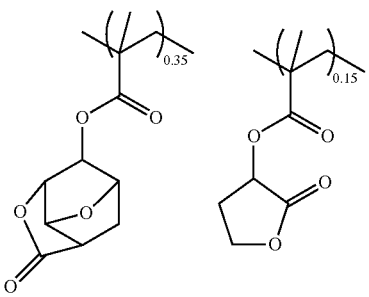
Mw = 8,800
Mw/Mn = 1.88

Resist Polymer 15
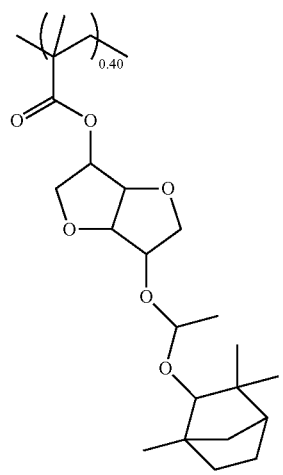
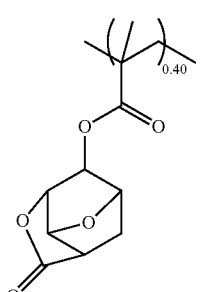
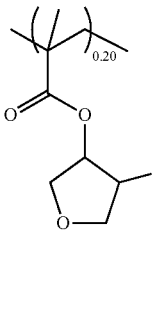
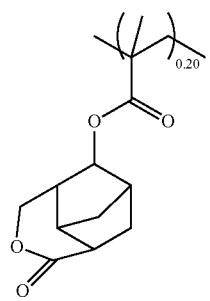
Mw = 8,300
Mw/Mn = 1.84
Resist Polymer 16
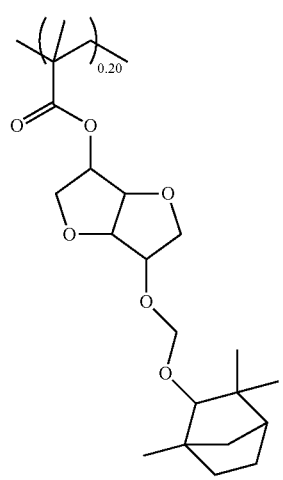
Resist Polymer 15
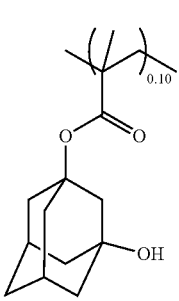
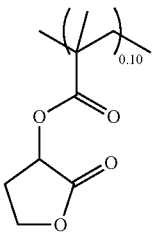
Mw = 9,100
Mw/Mn = 1.93
Resist Polymer 17
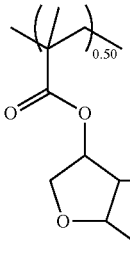
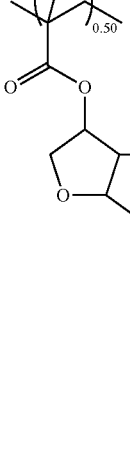

-continued

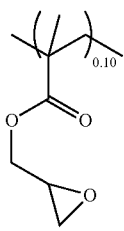

Mw = 8,800
Mw/Mn = 1.88
Resist Polymer 18

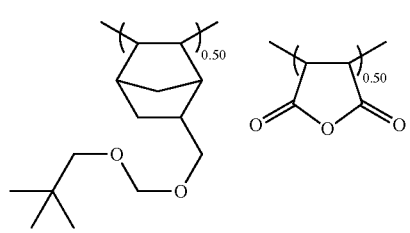

Mw = 6,700
Mw/Mn = 1.59
Resist Polymer 19

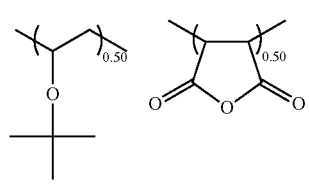

Mw = 33,700
Mw/Mn = 1.94
Resist Polymer 20

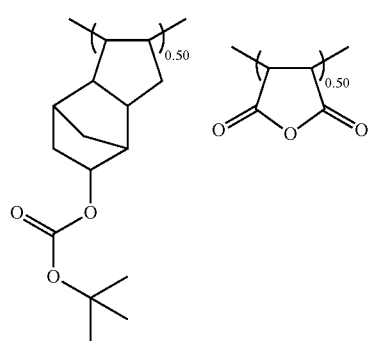

Mw = 6,100
Mw/Mn = 1.64

Preparation of Positive Resist Composition and Alkali-Soluble Protective Film-Forming Composition A resist composition in solution form was prepared by dissolving a polymer (Resist Polymer) and components in solvents in accordance with the formulation of Table 1. A protective film-forming composition in solution form was prepared by dissolving a polymer (TC Polymer) and additive in solvents in accordance with the formulation of Table 2. The solutions were filtered through a Teflon® filter with a pore size of 0.2 µm. The components used herein are identified below.

Acid generator: PAG1 to PAG6 of the following structural formulae

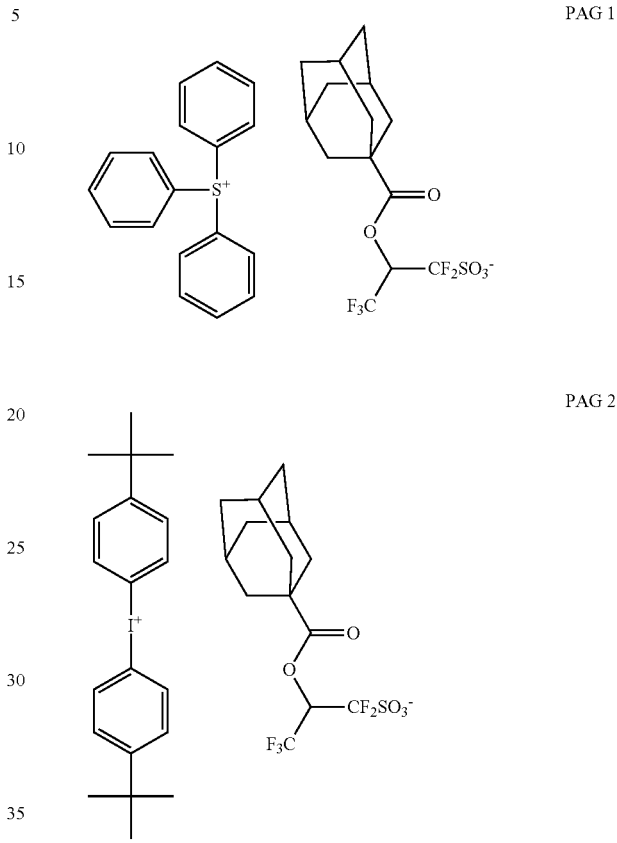

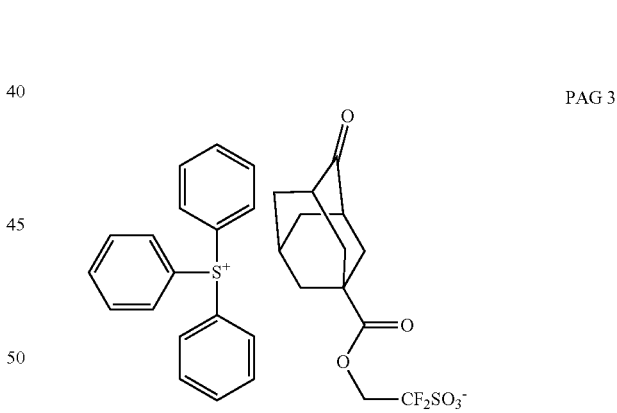

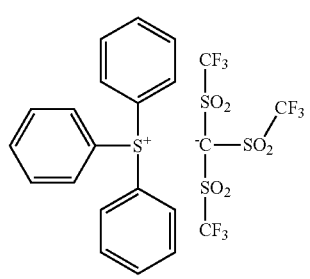

PAG 5
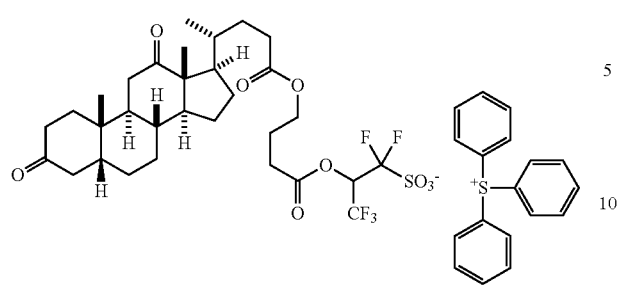
Quencher 1
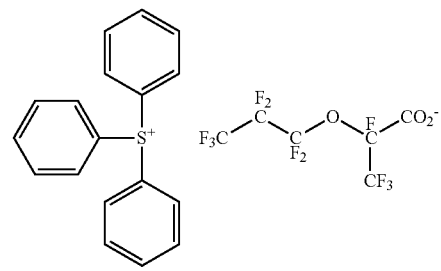
PAG 6
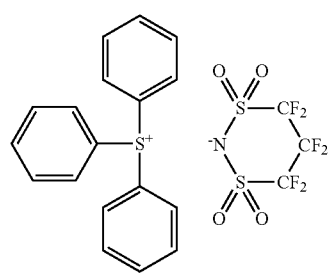
Quencher 2
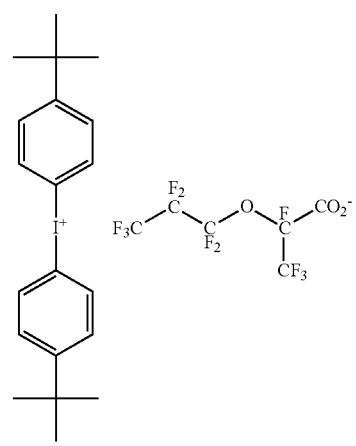
TC Polymer 1
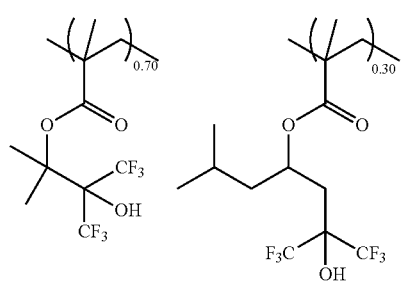
Mw = 9,200
Mw/Mn = 1.72
Quencher 3
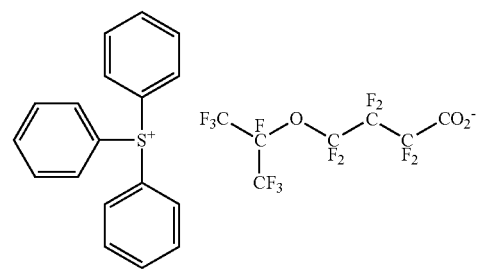
Quencher 4
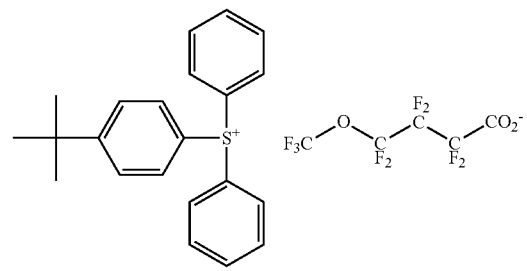
Water-repellent Polymer 1
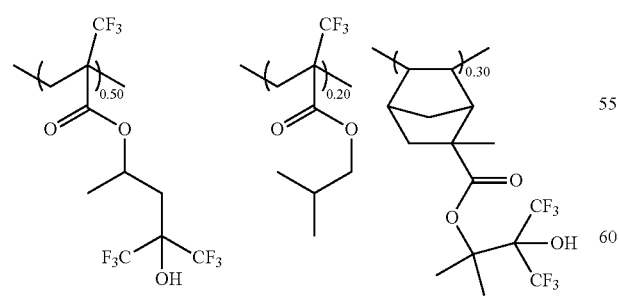
Mw = 7,700
Mw/Mn = 1.77
Quencher 5
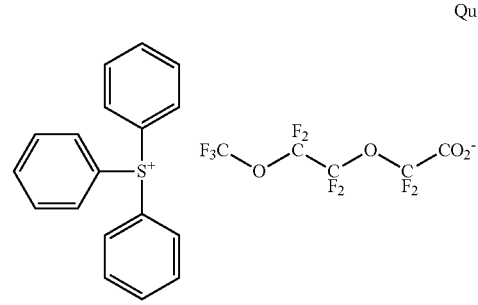
Basic Compound: Quenchers 1 to 6 and Comparative Quenchers 1 to 4 of the following structural formulae Quencher 6

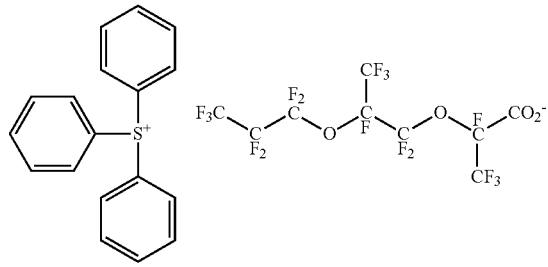

Comparative Quencher 1

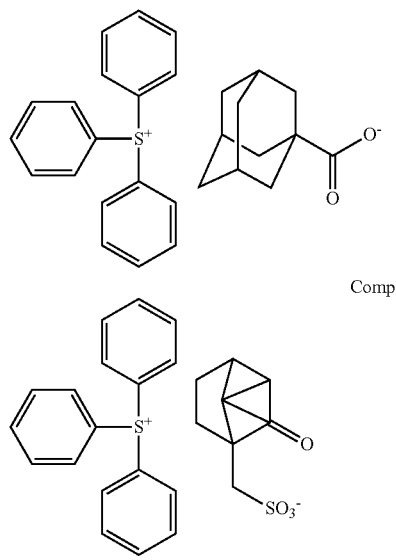

Comparative Quencher 2

Comparative Quencher 3

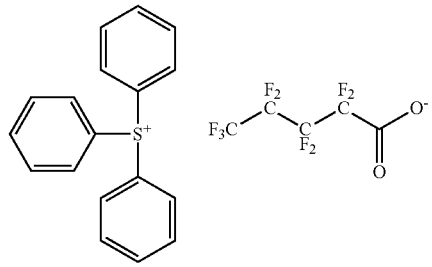

Comparative Quencher 4

Organic Solvent:

PGMEA (propylene glycol monomethyl ether acetate)

CyH (cyclohexanone)

TABLE 1

|  | Polymer (pbw) | Acid generator (pbw) | Basic compound (pbw) | Additive (pbw) | Organic solvent (pbw) |
|---|---|---|---|---|---|
| Resist 1 | Resist Polymer 1 (100) | PAG1 (5.0) | Quencher 1 (4.00) | — | PGMEA (2,000) CyH (500) |
| Resist 2 | Resist Polymer 2 (100) | PAG1 (5.0) | Quencher 1 (4.00) | Water-repellent Polymer 1 (3) | PGMEA (2,000) CyH (500) |
| Resist 3 | Resist Polymer 3 (100) | PAG1 (5.0) | Quencher 1 (4.00) | Water-repellent Polymer 1 (3) | PGMEA (2,000) CyH (500) |
| Resist 4 | Resist Polymer 4 (100) | PAG3 (5.0) | Quencher 1 (4.00) | Water-repellent Polymer 1 (3) | PGMEA (2,000) CyH (500) |
| Resist 5 | Resist Polymer 5 (100) | PAG4 (5.0) | Quencher 1 (4.00) | Water-repellent Polymer 1 (3) | PGMEA (2,000) CyH (500) |
| Resist 6 | Resist Polymer 6 (100) | PAG5 (5.5) | Quencher 1 (4.00) | Water-repellent Polymer 1 (3) | PGMEA (2,000) CyH (500) |
| Resist 7 | Resist Polymer 7 (100) | PAG1 (5.0) | Quencher 1 (4.00) | Water-repellent Polymer 1 (3) | PGMEA (2,000) CyH (500) |
| Resist 8 | Resist Polymer 8 (100) | PAG2 (5.5) | Quencher 1 (4.00) | Water-repellent Polymer 1 (3) | PGMEA (2,000) CyH (500) |
| Resist 9 | Resist Polymer 9 (100) | — | Quencher 1 (4.00) | Water-repellent Polymer 1 (3) | PGMEA (2,000) CyH (500) |
| Resist 10 | Resist Polymer 10 (100) | PAG6 (5.0) | Quencher 2 (4.00) | Water-repellent Polymer 1 (3) | PGMEA (2,000) CyH (500) |
| Resist 11 | Resist Polymer 11 (100) | PAG1 (5.0) | Quencher 3 (4.00) | Water-repellent Polymer 1 (3) | PGMEA (2,000) CyH (500) |
| Resist 12 | Resist Polymer 12 (100) | PAG1 (5.0) | Quencher 4 (4.00) | Water-repellent Polymer 1 (3) | PGMEA (2,000) CyH (500) |
| Resist 13 | Resist Polymer 13 (100) | PAG1 (5.0) | Quencher 5 (4.00) | Water-repellent Polymer 1 (3) | PGMEA (2,000) CyH (500) |
| Resist 14 | Resist Polymer 14 (100) | PAG1 (5.0) | Quencher 6 (4.00) | Water-repellent Polymer 1 (3) | PGMEA (2,000) CyH (500) |
| Resist 15 | Resist Polymer 15 (100) | PAG1 (5.0) | Quencher 1 (4.00) | Water-repellent Polymer 1 (3) | PGMEA (2,000) CyH (500) |

TABLE 1-continued

| | Polymer (pbw) | Acid generator (pbw) | Basic compound (pbw) | Additive (pbw) | Organic solvent (pbw) |
|---|---|---|---|---|---|
| Resist 16 | Resist Polymer 16 (100) | PAG1 (5.0) | Quencher 1 (4.00) | Water-repellent Polymer 1 (3) | PGMEA (2,000) CyH (500) |
| Resist 17 | Resist Polymer 17 (100) | PAG5 (6.5) | Quencher 2 (4.00) | Water-repellent Polymer 1 (3) | PGMEA (2,000) CyH (500) |
| Resist 18 | Resist Polymer 18 (100) | PAG1 (5.0) | Quencher 1 (4.00) | Water-repellent Polymer 1 (3) | PGMEA (2,000) CyH (500) |
| Resist 19 | Resist Polymer 19 (100) | PAG1 (5.0) | Quencher 1 (4.00) | Water-repellent Polymer 1 (3) | PGMEA (2,000) CyH (500) |
| Resist 20 | Resist Polymer 20 (100) | PAG1 (5.0) | Quencher 1 (4.00) | Water-repellent Polymer 1 (3) | PGMEA (2,000) CyH (500) |
| Resist 21 | Resist Polymer 1 (60) Resist Polymer 19 (40) | PAG1 (5.0) | Quencher 1 (4.00) | Water-repellent Polymer 1 (3) | PGMEA (2,000) CyH (500) |
| Resist 22 | Resist Polymer 1 (60) Resist Polymer 20 (40) | PAG6 (4.5) | Quencher 1 (4.00) | Water-repellent Polymer 1 (3) | PGMEA (2,000) CyH (500) |
| Comparative Resist 1 | Resist Polymer 1 (100) | PAG1 (5.0) | Comparative Quencher 1 (4.00) | Water-repellent Polymer 1 (3) | PGMEA (2,000) CyH (500) |
| Comparative Resist 2 | Resist Polymer 1 (100) | PAG1 (5.0) | Comparative Quencher 2 (4.00) | Water-repellent Polymer 1 (3) | PGMEA (2,000) CyH (500) |
| Comparative Resist 3 | Resist Polymer 1 (100) | PAG1 (5.0) | Comparative Quencher 3 (4.00) | Water-repellent Polymer 1 (3) | PGMEA (2,000) CyH (500) |
| Comparative Resist 4 | Resist Polymer 1 (100) | PAG1 (5.0) | Comparative Quencher 4 (4.00) | Water-repellent Polymer 1 (3) | PGMEA (2,000) CyH (500) |

TABLE 2

| Protective Film | Polymer (pbw) | Additive (pbw) | Solvent (pbw) |
|---|---|---|---|
| TC-1 | TC Polymer 1 (100) | tri-n-octylamine (0.2) | diisoamyl ether (2,400) 2-methyl-1-butanol (240) |

Examples and Comparative Examples

ArF Lithography Patterning Test 1

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 1 was spin coated, then baked on a hot plate at 100° C. for 60 seconds to form a resist film of 100 nm thick. In some Examples, the protective film-forming composition shown in Table 2 was spin coated on the resist film and baked at 90° C. for 60 seconds to form a protective film (or topcoat TC-1) of 50 nm thick.

Figure 15:
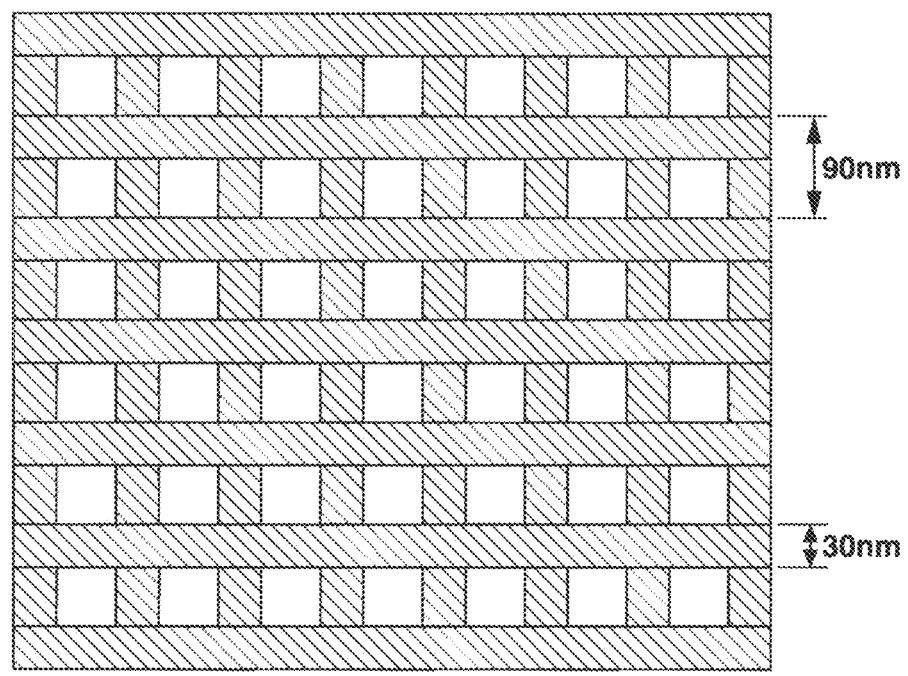
FIG. 15 illustrates a lattice-like mask used in ArF lithography patterning test 1.

Using an ArF excimer laser immersion lithography scanner NSR-610C (Nikon Corp., NA 1.30, σ 0.98/0.78, cross-pole opening 20 deg., azimuthally polarized illumination), exposure was performed in a varying dose through a 6% halftone phase shift mask bearing a lattice-like pattern with a pitch of 90 nm and a line width of 30 nm (on-wafer size) whose layout is shown in FIG. 15. After the exposure, the wafer was baked (PEB) at the temperature shown in Table 3 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 3a was determined. The cross-sectional profile of the hole pattern was observed under electron microscope S-4300 (Hitachi High Technologies Corp.). The results are shown in Table 3. It is evident that the resist compositions within the scope of the invention form patterns having dimensional uniformity and a perpendicular profile after organic solvent development.

TABLE 3

| | Resist | Protective film | PEB temperature (° C.) | Dose (mJ/cm$^2$) | Hole size variation 3σ (nm) |
|---|---|---|---|---|---|
| Example 1-1 | Resist 1 | TC-1 | 90 | 44 | 2.5 |
| Example 1-2 | Resist 2 | — | 90 | 47 | 2.3 |
| Example 1-3 | Resist 3 | — | 90 | 44 | 2.6 |
| Example 1-4 | Resist 4 | — | 90 | 46 | 2.7 |
| Example 1-5 | Resist 5 | — | 95 | 49 | 2.5 |
| Example 1-6 | Resist 6 | — | 90 | 46 | 2.2 |
| Example 1-7 | Resist 7 | — | 100 | 42 | 2.6 |
| Example 1-8 | Resist 8 | — | 90 | 34 | 2.4 |
| Example 1-9 | Resist 9 | — | 100 | 43 | 2.0 |
| Example 1-10 | Resist 10 | — | 95 | 45 | 2.7 |
| Example 1-11 | Resist 11 | — | 90 | 40 | 2.9 |
| Example 1-12 | Resist 12 | — | 90 | 45 | 2.3 |
| Example 1-13 | Resist 13 | — | 90 | 47 | 2.2 |
| Example 1-14 | Resist 14 | — | 90 | 48 | 2.5 |
| Example 1-15 | Resist 15 | — | 95 | 46 | 2.7 |
| Example 1-16 | Resist 16 | — | 90 | 48 | 2.8 |
| Example 1-17 | Resist 17 | — | 90 | 45 | 2.5 |
| Example 1-18 | Resist 18 | — | 90 | 43 | 2.9 |

TABLE 3-continued

|  | Resist | Protective film | PEB temperature (° C.) | Dose (mJ/cm$^2$) | Hole size variation 3σ (nm) |
|---|---|---|---|---|---|
| Example 1-19 | Resist 19 | — | 105 | 53 | 3.1 |
| Example 1-20 | Resist 20 | — | 105 | 55 | 3.1 |
| Example 1-21 | Resist 21 | — | 95 | 43 | 3.0 |
| Example 1-22 | Resist 22 | — | 95 | 52 | 3.0 |
| Comparative Example 1-1 | Comparative Resist 1 | — | 90 | 55 | 3.8 |
| Comparative Example 1-2 | Comparative Resist 2 | — | 90 | 55 | 3.5 |
| Comparative Example 1-3 | Comparative Resist 3 | — | 90 | 55 | 3.6 |
| Comparative Example 1-4 | Comparative Resist 4 | — | 90 | 55 | 3.6 |

ArF Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 4 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, cross-pole opening 20 deg., azimuthally polarized illumination), exposure was performed through a 6% halftone phase shift mask bearing a square dot pattern with a pitch of 90 nm and a side width of 55 nm (on-wafer size) whose layout is shown in FIG. 7, while the dose was varied. After the exposure, the wafer was baked (PEB) at the temperature shown in Table 4 for 60 seconds and developed. Specifically, methyl benzoate was injected from a development nozzle while the wafer was spun at 30 rpm for 3 seconds, which was followed by stationary puddle development for 27 seconds. The wafer was rinsed with xylene, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3a was determined. The results are shown in Table 4.

TABLE 4

|  | Resist | PEB temp. (° C.) | Dose (mJ/cm$^2$) | DOF (nm) | Hole size variation 3σ (nm) |
|---|---|---|---|---|---|
| Example 2-1 | Resist 2 | 90 | 24 | 100 | 3.0 |
| Example 2-2 | Resist 9 | 100 | 28 | 100 | 2.6 |
| Comparative Example 2-1 | Comparative Resist 1 | 90 | 31 | 85 | 3.9 |

ArF Lithography Patterning Test 3

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 5 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. The same area was subjected to two continuous exposures by X and Y dipole illuminations. After the exposure, the wafer was baked (PEB) at the temperature shown in Table 5 for 60 seconds and developed. Specifically, 2-heptanone was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3a was determined. The results are shown in Table 5.

TABLE 5

|  | Resist | PEB temp. (° C.) | Dose (mJ/cm$^2$) | DOF (nm) | Hole size variation 3σ (nm) |
|---|---|---|---|---|---|
| Example 3-1 | Resist 2 | 90 | 18 | 105 | 2.4 |
| Example 3-2 | Resist 9 | 100 | 23 | 105 | 2.0 |
| Comparative Example 3-1 | Comparative Resist 1 | 90 | 22 | 90 | 3.0 |

ArF Lithography Patterning Test 4

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 6 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole opening 20 deg., azimuthally polarized illumination), first exposure was performed through a 6% halftone phase shift mask bearing an array of X-direction lines with a pitch of 80 nm and a line width of 40 nm (on-wafer size) by compliant dipole illumination. Next, second exposure was performed through a 6% halftone phase shift mask bearing an array of Y-direction lines with a pitch of 80 nm and a line width of 40 nm (on-wafer size) by compliant dipole illumination. After the exposure, the wafer was baked (PEB) at the temperature shown in Table 6 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 3a was determined. The results are shown in Table 6.

TABLE 6

| | Resist | PEB temperature (° C.) | Dose (mJ/cm$^2$) | Hole size variation 3σ (nm) |
|---|---|---|---|---|
| Example 4-1 | Resist 2 | 90 | 19 | 1.7 |
| Example 4-2 | Resist 9 | 100 | 25 | 1.3 |
| Comparative Example 4-1 | Comparative Resist 1 | 90 | 26 | 2.2 |

ArF Lithography Patterning Test 5

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 7 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. The same area was subjected to two continuous exposures by X and Y dipole illuminations. After the exposure, the wafer was baked (PEB) at the temperature shown in Table 7 for 60 seconds and developed. Specifically, the solvent shown in Table 7 was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3a was determined. The results are shown in Table 7.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2011-235987 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
applying a resist composition onto a substrate, the resist composition comprising a polymer comprising recurring units having a hydroxyl group substituted with an acid labile group and an acid generator, or a polymer comprising recurring units having a hydroxyl group substituted with an acid labile group and recurring units capable of generating an acid upon exposure, a sulfonium or iodonium salt of perfluoroalkyl ether carboxylic acid, and an organic solvent,
prebaking the composition to form a resist film,
exposing the resist film to high-energy radiation,
baking, and
developing the exposed film in an organic solvent-based developer to form a negative pattern wherein the unexposed region of film is dissolved away and the exposed region of film is not dissolved,
wherein said sulfonium or iodonium salt of perfluoroalkyl ether carboxylic acid is a salt (Q1) or Q2) having the general formula (2):

(2)

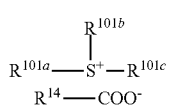

(Q1)

TABLE 7

| | Resist | PEB temp. (° C.) | Dose (mJ/cm$^2$) | Developer | DOF (nm) | Hole size variation 3σ (nm) |
|---|---|---|---|---|---|---|
| Example 5-1 | Resist 2 | 90 | 24 | 2-heptanone | 105 | 2.1 |
| Example 5-2 | Resist 2 | 90 | 24 | methyl benzoate | 110 | 2.3 |
| Example 5-3 | Resist 2 | 90 | 26 | ethyl benzoate | 105 | 2.2 |
| Example 5-4 | Resist 2 | 90 | 27 | phenyl acetate | 100 | 2.2 |
| Example 5-5 | Resist 2 | 90 | 26 | benzyl acetate | 100 | 2.4 |
| Example 5-6 | Resist 2 | 90 | 27 | methyl phenylacetate | 100 | 2.4 |
| Example 5-7 | Resist 2 | 90 | 28 | methyl benzoate: butyl acetate = 6:4 | 100 | 2.4 |
| Example 5-8 | Resist 2 | 90 | 25 | methyl benzoate: 2-heptanone = 5:5 | 100 | 2.3 |
| Example 5-9 | Resist 2 | 90 | 23 | ethyl 3-ethoxypropionate | 105 | 2.5 |

-continued

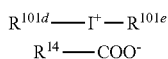
(Q2)

wherein $R^{101a}$, $R^{101b}$ and $R^{101c}$ are each independently a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which some or all hydrogen atoms may be substituted by ether, ester, carbonyl, carbonate, hydroxyl, carboxyl, halogen, cyano, amino, amide, nitro, sultone, sulfonic acid ester, sulfone groups, or substituent groups having sulfonium salt, or $R^{101b}$ and $R^{101c}$ may bond together to form a ring with the sulfur atom to which they are attached, $R^{101b}$ and $R^{101c}$ each are a $C_1$-$C_6$ alkylene group when they form a ring, $R^{101d}$ and $R^{101e}$ each are a $C_6$-$C_{20}$ aryl group which may contain a straight, branched or cyclic $C_1$-$C_6$ alkyl or alkoxy radical, or $R^{101d}$ and $R^{101e}$ may bond together to form a ring with the iodine atom to which they are attached, and $R^{14}$—$COO^-$ is selected from the group consisting of the following formulae:

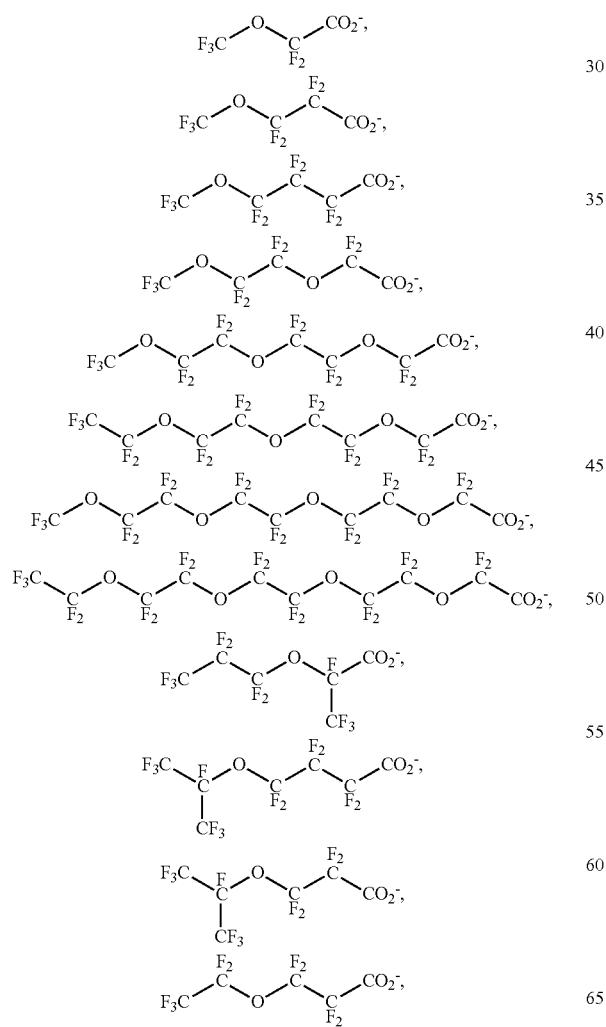

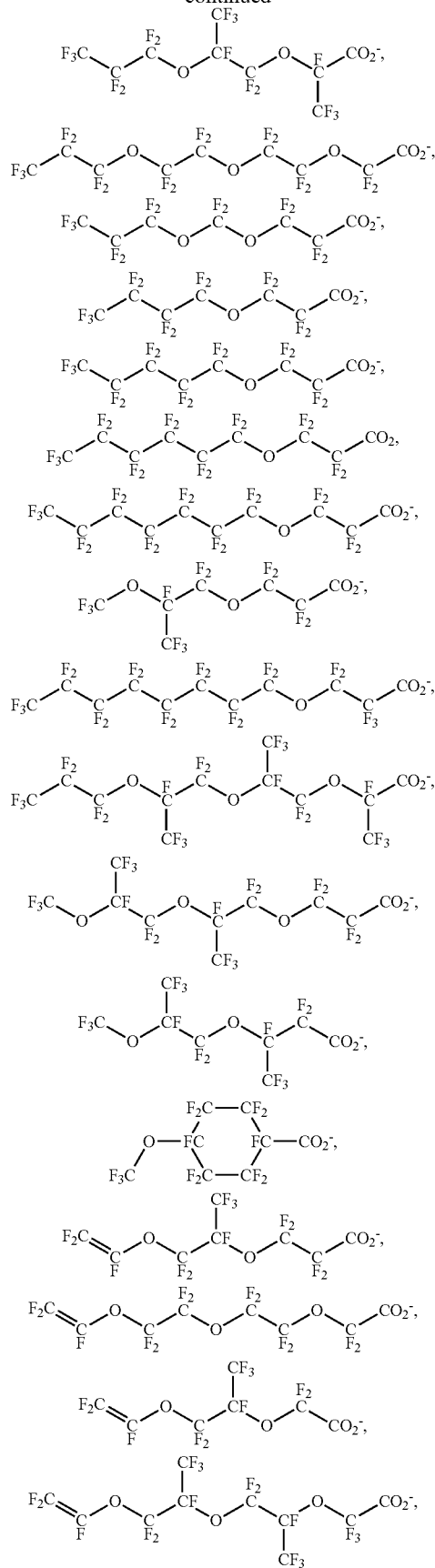

-continued

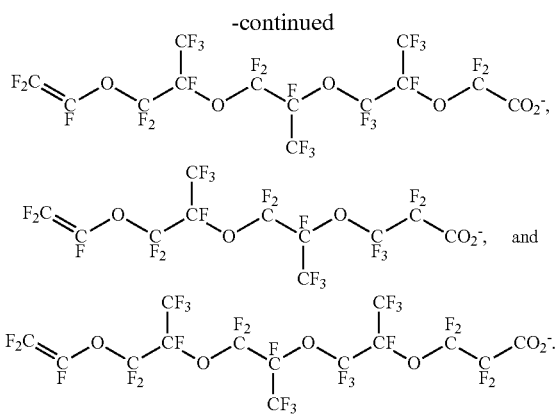

2. The process of claim 1 wherein said polymer comprising recurring units having a hydroxyl group substituted with an acid labile group comprises recurring units of at least one type selected from recurring units (a1) to (a4) represented by the general formula (1):

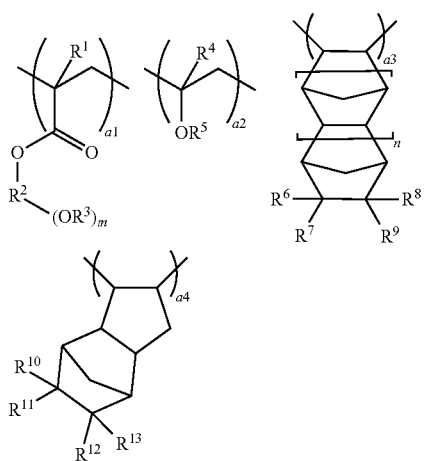

wherein $R^1$ and $R^4$ are each independently hydrogen or methyl,
$R^2$ is a di- to pentavalent, straight, branched or cyclic $C_1$-$C_{16}$ aliphatic hydrocarbon group which may contain an ether or ester radical,
$R^3$ and $R^5$ each are an acid labile group,
$R^6$ to $R^9$ and $R^{10}$ to $R^{13}$ are each independently hydrogen, cyano, a straight, branched or cyclic $C_1$-$C_6$ alkyl group, organoxycarbonyl, or a group having an ether group or lactone ring, at least one of $R^6$ to $R^9$ and $R^{10}$ to $R^{13}$ has a hydroxyl group substituted with an acid labile group,
m is an integer of 1 to 4, n is 0 or 1, a1, a2, a3 and a4 are numbers in the range: $0 \leq a1 < 1.0$, $0 \leq a2 < 1.0$, $0 \leq a3 < 1.0$, $0 \leq a4 < 1.0$, and $0 < a1+a2+a3+a4 < 1.0$.

3. The process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

4. The process of claim 1 wherein the step of exposing the resist film to high-energy radiation includes ArF excimer laser immersion lithography of 193 nm wavelength, EUV lithography of 13.5 nm wavelength or EB lithography.

5. The process of claim 4 wherein the ArF immersion lithography of 193 nm wavelength uses a halftone phase shift mask bearing a dot shifter pattern, whereby a pattern of holes is formed at the dots after development.

6. The process of claim 1 wherein the exposure step uses halftone phase shift masks and includes two exposures of two intersecting sets of lines, whereby a pattern of holes is formed at the intersections between lines after development.

7. The process of claim 1 wherein the exposure step uses a halftone phase shift mask bearing lattice-like shifter gratings, whereby a pattern of holes is formed at the intersections of gratings after development.

8. A pattern forming process according to any one of claims 1, 2 and 3 to 7, the process comprising the steps of:
applying a resist composition onto a substrate,
prebaking the composition to form a resist film,
forming a protective film on the resist film,
exposing the resist film to high-energy radiation,
baking, and
applying an organic solvent-based developer to dissolve away the protective film and the unexposed region of the resist film for forming a negative pattern wherein the exposed region of film is not dissolved.

9. A negative pattern-forming resist composition comprising a polymer comprising recurring units having an acid labile group substituted thereon of at least one type selected from recurring units (a1) to (a4) represented by the following general formula (1), a sulfonium salt (Q1) or iodonium salt (Q2) of perfluoroalkyl ether carboxylic acid having the following general formula (2), and an organic solvent,

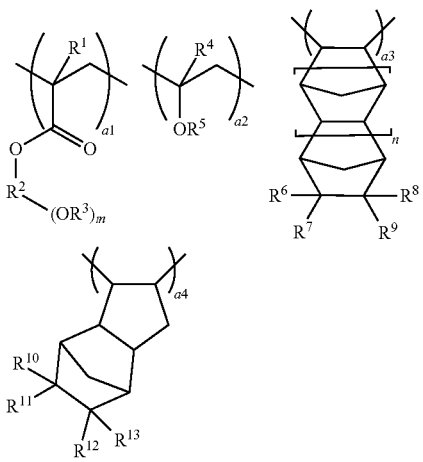

wherein $R^1$ and $R^4$ are each independently hydrogen or methyl; $R^2$ is a di- to pentavalent, straight, branched or cyclic $C_1$-$C_{16}$ aliphatic hydrocarbon group which may contain an ether or ester radical; $R^3$ and $R^5$ each are an acid labile group; $R^6$ to $R^9$ and $R^{10}$ to $R^{13}$ are each independently hydrogen, cyano, a straight, branched or cyclic $C_1$-$C_6$ alkyl group, organoxycarbonyl, or a group having an ether group or lactone ring, at least one of $R^6$ to $R^9$ and $R^{10}$ to $R^{13}$ has a hydroxyl group substituted with an acid labile group; m is an integer of 1 to 4, n is 0 or 1, a1, a2, a3 and a4 are numbers in the range: $0 \le a1 < 1.0, 0 \le a2 < 1.0, 0 \le a3 < 1.0, 0 \le a4 < 1.0,$ and $0 < a1+a2+a3+a4 < 1.0$,

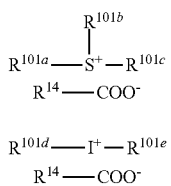

(2)

(Q1)

(Q2)

wherein $R^{101a}$, $R^{101b}$ and $R^{101c}$ are each independently a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which some or all hydrogen atoms may be substituted by ether, ester, carbonyl, carbonate, hydroxyl, carboxyl, halogen, cyano, amino, amide, nitro, sultone, sulfonic acid ester, sulfone groups, or substituent groups having sulfonium salt, or $R^{101b}$ and $R^{101c}$ may bond together to form a ring with the sulfur atom to which they are attached, $R^{101b}$ and $R^{101c}$ each are a $C_1$-$C_6$ alkylene group when they form a ring; $R^{101d}$ and $R^{101e}$ each are a $C_6$-$C_{20}$ aryl group which may contain a straight, branched or cyclic $C_1$-$C_6$ alkyl or alkoxy radical, or $R^{101d}$ and $R^{101e}$ may bond together to form a ring with the iodine atom to which they are attached; $R^{14}$—$COO^-$ is selected from the group consisting of the following formulae:

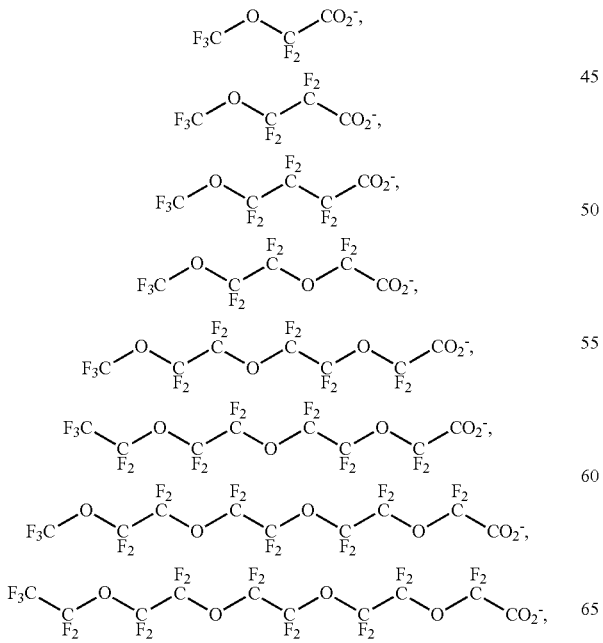

-continued

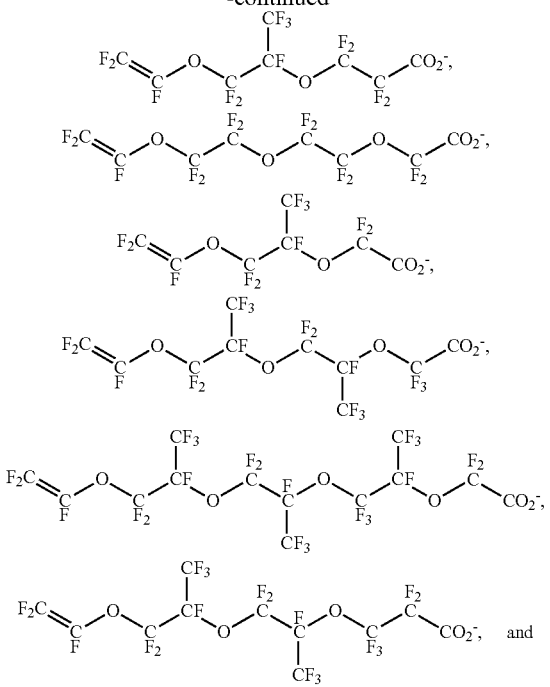

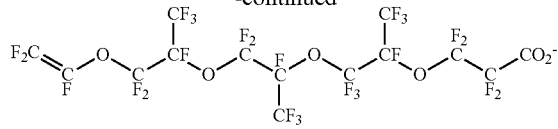

said polymer being dissolvable in a developer selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

* * * * *